United States Patent
Huang et al.

(10) Patent No.: US 12,107,681 B2
(45) Date of Patent: Oct. 1, 2024

(54) COMMUNICATION METHOD AND APPARATUS

(71) Applicant: HUAWEI TECHNOLOGIES CO., LTD., Guangdong (CN)

(72) Inventors: Kechao Huang, Boulogne Billancourt (FR); Huixiao Ma, Shenzhen (CN); Wai Kong Raymond Leung, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/979,998

(22) Filed: Nov. 3, 2022

(65) Prior Publication Data

US 2023/0065454 A1 Mar. 2, 2023

Related U.S. Application Data

(63) Continuation of application No. PCT/CN2021/070801, filed on Jan. 8, 2021.

(30) Foreign Application Priority Data

May 4, 2020 (CN) .................. 202010370146.0

(51) Int. Cl.
  *H04L 1/00* (2006.01)
  *H03M 13/11* (2006.01)
(52) U.S. Cl.
  CPC .......... *H04L 1/0078* (2013.01); *H04L 1/0006* (2013.01); *H03M 13/118* (2013.01); *H04L 1/0042* (2013.01)
(58) Field of Classification Search
  CPC .................. H04L 1/0078; H04L 1/0006
  See application file for complete search history.

(56) References Cited

U.S. PATENT DOCUMENTS

| 10,425,109 B1 | 9/2019 | Humblet |
| 2005/0289437 A1 | 12/2005 | Oh et al. |
| 2006/0039626 A1* | 2/2006 | Nakayama ............ G06F 17/147 |
| | | 375/E7.143 |

(Continued)

FOREIGN PATENT DOCUMENTS

| CN | 101083512 A | 12/2007 |
| CN | 101924608 A | 12/2010 |

(Continued)

OTHER PUBLICATIONS

Junshan Zang et al, Performance of transmitted reference pulse cluster UWB communication systems using LDPC codes, 2015 IEEE 26th International Symposium on Personal, Indoor and Mobile Radio Communications—(PIMRC): Fundamentals and PHY, 5 pages.

(Continued)

*Primary Examiner* — Joseph D Torres
(74) *Attorney, Agent, or Firm* — WOMBLE BOND DICKINSON (US) LLP

(57) ABSTRACT

A communication method includes: encoding a to-be-transmitted first bit sequence to obtain a first matrix, where the first matrix includes a plurality of bit square matrices of a same size, and each bit square matrix includes a plurality of pieces of bit data; performing, based on a first mapping relationship, position transformation in a range of each bit square matrix on the bit data of each bit square matrix in the first matrix, to obtain a second matrix after the position transformation; and performing bit data position transformation among bit square matrices on the second matrix to obtain a third matrix, and modulating a to-be-sent first symbol sequence based on the third matrix.

20 Claims, 9 Drawing Sheets

(56) References Cited

U.S. PATENT DOCUMENTS

| | | | |
|---|---|---|---|
| 2012/0266051 A1 | 10/2012 | Farhoodfar et al. | |
| 2015/0295745 A1 | 10/2015 | Prodan | |
| 2020/0052720 A1 | 2/2020 | Jin et al. | |

FOREIGN PATENT DOCUMENTS

| | | |
|---|---|---|
| CN | 104426630 A | 3/2015 |
| WO | 2018028476 A1 | 2/2018 |

OTHER PUBLICATIONS

Xiaodi You, Research on Key Signal Processing Schemes in Indoor Visible Light or Coherent Optical Fiber Based Communication Systems, Dissertation Submitted to Nanjing University of Posts and Telecommunications for the Degree of Doctor of Philosophy, Jun. 2018, with the English Abstract, 136 pages.

Maarten Vissers Huawei Technologies Co et al: "Draft O-FEC specification for inclusion in G.709.3; CD11-03", ITU-T Draft; Study Period 2017-2020; Study Group 15; Series CDII-03, International Telecommunication Union, Geneva; CH, vol. 11/15, Apr. 1, 2020 (Apr. 1, 2020), pp. 1-34, XP044286634.

OIF-400ZR-01.0, Implementation Agreement 400ZR, Mar. 10, 2020, 100 pages.

Open ROADM MSA 3.01 W-Port Digital Specification (200G-400G), Open ROADM-Draft document, Jun. 25, 2019, 56 pages.

ITU-TG.709.3/Y. 1331.3, Amendment 1 (Nov. 2018), Series G: Transmission Systems and Media, Digital Systems and Networks, Digital terminal equipments General Series Y: Global Information Infrastructure, Internet Protocol Aspects, Next-Generation Networks, Internet of Things and Smart Cities Internet protocol aspects-Transport, 74 pages.

Kechao Huang, Paris Optical Communication Technology Lab, Discussion on the Symbol Mapping in G709.3, Apr. 24, 2020, Huawei, European Research Center, 6 pages.

\* cited by examiner

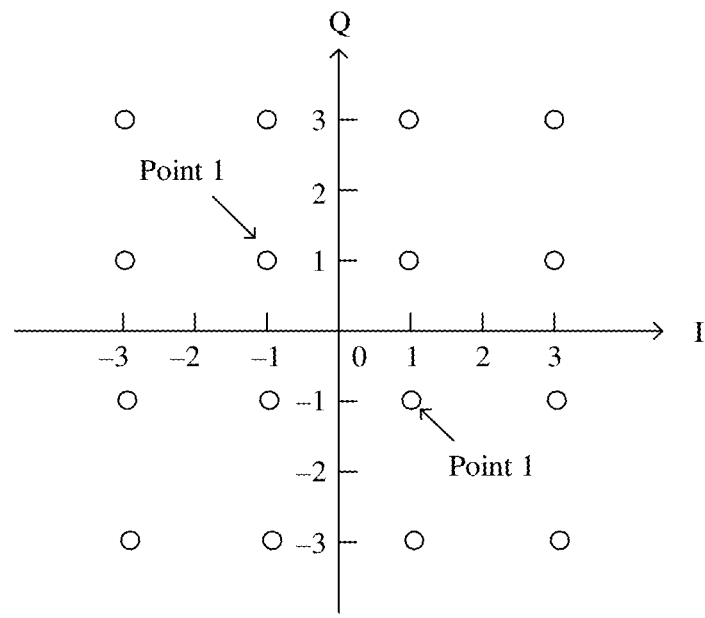
FIG. 5
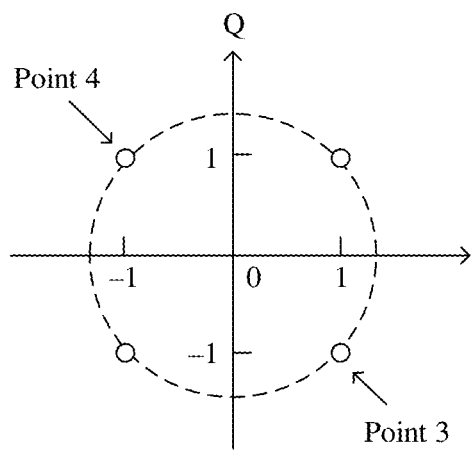
FIG. 6
| b0 | b1 | b2 | b3 | b4 | b5 | b6 | b7 | b8 | b9 | ... |
FIG. 7

COMMUNICATION METHOD AND APPARATUS

CROSS-REFERENCE TO RELATED APPLICATIONS

This application is a continuation of International Application No. PCT/CN2021/070801, filed on Jan. 8, 2021, which claims the priority to Chinese Patent Application No. 202010370146.0, filed on May 4, 2020. The disclosure of the aforementioned patent application are hereby incorporated by reference in their entireties.

TECHNICAL FIELD

This application relates to the field of communication technologies, and in particular, to a communication method and apparatus.

BACKGROUND

At present, a high-speed optical transport network is developing towards a large capacity, packetization, and intelligence. The high-speed optical transport network needs to use an efficient forward error correction (FEC) code to counteract optical damage (for example, uncompensated dispersion, polarization mode dispersion, and a nonlinear effect) during optical transmission, to keep a bit error rate low enough during long range transmission. In a conventional technology, a modulator may be connected to an FEC encoder. That is, after to-be-transmitted information is encoded to obtain a corresponding bit sequence, the bit sequence is modulated to generate a corresponding symbol sequence, and the generated symbol sequence is transmitted to a receive end by using an optical transport network. After demodulating and decoding the received symbol sequence, the receive end may obtain the information sent by a transmit end. In a transmission process of the symbol sequence, if a transmission link is affected by a burst factor, and errors occur in some consecutive symbols in the symbol sequence, after receiving the symbol sequence affected by the burst factor, the receive end performs error correction by using an FEC code in a decoding process. Because a relatively large quantity of consecutive errors occur, it is difficult to accurately perform error correction by using the FEC code and obtain the information sent by the transmit end, resulting in a relatively high bit error rate of information transmission.

SUMMARY

This application provides a communication method and apparatus, so that a burst tolerance capability of information transmission may be improved by using this application, and a bit error rate of information transmission may be reduced.

A first aspect of this application provides a communication method. The method may be applied to a transmit end device in a communication network, to adjust a structure of to-be-sent information, thereby improving a burst tolerance capability of information transmission. In the method, an input to-be-transmitted first bit sequence is encoded, and a first matrix is determined based on a result obtained after the encoding. The first matrix includes a plurality of bit square matrices of a same size, and each bit square matrix includes a plurality of pieces of bit data. Then, based on a first mapping relationship, position transformation in a range of each bit square matrix is performed on the bit data of each bit square matrix in the first matrix, to obtain a second matrix after the position transformation. Further, bit data position transformation among bit square matrices is performed on the second matrix to obtain a third matrix, and a to-be-sent first symbol sequence is modulated based on the third matrix.

The first mapping relationship may indicate a position mapping relationship before and after position transformation of each piece of bit data in the bit square matrix range, and includes a row transformation mapping relationship. The row transformation mapping relationship may indicate a row identifier mapping relationship before and after position transformation of the bit data in the bit square matrix range. The row transformation mapping relationship may be constrained by using a global offset constraint factor and at least two local offset constraint factors. The global offset constraint factor is used to constrain a position offset of row transformation of each piece of bit data in the bit square matrix. The local offset constraint factor is used to constrain position offsets of row transformation of bit data located in some bit rows in the bit square matrix. Position offsets of row transformation of bit data in different bit rows are constrained in a targeted and diversified manner by using the global offset constraint factor and the at least two local offset constraint factors, so that position transformation is more discretely and evenly performed on the bit data in the first matrix, thereby improving the burst tolerance capability of information transmission.

In an embodiment, the row transformation mapping relationship is further constrained by using a start offset parameter, and the start offset parameter may constrain a start position at which position transformation is performed on the bit data in the bit square matrix based on the position offset. The start offset parameter is set, so that translation transformation may occur on the bit square matrix, to further implement position transformation of the bit data.

In an embodiment, a quantity of local offset constraint factors is related to the size of the bit square matrix. The first matrix is divided into a plurality of bit square matrices whose quantities of rows and columns are both $2^m$. In this case, there may be $m-1$ local offset constraint factors, where m is an integer greater than 3. The global offset constraint factor, the local offset constraint factors, and the start offset parameter constrain the row transformation mapping relationship by using the following formula:

$$r_0 = \{c_1 + g \times r_1 + \Sigma_{k=2}^{m}\{\beta_{k-2} \times \lfloor r_1/(2^\wedge(k-1)) \rfloor\} + \alpha\} \% (2^\wedge m),$$

Herein, $r_0$ is a row identifier corresponding to first bit data in the bit square matrix before position transformation in the bit square matrix range, and the first bit data is any bit data in the bit square matrix; $r_1$ is a row identifier corresponding to the first bit data after position transformation in the bit square matrix range; $c_1$ is a column identifier corresponding to the first bit data after position transformation in the bit square matrix range; g is the global offset constraint factor, $\beta$ is the local offset constraint factor, $\alpha$ is the start offset parameter, and g, $\beta$, and $\alpha$ are all preset integers; and k is an index identifier of $\beta$, a value of g is determined based on $2^\wedge p$, and p is an integer greater than 1.

The $m-1$ local offset constraint factors include a local offset constraint factor for constraining a $2^\wedge(f-1)^{th}$ bit row to a $2^\wedge m^{th}$ bit row, and f is an integer greater than 0 and less than m. It should be noted that the $m-1$ local offset constraint factors herein may include 0, and a quantity of non-0 local offset constraint factors is not less than 2.

Bit data in a same row before transformation needs to correspond to a specific column offset when being transformed to another row, and when a plurality of pieces of bit data in a same row are transformed to different bit rows, corresponding column offsets are also different. A column offset when bit data in a same row before transformation is transformed to another row is constrained in a targeted and diversified manner by using the global offset constraint factor for constraining all rows and the m−1 local offset constraint factors for constraining some rows, so that discreteness and evenness of bit data position transformation in the bit square matrix range are improved.

In an embodiment, when m=4, g∈{−8, −4, 4}, and $\beta_2 \in \{-7, -5, -3, -1, 1, 3, 5, 7\}$.

When g=−8, values of $\beta_0$ and $\beta_1$ are one of the following combinations: $\{\beta_0=-6, \beta_1=-8\}$, $\{\beta_0=-6, \beta_1=0\}$, $\{\beta_0=-4, \beta_1=-6\}$, $\{\beta_0=-4, \beta_1=-2\}$, $\{\beta_0=-4, \beta_1=2\}$, $\{\beta_0=-4, \beta_1=6\}$, $\{\beta_0=-2, \beta_1=-8\}$, $\{\beta_0=-2, \beta_1=0\}$, $\{\beta_0=2, \beta_1=-8\}$, $\{\beta_0=2, \beta_1=0\}$, $\{\beta_0=4, \beta_1=-6\}$, $\{\beta_0=4, \beta_1=-2\}$, $\{\beta_0=4, \beta_1=2\}$, $\{\beta_0=4, \beta_1=6\}$, $\{\beta_0=6, \beta_1=-8\}$, and $\{\beta_0=6, \beta_1=0\}$; and When g=−4 or g=4, the values of $\beta_0$ and $\beta_1$ are one of the following combinations: $\{\beta_0=-6, \beta_1=4\}$, $\{\beta_0=-2, \beta_1=-4\}$, $\{\beta_0=0, \beta_1=-6\}$, $\{\beta_0=0, \beta_1=-2\}$, $\{\beta_0=0, \beta_1=2\}$, $\{\beta_0=0, \beta_1=6\}$, $\{\beta_0=2, \beta_1=4\}$, and $\{\beta_0=6, \beta_1=-4\}$.

In an embodiment, the first mapping relationship further includes a column transformation mapping relationship, and the column transformation mapping relationship is constrained by using the following formula:

$$c_0 = \{c_1 + h \times r_1 + \Sigma_{w=2}^{m}\{\gamma_{w-2} \times \lfloor r_1/(2^{(w-1)}) \rfloor\} + \theta\} \% (2^{\wedge}m),$$

Herein, $c_0$ is a column identifier corresponding to the first bit data before position transformation in the bit square matrix range; $r_1$ is the row identifier corresponding to the first bit data after position transformation in the bit square matrix range; $c_1$ is the column identifier corresponding to the first bit data after position transformation in the bit square matrix range; and h, γ, and θ are all preset integers, and w is an index identifier of γ.

Bit data in a same column before column transformation needs to correspond to a specific column offset when being transformed to another column, and when a plurality of pieces of bit data in a same column are transformed to different bit columns, corresponding column offsets are also different. A column offset when bit data in a same column before transformation is transformed to another column is constrained in a targeted and diversified manner by using the formula, so that discreteness and evenness of bit data position transformation in the bit square matrix range are improved.

In an embodiment, when a value of m is 4, a value of g is −4, a value of $\beta_0$ is 0, a value of $\beta_1$ is −2, a value of $\beta_2$ is 3, a value of α is 0, a value of h is −2, a value of $\gamma_0$ is 0, a value of $\gamma_1$ is 7, a value of $\gamma_2$ is −7, and a value of θ is 0.

In an embodiment, the first mapping relationship may be indicated by using a first mapping table. The first mapping table includes 256 table cells, and there is corresponding mapping position data in each table cell. For any first table cell in the first mapping table, mapping position data in the first table cell is (s, t), where s and t are both integers greater than or equal to 0 and less than 16, and (s, t) indicates a position that is of bit data stored in the first table cell and that is before position transformation in the bit square matrix range.

In an embodiment, the first mapping table includes:

| | | | | | | | |
|---|---|---|---|---|---|---|---|
| (0, 0) | (1, 1) | (2, 2) | (3, 3) | (4, 4) | (5, 5) | (6, 6) | (7, 7) |
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) |

For example, mapping position data included in a table cell at a position of a row 2 and a column 5 in the foregoing table is (13, 1), indicating that in a position transformation process in the bit square matrix range, bit data in a row 13 and a column 1 is transformed to the position of the row 2 and the column 5 in the bit square matrix.

In an embodiment, the to-be-sent first symbol sequence is modulated in a dual-polarization quadrature amplitude modulation scheme.

In an embodiment, the to-be-sent first symbol sequence is modulated in a dual-polarization quadrature phase shift keying scheme.

In an embodiment, if the to-be-sent first symbol sequence is modulated in the dual-polarization quadrature phase shift keying scheme, a to-be-modulated first bit sequence may be determined based on the third matrix. Bit data of every four adjacent bits in the first bit sequence is determined as one first modulation mapping unit in a front-to-back order, and the bit data in the first modulation mapping unit is used to modulate a same modulation symbol. For any first target modulation mapping unit in the first modulation mapping unit, bit data of first two bits in the first target modulation mapping unit is mapped to a component of a first modulation symbol in an X polarization direction, and bit data of last two bits in the first target modulation mapping unit is mapped to a component of the first modulation symbol in a Y polarization direction. Further, the first modulation symbol is modulated based on the component of the first modulation symbol in the X polarization direction and the component of the first modulation symbol in the Y polarization direction. In this manner, bit data of every four consecutive bits in the first bit sequence is modulated into one modulation symbol.

In an embodiment, if the to-be-sent first symbol sequence is modulated in the dual-polarization quadrature phase shift keying scheme, a to-be-modulated second bit sequence may be determined based on the third matrix. Then, bit data of every eight adjacent bits in the second bit sequence is determined as one second modulation mapping unit in a front-to-back order, and the bit data in each second modulation mapping unit is used to modulate two modulation symbols. For any second target modulation mapping unit in the second modulation mapping unit, bit data of first two bits in the second target modulation mapping unit is mapped to a component of a second modulation symbol in an X polarization direction, bit data of a third bit and a fourth bit in the second target modulation mapping unit is mapped to a component of a third modulation symbol in the X polarization direction, bit data of a fifth bit and a sixth bit in the second target modulation mapping unit is mapped to a component of the second modulation symbol in a Y polarization direction, and bit data of a seventh bit and an eighth bit in the second target modulation mapping unit is mapped to a component of the third modulation symbol in the Y polarization direction. Further, the second modulation symbol is modulated based on the component of the second modulation symbol in the X polarization direction and the component of the second modulation symbol in the Y polarization direction, and the third modulation symbol is modulated based on the component of the third modulation symbol in the X polarization direction and the component of the third modulation symbol in the Y polarization direction. In this manner, bit data of every eight consecutive bits in the second bit sequence is cross-modulated into two modulation symbols.

A second aspect of this application provides another communication method. The method may be applied to a receive end device in a communication network, to restore a structure of received information and reduce a bit error rate of information transmission. In the method, a received first symbol sequence is demodulated, and a first matrix is determined based on a result obtained after the demodulation. The first matrix includes a plurality of bit square matrices of a same size, and each bit square matrix includes a plurality of pieces of bit data. Then, bit data position transformation among bit square matrices is performed on the first matrix to obtain a second matrix. Further, based on a first mapping relationship, position transformation in an orientation of each bit square matrix is performed on bit data of each bit square matrix in the second matrix, to obtain a third matrix after the transformation; and decoding is performed based on the third matrix to obtain a first bit sequence.

The first mapping relationship is constrained by using a global offset constraint factor and at least two local offset constraint factors. Information data that originally belongs to a same matrix row (that is, belongs to a same matrix row before a transmit end device performs bit data position transformation in the bit square matrix) and that is dispersed to positions of different rows in the matrix (dispersed to positions of different rows in the matrix after the transmit end device performs bit data position transformation in the bit square matrix) is restored to the same matrix row, so that the information is restored, and burst errors that may occur in an information transmission process are evenly dispersed and transformed into random errors, thereby reducing the bit error rate of information transmission.

In an embodiment, a row transformation mapping relationship is further constrained by using a start offset parameter, and the start offset parameter is used to constrain a start position at which position transformation is performed on the bit data in the bit square matrix based on a position offset. The start offset parameter is set, so that translation transformation may occur on the bit square matrix, to further implement position transformation of the bit data.

In an embodiment, a quantity of local offset constraint factors is related to the size of the bit square matrix. The first matrix is divided into a plurality of bit square matrices whose quantities of rows and columns are both $2^m$. In this case, there may be m−1 local offset constraint factors, where m is an integer greater than 3. The global offset constraint factor, the local offset constraint factors, and the start offset parameter constrain the row transformation mapping relationship by using the following formula:

$$r_0 = \{c_1 + g \times r_1 + \Sigma_{k=2}^{m}\{\beta_{k-2} \times \lfloor r_1/(2^{(k-1)}) \rfloor\} + \alpha\} \% (2^m),$$

Herein, $r_0$ is a row identifier corresponding to first bit data in the bit square matrix after position transformation in the bit square matrix range, and the first bit data is any bit data in the bit square matrix; $r_1$ is a row identifier corresponding to the first bit data before position transformation in the bit square matrix range; $c_1$ is a column identifier corresponding to the first bit data before position transformation in the bit square matrix range; g is the global offset constraint factor, β is the local offset constraint factor, α is the start offset parameter, and g, β, and α are all preset integers; and k is an index identifier of β, a value of g is determined based on $2^p$, and p is an integer greater than 1.

The m−1 local offset constraint factors include a local offset constraint factor for constraining a $2^{(f-1)th}$ bit row to a $2^{m\,th}$ bit row, and f is an integer greater than 0 and less than m. It should be noted that the m−1 local offset constraint factors herein may include 0, and a quantity of non-0 local offset constraint factors is not less than 2.

Bit data in different rows before transformation needs to correspond to a specific column offset when being transformed to another row, and when a plurality of pieces of bit data in different rows are transformed to a same row, corresponding column offsets are also different. A column offset when a plurality of pieces of bit data in different rows before transformation are transformed to a same row is constrained in a targeted and diversified manner by using the global offset constraint factor for constraining all rows and the m−1 local offset constraint factors for constraining some rows, so that discreteness and evenness of bit data position transformation in the bit square matrix range are improved.

In an embodiment, when m=4, g∈{−8, −4, 4}, and $\beta_2 \in \{-7, -5, -3, -1, 1, 3, 5, 7\}$.

When g=−8, values of $\beta_0$ and $\beta_1$ are one of the following combinations: $\{\beta_0=-6, \beta_1=-8\}$, $\{\beta_0=-6, \beta_1=0\}$, $\{\beta_0=-4, \beta_1=-6\}$, $\{\beta_0=-4, \beta_1=-2\}$, $\{\beta_0=-4, \beta_1=2\}$, $\{\beta_0=-4, \beta_1=6\}$, $\{\beta_0=-2, \beta_1=-8\}$, $\{\beta_0=-2, \beta_1=0\}$, $\{\beta_0=2, \beta_1=-8\}$, $\{\beta_0=2, \beta_1=0\}$, $\{\beta_0=4, \beta_1=-6\}$, $\{\beta_0=4, \beta_1=-2\}$, $\{\beta_0=4, \beta_1=2\}$, $\{\beta_0=4, \beta_1=6\}$, $\{\beta_0=6, \beta_1=-8\}$, and $\{\beta_0=6, \beta_1=0\}$.

When g=−4 or g=4, the values of $\beta_0$ and $\beta_1$ are one of the following combinations: $\{\beta_0=-6, \beta_1=4\}$, $\{\beta_0=-2, \beta_1=-4\}$, $\{\beta_0=0, \beta_1=-6\}$, $\{\beta_0=0, \beta_1=-2\}$, $\{\beta_0=0, \beta_1=2\}$, $\{\beta_0=0, \beta_1=6\}$, $\{\beta_0=2, \beta_1=4\}$, and $\{\beta_0=6, \beta_1=-4\}$.

In an embodiment, the first mapping relationship further includes a column transformation mapping relationship, and the column transformation mapping relationship is constrained by using the following formula:

$$c_0 = \{c_1 + h \times r_1 + \Sigma_{w=2}^{m}\{\gamma_{w=2} \times \lfloor r_1/(2^{\wedge}(w-1)) \rfloor\} + \theta\} \% (2^{\wedge}m),$$

Herein, $c_0$ is a column identifier corresponding to the first bit data after position transformation in the bit square matrix range; $r_1$ is the row identifier corresponding to the first bit data before position transformation in the bit square matrix range; $c_1$ is the column identifier corresponding to the first bit data before position transformation in the bit square matrix range; and h, γ, and θ are all preset integers, and w is an index identifier of γ.

Bit data in different columns before column transformation needs to correspond to a specific column offset when being transformed to another column, and when bit data in different columns are transformed to a same column, corresponding column offsets are also different. A column offset when bit data in different columns before transformation is transformed to a same column is constrained in a targeted and diversified manner by using the formula, so that discreteness and evenness of bit data position transformation in the bit square matrix range are improved.

In an embodiment, when a value of m is 4, a value of g is −4, a value of $\beta_0$ is 0, a value of $\beta_1$ is −2, a value of $\beta_2$ is 3, a value of α is 0, a value of h is −2, a value of $\gamma_0$ is 0, a value of $\gamma_1$ is 7, a value of $\gamma_2$ is −7, and a value of θ is 0.

In an embodiment, the first mapping relationship may be indicated by using a first mapping table. The first mapping table includes 256 table cells, and there is corresponding mapping position data in each table cell. For any first table cell in the first mapping table, mapping position data in the first table cell is (s, t), where s and t are both integers greater than or equal to 0 and less than 16, and (s, t) indicates a position that is of bit data stored in the first table cell and that is after position transformation in the bit square matrix range.

The first mapping table includes:

| (0, 0) | (1, 1) | (2, 2) | (3, 3) | (4, 4) | (5, 5) | (6, 6) | (7, 7) |
|---|---|---|---|---|---|---|---|
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) |

In an embodiment, the received first symbol sequence is demodulated in a dual-polarization quadrature amplitude modulation scheme.

In an embodiment, the received first symbol sequence is demodulated in a dual-polarization quadrature phase shift keying scheme.

In an embodiment, if the received first symbol sequence is demodulated in the dual-polarization quadrature phase shift keying scheme, for any first modulation symbol in the first symbol sequence, the first modulation symbol is demodulated, to obtain two bits of second bit data corresponding to a component of the first modulation symbol in an X polarization direction and two bits of third bit data corresponding to a component of the first modulation symbol in a Y polarization direction. The two bits of second bit data are arranged adjacent to each other in a same column in the first matrix, and the two bits of third bit data are arranged adjacent to each other below the second bit data.

In an embodiment, if the received first symbol sequence is demodulated in the dual-polarization quadrature phase shift keying scheme, for any second modulation symbol in the first symbol sequence, the second modulation symbol is demodulated, to obtain two bits of fourth bit data and two bits of fifth bit data that are corresponding to the second modulation symbol. The fourth bit data is bit data corresponding to a component of the second modulation symbol in an X polarization direction, and the fifth bit data is bit data corresponding to a component of the second modulation symbol in a Y polarization direction. The second modulation symbol is any modulation symbol other than the last modulation symbol in the first symbol sequence.

For a third modulation symbol that is after and adjacent to the second modulation symbol in the first symbol sequence, the third modulation symbol is demodulated, to obtain two bits of sixth bit data and two bits of seventh bit data that are corresponding to the third modulation symbol. The sixth bit data is bit data corresponding to a component of the third modulation symbol in the X polarization direction, and the seventh bit data is bit data corresponding to a component of the third modulation symbol in the Y polarization direction.

The two bits of fourth bit data are arranged adjacent to each other in a same column in the first matrix, the two bits of sixth bit data are arranged adjacent to each other below the fourth bit data, the two bits of fifth bit data are arranged adjacent to each other below the sixth bit data, and the two bits of seventh bit data are arranged adjacent to each other below the fifth bit data.

A third aspect of this application provides a communication apparatus, which may be a transmit end device in a communication network or a part of the transmit end device, and includes a first processing module, a second processing module, a third processing module, and a fourth processing module. The first processing module is configured to encode a to-be-transmitted first bit sequence, to obtain a first matrix. The first matrix includes a plurality of bit square matrices of a same size, and each bit square matrix includes a plurality of pieces of bit data. The second processing module is configured to perform, based on a first mapping relationship, position transformation in a range of each bit square matrix on the bit data of each bit square matrix in the first matrix, to obtain a second matrix. The third processing module is configured to perform, on the second matrix, bit data position transformation among bit square matrices, to obtain a second bit sequence. The fourth processing module is configured to modulate a to-be-sent first symbol sequence based on the second bit sequence.

The first mapping relationship may indicate a position mapping relationship before and after position transformation of each piece of bit data in the bit square matrix range, and includes a row transformation mapping relationship. The row transformation mapping relationship may indicate a row identifier mapping relationship before and after position transformation of the bit data in the bit square matrix range. The row transformation mapping relationship may be constrained by using a global offset constraint factor and at least two local offset constraint factors. The global offset constraint factor is used to constrain a position offset of row transformation of each piece of bit data in the bit square matrix. The local offset constraint factor is used to constrain position offsets of row transformation of bit data located in some bit rows in the bit square matrix. Position offsets of row transformation of bit data in different bit rows are constrained in a targeted and diversified manner by using the global offset constraint factor and the at least two local offset constraint factors, so that position transformation is more discretely and evenly performed on the bit data in the first matrix, thereby improving a burst tolerance capability of information transmission.

In an embodiment, the row transformation mapping relationship is further constrained by using a start offset parameter, and the start offset parameter may constrain a start position at which position transformation is performed on the bit data in the bit square matrix based on the position offset. The start offset parameter is set, so that translation transformation may occur on the bit square matrix, to further implement position transformation of the bit data.

In an embodiment, a quantity of local offset constraint factors is related to the size of the bit square matrix. The first matrix is divided into a plurality of bit square matrices whose quantities of rows and columns are both $2^m$. In this case, there may be m−1 local offset constraint factors, where m is an integer greater than 3. The global offset constraint factor, the local offset constraint factors, and the start offset parameter constrain the row transformation mapping relationship by using the following formula:

$$r_0 = \{c_1 + g \times r_1 + \Sigma_{k=2}^{m}\{\beta_{k-2} \times \lfloor r_1/(2^{(k-1)}) \rfloor\} + \alpha\} \% (2^m),$$

Herein, $r_0$ is a row identifier corresponding to first bit data in the bit square matrix before position transformation in the bit square matrix range, and the first bit data is any bit data in the bit square matrix; $r_1$ is a row identifier corresponding to the first bit data after position transformation in the bit square matrix range; $c_1$ is a column identifier corresponding to the first bit data after position transformation in the bit square matrix range; g is the global offset constraint factor, $\beta$ is the local offset constraint factor, $\alpha$ is the start offset parameter, and g, $\beta$, and $\alpha$ are all preset integers; and k is an index identifier of $\beta$, a value of g is determined based on $2^p$, and p is an integer greater than 1.

The m−1 local offset constraint factors include a local offset constraint factor for constraining a $2^{(f-1)th}$ bit row to a $2^{fth}$ bit row, and f is an integer greater than 0 and less than m. It should be noted that the m−1 local offset constraint factors herein may include 0, and a quantity of non-0 local offset constraint factors is not less than 2.

Bit data in a same row before transformation needs to correspond to a specific column offset when being transformed to another row, and when a plurality of pieces of bit data in a same row are transformed to different bit rows, corresponding column offsets are also different. A column offset when bit data in a same row before transformation is transformed to another row is constrained in a targeted and diversified manner by using the global offset constraint factor for constraining all rows and the m−1 local offset constraint factors for constraining some rows, so that discreteness and evenness of bit data position transformation in the bit square matrix range are improved.

In an embodiment, when m=4, g∈{−8, −4, 4}, and $\beta_2$∈{−7, −5, −3, −1, 1, 3, 5, 7}.

When g=−8, values of $\beta_0$ and $\beta_1$ are one of the following combinations: {$\beta_0$=−6, $\beta_1$=−8}, {$\beta_0$=−6, $\beta_1$=0}, {$\beta_0$=−4, $\beta_1$=−6}, {$\beta_0$=−4, $\beta_1$=−2}, {$\beta_0$=−4, $\beta_1$=2}, {$\beta_0$=−4, $\beta_1$=6}, {$\beta_0$=−2, $\beta_1$=−8}, {$\beta_0$=−2, $\beta_1$=0}, {$\beta_0$=2, $\beta_1$=−8}, {$\beta_0$=2, $\beta_1$=0}, {$\beta_0$=4, $\beta_1$=−6}, {$\beta_0$=4, $\beta_1$=−2}, {$\beta_0$=4, $\beta_1$=2}, {$\beta_0$=4, $\beta_1$=6}, {$\beta_0$=6, $\beta_1$=−8}, and {$\beta_0$=6, $\beta_1$=0}.

When g=−4 or g=4, the values of $\beta_0$ and $\beta_1$ are one of the following combinations: {$\beta_0$=−6, $\beta_1$=4}, {$\beta_0$=−2, $\beta_1$=−4}, {$\beta_0$=0, $\beta_1$=−6}, {$\beta_0$=0, $\beta_1$=−2}, {$\beta_0$=0, $\beta_1$=2}, {$\beta_0$=0, $\beta_1$=6}, {$\beta_0$=2, $\beta_1$=4}, and {$\beta_0$=6, $\beta_1$=−4}.

In an embodiment, the first mapping relationship further includes a column transformation mapping relationship, and the column transformation mapping relationship is constrained by using the following formula:

position that is of bit data stored in the first table cell and that is before position transformation in the bit square matrix range.

The first mapping table includes:

| | | | | | | | |
|---|---|---|---|---|---|---|---|
| (0, 0) | (1, 1) | (2, 2) | (3, 3) | (4, 4) | (5, 5) | (6, 6) | (7, 7) |
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) |

$$c_0 = \{c_1 + h \times r_1 + \Sigma_{w=2}^{m} \{\gamma_{w-2} \times \lfloor r_1/(2^{(w-1)}) \rfloor\} + \theta\} \% (2^m).$$

Herein, $c_0$ is a column identifier corresponding to the first bit data before position transformation in the bit square matrix range; $r_1$ is the row identifier corresponding to the first bit data after position transformation in the bit square matrix range; $c_1$ is the column identifier corresponding to the first bit data after position transformation in the bit square matrix range; and h, γ, and θ are all preset integers, and w is an index identifier of γ.

Bit data in a same column before column transformation needs to correspond to a specific column offset when being transformed to another column, and when a plurality of pieces of bit data in a same column are transformed to different bit columns, corresponding column offsets are also different. A column offset when bit data in a same column before transformation is transformed to another column is constrained in a targeted and diversified manner by using the formula, so that discreteness and evenness of bit data position transformation in the bit square matrix range are improved.

In an embodiment, when a value of m is 4, a value of g is −4, a value of $\beta_0$ is 0, a value of $\beta_1$ is −2, a value of $\beta_2$ is 3, a value of α is 0, a value of h is −2, a value of $\gamma_0$ is 0, a value of $\gamma_1$ is 7, a value of $\gamma_2$ is −7, and a value of θ is 0.

In an embodiment, the first mapping relationship may be indicated by using a first mapping table. The first mapping table includes 256 table cells, and there is corresponding mapping position data in each table cell. For any first table cell in the first mapping table, mapping position data in the first table cell is (s, t), where s and t are both integers greater than or equal to 0 and less than 16, and (s, t) indicates a For example, mapping position data included in a table cell at a position of a row 2 and a column 5 in the foregoing table is (13, 1), indicating that in a position transformation process in the bit square matrix range, bit data in a row 13 and a column 1 is transformed to the position of the row 2 and the column 5 in the bit square matrix.

In an embodiment, the fourth processing module is configured to modulate the to-be-sent first symbol sequence in a dual-polarization quadrature amplitude modulation scheme.

In an embodiment, the fourth processing module is configured to modulate the to-be-sent first symbol sequence in a dual-polarization quadrature phase shift keying scheme.

In an embodiment, if the fourth processing module modulates the to-be-sent first symbol sequence in the dual-polarization quadrature phase shift keying scheme, the fourth processing module may determine a to-be-modulated first bit sequence based on the third matrix; determine bit data of every four adjacent bits in the first bit sequence as one first modulation mapping unit in a front-to-back order, where the bit data in the first modulation mapping unit is used to modulate a same modulation symbol; for any first target modulation mapping unit in the first modulation mapping unit, map bit data of first two bits in the first target modulation mapping unit to a component of a first modulation symbol in an X polarization direction, and map bit data of last two bits in the first target modulation mapping unit to a component of the first modulation symbol in a Y polarization direction; and further modulate the first modulation symbol based on the component of the first modulation symbol in the X polarization direction and the component of the first modulation symbol in the Y polarization direction. In this manner, bit data of every four consecutive bits in the first bit sequence is modulated into one modulation symbol.

In an embodiment, if the fourth processing module modulates the to-be-sent first symbol sequence in the dual-polarization quadrature phase shift keying scheme, the fourth processing module may determine a to-be-modulated second bit sequence based on the third matrix; then determine bit data of every eight adjacent bits in the second bit sequence as one second modulation mapping unit in a front-to-back order, where the bit data in each second modulation mapping unit is used to modulate two modulation symbols; for any second target modulation mapping unit in the second modulation mapping unit, map bit data of first two bits in the second target modulation mapping unit to a component of a second modulation symbol in an X polarization direction, map bit data of a third bit and a fourth bit in the second target modulation mapping unit to a component of a third modulation symbol in the X polarization direction, map bit data of a fifth bit and a sixth bit in the second target modulation mapping unit to a component of the second modulation symbol in a Y polarization direction, and map bit data of a seventh bit and an eighth bit in the second target modulation mapping unit to a component of the third modulation symbol in the Y polarization direction; and further modulate the second modulation symbol based on the component of the second modulation symbol in the X polarization direction and the component of the second modulation symbol in the Y polarization direction, and modulate the third modulation symbol based on the component of the third modulation symbol in the X polarization direction and the component of the third modulation symbol in the Y polarization direction. In this manner, bit data of every eight consecutive bits in the second bit sequence is cross-modulated into two modulation symbols.

A fourth aspect of this application further provides another communication apparatus. The apparatus may be a receive end device in a communication network or a part of the receive end device, and may restore a structure of received information and reduce a bit error rate of information transmission. The apparatus includes a first processing module, a second processing module, a third processing module, and a fourth processing module. The first processing module is configured to demodulate a received first symbol sequence, to obtain a first matrix. The first matrix includes a plurality of bit square matrices of a same size, and each bit square matrix includes a plurality of pieces of bit data. The second processing module is configured to perform, on the first matrix, bit data position transformation among bit square matrices, to obtain a second matrix. The third processing module is configured to perform, based on a first mapping relationship, position transformation in an orientation of each bit square matrix on bit data of each bit square matrix in the second matrix, to obtain a third matrix after the transformation. The fourth processing module is configured to perform decoding based on the third matrix, to obtain a first bit sequence.

The first mapping relationship is constrained by using a global offset constraint factor and at least two local offset constraint factors. Information data that originally belongs to a same matrix row (that is, belongs to a same matrix row before a transmit end device performs bit data position transformation in the bit square matrix) and that is dispersed to positions of different rows in the matrix (dispersed to positions of different rows in the matrix after the transmit end device performs bit data position transformation in the bit square matrix) is restored to the same matrix row, so that the information is restored, and burst errors that may occur in an information transmission process are evenly dispersed and transformed into random errors, thereby reducing the bit error rate of information transmission.

In an embodiment, a row transformation mapping relationship is further constrained by using a start offset parameter, and the start offset parameter is used to constrain a start position at which position transformation is performed on the bit data in the bit square matrix based on a position offset. The start offset parameter is set, so that translation transformation may occur on the bit square matrix, to further implement position transformation of the bit data.

In an embodiment, a quantity of local offset constraint factors is related to the size of the bit square matrix. The first matrix is divided into a plurality of bit square matrices whose quantities of rows and columns are both $2^m$. In this case, there may be m−1 local offset constraint factors, where m is an integer greater than 3. The global offset constraint factor, the local offset constraint factors, and the start offset parameter constrain the row transformation mapping relationship by using the following formula:

$$r_0 = \{c_1 + g \times r_1 + \Sigma_{k=2}^m \{\beta_{k-2} \times \lfloor r_1/(2^{(k-1)}) \rfloor\} + \alpha\} \% (2^m).$$

Herein, $r_0$ is a row identifier corresponding to first bit data in the bit square matrix after position transformation in the bit square matrix range, and the first bit data is any bit data in the bit square matrix; $r_1$ is a row identifier corresponding to the first bit data before position transformation in the bit square matrix range; $c_1$ is a column identifier corresponding to the first bit data before position transformation in the bit square matrix range; g is the global offset constraint factor, $\beta$ is the local offset constraint factor, $\alpha$ is the start offset parameter, and g, $\beta$, and $\alpha$ are all preset integers; and k is an index identifier of $\beta$, a value of g is determined based on $2^p$, and p is an integer greater than 1.

The m−1 local offset constraint factors include a local offset constraint factor for constraining a $2^{(f-1)th}$ bit row to a $2^{-mth}$ bit row, and f is an integer greater than 0 and less than m. It should be noted that the m−1 local offset constraint factors herein may include 0, and a quantity of non-0 local offset constraint factors is not less than 2.

Bit data in different rows before transformation needs to correspond to a specific column offset when being transformed to another row, and when a plurality of pieces of bit data in different rows are transformed to a same row, corresponding column offsets are also different. A column offset when a plurality of pieces of bit data in different rows before transformation are transformed to a same row is constrained in a targeted and diversified manner by using the global offset constraint factor for constraining all rows and the m−1 local offset constraint factors for constraining some rows, so that discreteness and evenness of bit data position transformation in the bit square matrix range are improved.

In an embodiment, when m=4, g∈{−8, −4, 4}, and $\beta_2${−7, −5, −3, −1, 1, 3, 5, 7}.

When g=−8, values of $\beta_0$ and $\beta_1$ are one of the following combinations: {$\beta_0$=−6, $\beta_1$=−8}, {$\beta_0$=−6, $\beta_1$=0}, {$\beta_0$=−4, $\beta_1$=−6}, {$\beta_0$=−4, $\beta_1$=−2}, {$\beta_0$=−4, $\beta_1$=2}, {$\beta_0$=−4, $\beta_1$=6}, {$\beta_0$=−2, $\beta_1$=−8}, {$\beta_0$=−2, $\beta_1$=0}, {$\beta_0$=2, $\beta_1$=−8}, {$\beta_0$=2, $\beta_1$=0}, {$\beta_0$=4, $\beta_1$=−6}, {$\beta_0$=4, $\beta_1$=−2}, {$\beta_0$=4, $\beta_1$=2}, {$\beta_0$=4, $\beta_1$=6}, {$\beta_0$=6, $\beta_1$=−8}, and {$\beta_0$=6, $\beta_1$=0}.

When g=−4 or g=4, the values of $\beta_0$ and $\beta_1$ are one of the following combinations: {$\beta_0$=−6, $\beta_1$=4}, {$\beta_0$=−2, $\beta_1$=−4}, {$\beta_0$=0, $\beta_1$=−6}, {$\beta_0$=0, $\beta_1$=−2}, {$\beta_0$=0, $\beta_1$=2}, {$\beta_0$=0, $\beta_1$=6}, {$\beta_0$=2, $\beta_1$=4}, and {$\beta_0$=6, $\beta_1$=−4}.

In an embodiment, the first mapping relationship further includes a column transformation mapping relationship, and the column transformation mapping relationship is constrained by using the following formula:

$$c_0 = \{c_1 + h \times r_1 + \Sigma_{w=2}^{m}\{\gamma_{w-2} \times \lfloor r_1/(2^{(w-1)}) \rfloor\} + \theta\} \% (2^m).$$

cell in the first mapping table, mapping position data in the first table cell is (s, t), where s and t are both integers greater than or equal to 0 and less than 16, and (s, t) indicates a position that is of bit data stored in the first table cell and that is after position transformation in the bit square matrix range.

The first mapping table includes:

| | | | | | | | |
|---|---|---|---|---|---|---|---|
| (0, 0) | (1, 1) | (2, 2) | (3, 3) | (4, 4) | (5, 5) | (6, 6) | (7, 7) |
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |
| (1, 0) | (2, 1) | (3, 2) | (4, 3) | (5, 4) | (6, 5) | (7, 6) | (8, 7) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) |
| (9, 8) | (10, 9) | (11, 10) | (12, 11) | (13, 12) | (14, 13) | (15, 14) | (0, 15) |

Herein, $c_0$ is a column identifier corresponding to the first bit data after position transformation in the bit square matrix range; $r_1$ is a row identifier corresponding to the first bit data before position transformation in the bit square matrix range; $c_1$ is a column identifier corresponding to the first bit data before position transformation in the bit square matrix range; and h, γ, and θ are all preset integers, and w is an index identifier of γ.

Bit data in different columns before column transformation needs to correspond to a specific column offset when being transformed to another column, and when bit data in different columns are transformed to a same column, corresponding column offsets are also different. A column offset when bit data in different columns before transformation is transformed to a same column is constrained in a targeted and diversified manner by using the formula, so that discreteness and evenness of bit data position transformation in the bit square matrix range are improved.

In an embodiment, when a value of m is 4, a value of g is −4, a value of $\beta_0$ is 0, a value of $\beta_1$ is −2, a value of $\beta_2$ is 3, a value of α is 0, a value of h is −2, a value of $\gamma_0$ is 0, a value of $\gamma_1$ is 7, a value of $\gamma_2$ is −7, and a value of θ is 0.

In an embodiment, the first mapping relationship may be indicated by using a first mapping table. The first mapping table includes 256 table cells, and there is corresponding mapping position data in each table cell. For any first table In an embodiment, the first processing module is configured to demodulate the received first symbol sequence in a dual-polarization quadrature amplitude modulation scheme.

In an embodiment, the first processing module is configured to demodulate the received first symbol sequence in a dual-polarization quadrature phase shift keying scheme.

In an embodiment, if the first processing module demodulates the received first symbol sequence in the dual-polarization quadrature phase shift keying scheme, for any first modulation symbol in the first symbol sequence, the first processing module demodulates the first modulation symbol, to obtain two bits of second bit data corresponding to a component of the first modulation symbol in an X polarization direction and two bits of third bit data corresponding to a component of the first modulation symbol in a Y polarization direction; and arranges the two bits of second bit data adjacent to each other in a same column in the first matrix, and arranges the two bits of third bit data adjacent to each other below the second bit data.

In an embodiment, if the first processing module demodulates the received first symbol sequence in the dual-polarization quadrature phase shift keying scheme, for any second modulation symbol in the first symbol sequence, the first processing module demodulates the second modulation symbol, to obtain two bits of fourth bit data and two bits of fifth bit data that are corresponding to the second modulation symbol. The fourth bit data is bit data corresponding to a component of the second modulation symbol in an X polarization direction, and the fifth bit data is bit data corresponding to a component of the second modulation symbol in a Y polarization direction. The second modulation symbol is any modulation symbol other than the last modulation symbol in the first symbol sequence.

For a third modulation symbol that is after and adjacent to the second modulation symbol in the first symbol sequence, the third modulation symbol is demodulated, to obtain two bits of sixth bit data and two bits of seventh bit data that are corresponding to the third modulation symbol. The sixth bit data is bit data corresponding to a component of the third modulation symbol in the X polarization direction, and the seventh bit data is bit data corresponding to a component of the third modulation symbol in the Y polarization direction.

The two bits of fourth bit data are arranged adjacent to each other in a same column in the first matrix, the two bits of sixth bit data are arranged adjacent to each other below the fourth bit data, the two bits of fifth bit data are arranged adjacent to each other below the sixth bit data, and the two bits of seventh bit data are arranged adjacent to each other below the fifth bit data.

A fifth aspect of this application provides another communication apparatus. The communication apparatus may be a transmit end device or a receive end device in a communication network, or may be a part of the transmit end device or a part (for example, a circuit or a chip) of the receive end device; and includes a processor, a memory, and a communication interface. The processor, the memory, and the communication interface are connected to each other. The communication interface is configured to receive and send data, the memory is configured to store the foregoing program, and the processor is configured to invoke the program stored in the memory. When the program is executed by a computer, the computer is enabled to perform the communication method in any one of the first aspect or the possible implementations of the first aspect, or perform the communication method in any one of the second aspect or the possible implementations of the second aspect. The processor and the memory may be physically independent units, or the memory and the processor may be integrated.

A sixth aspect of this application provides a computer-readable medium. The computer-readable medium stores instructions, and when the instructions are run on a computer, the computer is enabled to perform the communication method in any one of the first aspect or the possible implementations of the first aspect, or perform the communication method in any one of the second aspect or the possible implementations of the second aspect.

A seventh aspect of this application provides a computer program product. The computer program product includes computer program code. When the computer program code is run on a computer, the computer is enabled to perform the method in any one of the first aspect or the possible implementations of the first aspect, or perform the communication method in any one of the second aspect or the possible implementations of the second aspect.

An eighth aspect of this application provides a chip. The chip includes a processor and a communication interface. The processor is coupled to the communication interface, and is configured to implement the communication method provided in any one of the first aspect or the optional implementations of the first aspect, or implement the communication method in any one of the second aspect or the possible implementations of the second aspect.

BRIEF DESCRIPTION OF DRAWINGS

To describe technical solutions of embodiments of this application more clearly, the following briefly describes accompanying drawings used for describing embodiments. It is clear that the accompanying drawings in the following description show merely some embodiments of this application, and a person of ordinary skill in the art may derive other drawings from these accompanying drawings without creative efforts.

FIG. 5 is a constellation diagram of 16QAM according to an embodiment of this application;

FIG. 6 is a constellation diagram of QPSK according to an embodiment of this application;

FIG. 7 is a schematic diagram of a bit sequence according to an embodiment of this application;

DESCRIPTION OF EMBODIMENTS

The following clearly and completely describes the technical solutions in embodiments of this application with reference to the accompanying drawings in embodiments of this application. It is clear that the described embodiments are some but not all of embodiments of this application. All other embodiments obtained by a person of ordinary skill in the art based on embodiments of this application without creative efforts shall fall within the protection scope of this application.

First, some operation symbols that appear in formulas in the embodiments of this application are described. An operation $\lfloor a \rfloor$ that appears in the embodiments of this application indicates that a rounded-down operation is performed on a. For example, $\lfloor 1.5 \rfloor = 1$, and $\lfloor -1.5 \rfloor = -2$. An operation b % c that appears in the embodiments of this application indicates b modulo c. When b is a nonnegative number, a remainder obtained by dividing b by c is used as a value of b % c. For example, 8%3=2, and 2%3=2. When b is a negative number, the value of b % c is obtained by adding an integer multiple of c to b to enable b to become a positive integer, and then performing a modulo operation. For example, −9%16=7, and −10%3=2.

Figure 1:
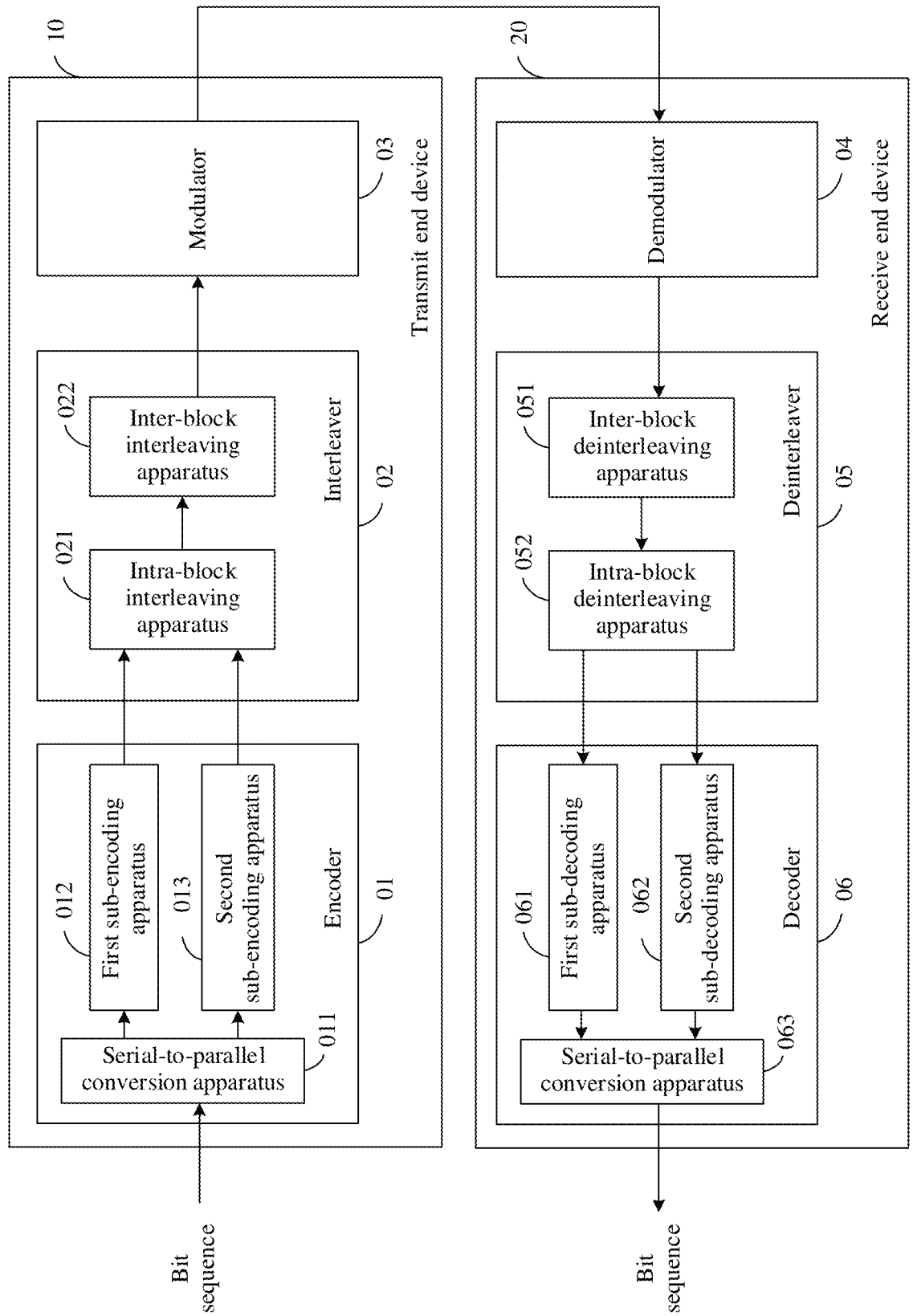
FIG. 1 is a schematic diagram of an architecture of a communication system according to an embodiment of this application.

The following describes a system architecture on which a communication method in the embodiments of this application is based. FIG. 1 is a schematic diagram of an architecture of a communication system according to an embodiment of this application. As shown in FIG. 1, the communication system includes a transmit end device 10 and a receive end device 20.

The transmit end device 10 has a function of encoding an input to-be-sent bit sequence. The transmit end device 10 further has a function of changing an information structure, including a function of performing, based on a first mapping relationship, bit data position transformation in a bit square matrix range on a bit square matrix in a matrix carrying transmission information, and a function of performing bit data position transformation among bit square matrices on bit square matrices in the matrix carrying transmission information. The transmit end device 10 further has a function of modulating and outputting information obtained after the structure changing. The transmit end device 10 may be one entity device that integrates all the foregoing functions, or may include a plurality of entity devices that respectively have the foregoing different functions.

The receive end device 20 has a function of demodulating received information. The receive end device 20 further has a function of restoring a structure of the demodulated information, including a function of performing bit data position transformation among bit square matrices on the bit square matrices in the matrix carrying transmission information (that is, inverse transformation of bit data position transformation among bit square matrices performed by the transmit end device), and a function of performing, based on the first mapping relationship, bit data position transformation in the bit square matrix range on the bit square matrix in the matrix carrying transmission information (that is, inverse transformation of bit data position transformation in the bit square matrix range performed by the transmit end device). The receive end device 20 further has a function of decoding information obtained after the structure restoring. The receive end device 20 may be one entity device that integrates all the foregoing functions, or may include a plurality of entity devices that respectively have the foregoing different functions.

In an embodiment, the transmit end device 10 may include an encoder 01, an interleaver 02, and a modulator 03, and the receive end device 20 may include a demodulator 04, a deinterleaver 05, and a decoder 06.

The encoder 01 is configured to receive a bit sequence that carries to-be-transmitted information. The bit sequence that carries the to-be-transmitted information includes a plurality of pieces of bit data, and the bit data carries the to-be-transmitted information. The encoder 01 is further configured to encode the received bit sequence, convert the received bit sequence into a signal form that may be used for transmission, storage, or the like, and transmit the encoded bit sequence to the interleaver 02. In an embodiment, the encoder 01 may be an FEC encoder.

Further, the encoder 01 may include a serial-to-parallel conversion apparatus 011, a first sub-encoding apparatus 012, and a second sub-encoding apparatus 013. The serial-to-parallel conversion apparatus 011 may be configured to perform serial-to-parallel conversion on a to-be-transmitted bit sequence to convert the to-be-transmitted bit sequence into two bit sequences that may be processed in parallel, and transmit the two bit sequences obtained after the serial-to-parallel conversion to the first sub-encoding apparatus 012 and the second sub-encoding apparatus 013 respectively. The first sub-encoding apparatus 012 and the second sub-encoding apparatus 013 are respectively configured to encode the received bit sequences, and transmit the encoded bit sequences to the interleaver 02.

The interleaver 02 is configured to perform position transformation on bit data in a received bit sequence, so that a structure of the bit sequence is changed without content being changed. The interleaver 02 is further configured to send a bit sequence obtained after the position transformation to the modulator 03. In an embodiment, the interleaver 02 may be an FEC interleaver. Specifically, the interleaver 02 may process the received bit sequence in a form of a matrix, and implement position transformation on the bit data in the bit sequence by changing positions of bits in the matrix. Further, the matrix is a matrix that may be divided into a plurality of bit square matrices of a same size, and quantities of bit rows and bit columns in the bit square matrix are equal.

Further, the interleaver 02 may include an intra-block interleaving apparatus 021 and an inter-block interleaving apparatus 022. If the interleaver 02 processes the received bit sequence in the form of the matrix, the intra-block interleaving apparatus 021 is configured to perform position transformation in the bit square matrix on bit data in each bit square matrix, and the inter-block interleaving apparatus 022 is configured to perform position transformation among bit square matrices on bit data in the bit square matrices, and send a converted matrix to the modulator 03.

The modulator 03 is configured to perform modulation processing on a received bit sequence, to modulate the received bit sequence into a symbol sequence form suitable for transmission in a channel. The modulator 03 is further configured to output a symbol sequence obtained through modulation to a transmission channel. In an embodiment, the modulator 03 may be a device that performs modulation in a Dual-polarization Quadrature Amplitude Modulation (DP-QAM) scheme, a device that performs modulation in a Dual-polarization Quadrature Phase Shift Keying (DP-QPSK) modulation scheme, or the like. In an embodiment, the modulator 03 may first map bit data in the bit sequence to a component of a modulation symbol in a complex plane, and further perform modulation based on the component in the complex plane, to modulate a plurality of pieces of bit data to generate one modulation symbol.

The demodulator 04 is configured to perform demodulation processing on a received transmission signal, to restore to-be-transmitted information from the received transmission signal. The transmission signal includes a modulation symbol sequence, which is restored to a bit sequence form after the demodulation processing. The demodulator 04 is further configured to transmit a bit sequence obtained through demodulation to the deinterleaver 05. Optionally, the demodulator 04 may use a demodulation scheme corresponding to DP-QAM, a demodulation scheme corresponding to DP-QPSK, or the like. The demodulator 04 may demodulate the modulation symbol sequence to obtain a component of each modulation symbol in the complex plane, and further determine corresponding bit data based on the component in the complex plane. In different modulation schemes, an amount of bit data corresponding to one modulation symbol is different. The demodulator 04 may use a demodulation scheme corresponding to a modulation scheme used by the modulator on a signal transmit side.

The deinterleaver 05 is configured to receive the bit sequence obtained through demodulation by the demodulator 04, and perform position transformation on bit data in the bit sequence, so that a structure of the bit sequence is changed without content being changed. The deinterleaver 05 is further configured to send a bit sequence obtained after the position transformation to the decoder 06. In an embodiment, the deinterleaver may be an FEC deinterleaver. Specifically, the deinterleaver 05 may process the received bit sequence in a form of a matrix, and restore a message by changing a position of the bit data.

Further, the deinterleaver 05 may include an inter-block deinterleaving apparatus 051 and an intra-block deinterleaving apparatus 052. The inter-block deinterleaving apparatus 051 is configured to perform position transformation among bit square matrices on bit data in the bit square matrices, and the intra-block deinterleaving apparatus 052 is configured to perform position transformation in a bit square matrix range on bit data in each bit square matrix. After converting the matrix into a bit sequence form, the intra-block deinterleaving apparatus 052 sends obtained two bit sequences to the decoder 06.

The decoder 06 is configured to receive the bit sequences sent by the deinterleaver 05, decode the received bit sequences to restore to-be-transmitted information, and transmit the obtained information to a destination receiving device of the information. In an embodiment, the decoder 06 may be an FEC decoder.

Further, the decoder 06 may include a first sub-decoding apparatus 061, a second sub-decoding apparatus 062, and a parallel-to-serial conversion apparatus 063. The first sub-decoding apparatus 061 and the second sub-decoding apparatus 062 are respectively configured to decode the two bit sequences output by the deinterleaver, to respectively output decoded bit sequences. The parallel-to-serial conversion apparatus 061 is configured to convert the received decoded bit sequences into a bit sequence for serial processing, and then output the bit sequence.

Based on the foregoing system architecture, an embodiment of this application provides a communication method. At a transmit end of a communication network, information structure adjustment may be performed on an encoded matrix based on a first mapping relationship, and information obtained after the structure adjustment may be modulated and sent. A row transformation mapping relationship in the first mapping relationship is constrained by using a global offset constraint factor and at least two local offset constraint factors, so that information data in a same matrix row is evenly and discretely adjusted to positions of different rows in the matrix, and the adjusted information has a higher burst tolerance capability in a transmission process. Correspondingly, at a receive end of the communication network, structure restoration is performed on the received information based on the first mapping relationship, so that the information data that originally belongs to the same matrix row (that is, belongs to the same matrix row before the transmit end performs information structure adjustment) and that is dispersed to positions of different rows in the matrix (dispersed to positions of different rows in the matrix after the transmit end performs information structure adjustment) is restored to the same matrix row, so that the information is restored, and burst errors that may occur in an information transmission process are evenly dispersed and transformed into random errors, thereby reducing a bit error rate of information transmission.

Figure 2:
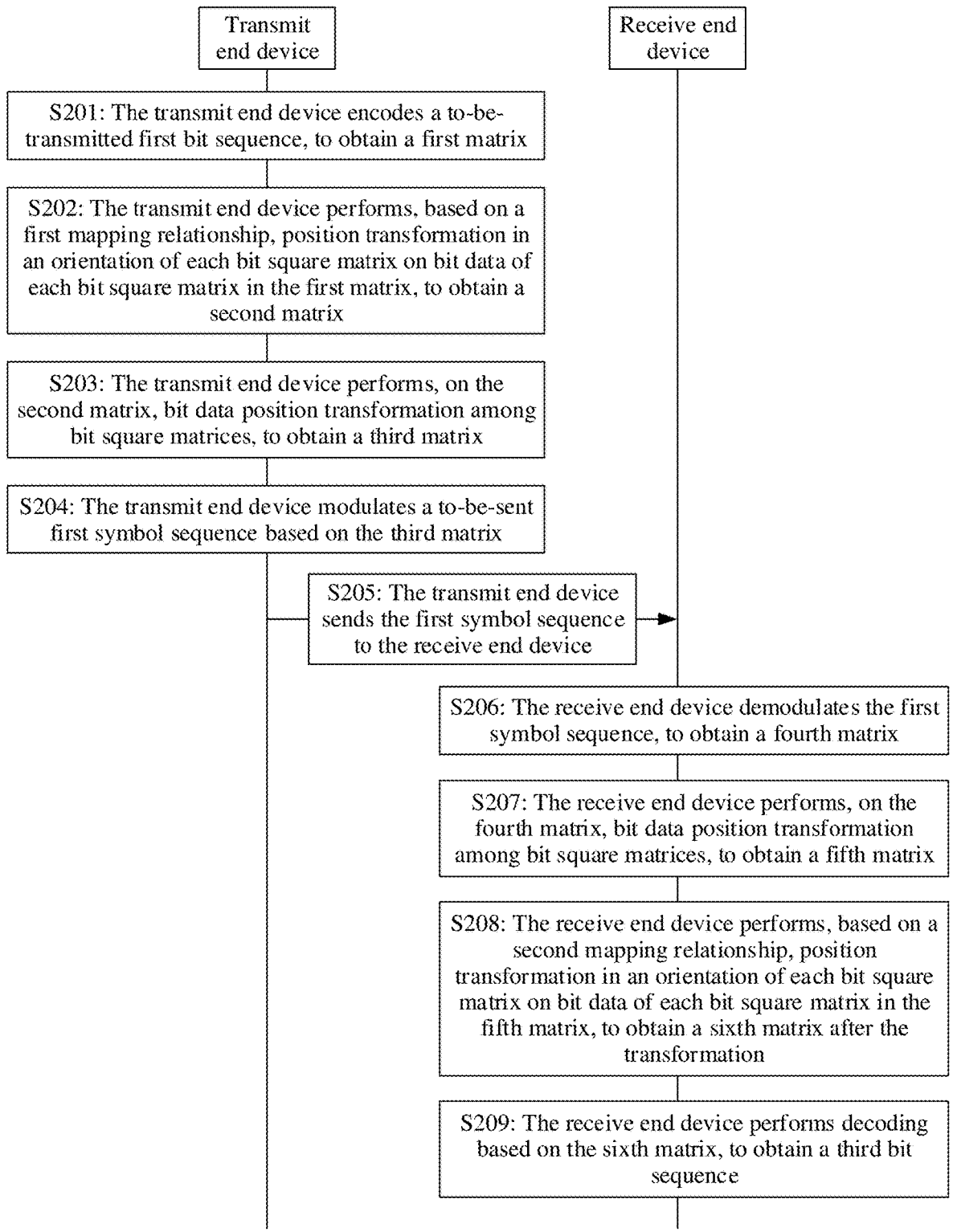
FIG. 2 is a schematic flowchart of a communication method according to an embodiment of this application.

FIG. 2 is a schematic flowchart of a communication method according to an embodiment of this application. The method includes but is not limited to operations S201 to S209. In an embodiment, operations S201 to S205 may be performed by the transmit end device 10 in the system architecture shown in FIG. 1, and operations S206 to S209 may be performed by the receive end device 20 in the system architecture shown in FIG. 1.

In operation S201, the transmit end device encodes a to-be-transmitted first bit sequence, to obtain a first matrix.

In an embodiment, the first bit sequence may be a to-be-transmitted bit sequence of a specific length that is received by the transmit end device in a specific time unit. For example, a length of a bit sequence that may be received by the transmit end device in a time unit is 149184×Z (Z may be a positive integer, for example, 4, 6, or 8) bits. A bit sequence whose length is 149184×Z bits and that is received in a time unit may be used as the first bit sequence.

In an embodiment, the transmit end device may perform serial-to-parallel conversion on the first bit sequence to obtain two parallel bit sequences, separately encode the two parallel bit sequences to obtain two encoded bit sequences, and further separately convert the two encoded bit sequences into a matrix form to obtain two first matrices. That is, the matrices into which the two encoded bit sequences are converted need to be used as the first matrices, on which the following operation related to the first matrix is performed.

For example, the length of the first bit sequence received by the transmit end device is 149184×Z bits. The first bit sequence may be converted into two parallel bit sequences whose lengths are 74592×Z bits, which are separately encoded to obtain two parallel bit sequences whose lengths are 86016×Z bits. The two parallel bit sequences whose lengths are 86016×Z bits are respectively converted into matrices including 672×Z bit rows and 128 bit columns.

The first matrix may be divided into a plurality of bit square matrices of a same size, for example, a plurality of bit square matrices with 16 bit rows and 16 bit columns, a plurality of bit square matrices with 32 bit rows and 32 bit columns, a plurality of bit square matrices with 64 bit rows and 64 bit columns, or the like. In a process of converting an encoded bit sequence into a matrix, bit data may be filled by using a bit square matrix as a unit, to implement conversion into the matrix form.

Figure 3:
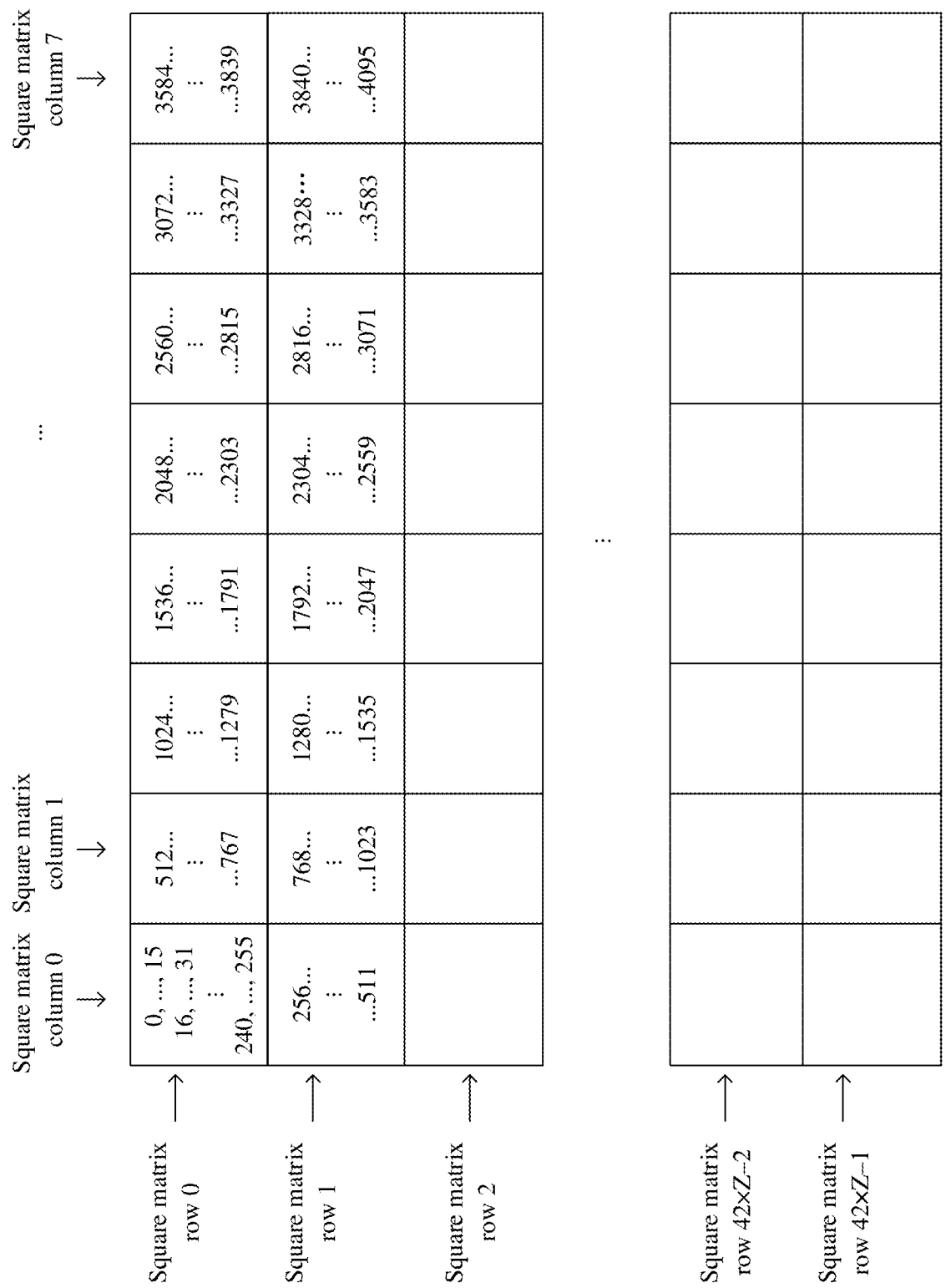
FIG. 3 is a schematic diagram of matrix representation of a bit sequence according to an embodiment of this application.

For example, if the transmit end device obtains an encoded bit sequence whose length is 86016×Z bits, the encoded bit sequence is converted into a first matrix including 672×Z bit rows and 128 bit columns. The first matrix is divided into a plurality of bit square matrices with 16 bit rows and 16 bit columns. That is, the first matrix includes 42×Z square matrix rows and eight square matrix columns. Positions of all bit data in the encoded bit sequence are denoted by $\{0, 1, 2, 3, 4, 5, 6, \ldots, 86016 \times Z-3, 86016 \times Z-2, 86016 \times Z-1\}$. For example, in the encoded bit sequence, a position of bit data of a first bit in the encoded bit sequence is denoted by 0, a position of bit data of a second bit in the encoded bit sequence is denoted by 1, and a position of bit data of an $86016 \times Z^{th}$ bit in the encoded bit sequence is denoted by 86016×Z−1. FIG. 3 is a schematic diagram of matrix representation of a bit sequence according to an embodiment of this application. As shown in FIG. 3, the transmit end device may sequentially place bit data at positions 0 to 15 in the encoded bit sequence into positions of a first bit row in a first bit square matrix located in a square matrix row 0 and a square matrix column 0, sequentially place bit data at positions 16 to 31 into positions of a second bit row in the first bit square matrix, and so on. A total of bit data at positions 0 to 255 in the encoded bit sequence is placed in the first bit square matrix. In the same manner, bit data at positions 256 to 511 in the encoded bit sequence is placed in a second bit square matrix located in a square matrix row 1 and the square matrix column 0, bit data at positions 512 to 767 in the encoded bit sequence is placed in a third bit square matrix located in the square matrix row 0 and a square matrix column 1, and bit data at positions 768 to 1023 in the encoded bit sequence is placed in a fourth bit square matrix located in the square matrix row 1 and the square matrix column 1. In this manner, bit square matrices in the square matrix row 0 and the square matrix row 1 are fully filled, then bit square matrices in a square matrix row 2 and a square matrix row 3 are fully filled in the same manner, and so on. Filling is performed by using every two square matrix rows as a unit, and when the two square matrix rows are filled, filling is performed by square matrix columns. When bit square matrices are filled by square matrix columns, bit rows in the bit square matrices are sequentially filled. According to this method, all bit data in the encoded bit sequence is placed into the matrix, to obtain a bit sequence represented by the matrix, that is, the first matrix. After filling is completed, each bit square matrix in the first matrix includes a plurality of pieces of bit data.

In operation S202, the transmit end device performs, based on a first mapping relationship, position transformation in an orientation of each bit square matrix on the bit data of each bit square matrix in the first matrix, to obtain a second matrix.

Herein, the first mapping relationship indicates a position mapping relationship before and after position transformation of each piece of bit data in the bit square matrix range, and includes a row transformation mapping relationship. The row transformation mapping relationship may indicate a row identifier mapping relationship before and after position transformation of the bit data in the bit square matrix range.

The row transformation mapping relationship is constrained by using a global offset constraint factor and at least two local offset constraint factors. The global offset constraint factor is used to constrain a position offset of row transformation of each piece of bit data in the bit square matrix. The local offset constraint factor is used to constrain position offsets of row transformation of bit data located in some bit rows in the bit square matrix. In a specific implementation, if the bit square matrix in the first matrix has $2^m$ bit rows, there may be m−1 local offset constraint factors. The m−1 local offset constraint factors include a local offset constraint factor for constraining a $2^{(f-1)th}$ bit row to a $2^{mth}$ bit row, and f is an integer greater than 0 and less than m. It should be noted that the m−1 local offset constraint factors herein may include 0, and a quantity of non-0 local offset constraint factors is not less than 2.

For example, if the bit square matrix in the first matrix has 16 bit rows, that is, the bit square matrix is a 16×16 bit square matrix, three local offset constraint factors (which may be respectively denoted by a factor 1, a factor 2, and a factor 3) may be set. The factor 1 may be a local offset constraint factor for constraining a second row to a $16^{th}$ row, the factor 2 may be a local offset constraint factor for constraining a fourth row to the $16^{th}$ row, and the factor 3 may be a local offset constraint factor for constraining an eighth row to the $16^{th}$ row.

When bit data position transformation is performed in the bit square matrix range, for row transformation, bit data in a same row before transformation may be dispersed to different rows after transformation. In addition, in adjacent bit rows after transformation, a column spacing between bit data from a same row before transformation is enabled to be relatively large, so that the bit data from the same row before transformation may be evenly and discretely dispersed in the bit square matrix after transformation. Bit data in a same row before transformation needs to correspond to a specific column offset when being transformed to another row, and when a plurality of pieces of bit data in a same row are transformed to different bit rows, corresponding column offsets are also different. A column offset when bit data in a same row before transformation is transformed to another row is constrained in a targeted and diversified manner by using the global offset constraint factor for constraining all rows and the at least two local offset constraint factors for constraining some rows, so that discreteness and evenness of bit data position transformation in the bit square matrix range are improved.

In an embodiment, the row transformation mapping relationship of the bit data in the bit square matrix may be further constrained by using a start offset parameter, and the start offset parameter is used to constrain a start position at which position transformation is performed on the bit data in the bit square matrix based on a position offset. The start offset parameter is set, so that translation transformation may occur on the bit square matrix, to further implement position transformation of the bit data.

Further, optionally, for any first bit data in a bit square matrix whose quantities of rows and columns are both $2^m$ (m is an integer greater than 3), the global offset constraint factor and the local offset constraint factors may constrain a row transformation mapping relationship of the first bit data by using the following formula (1):

$$r_0 = \{c_1 + g \times r_1 + \Sigma_{k=2}^{m}\{\beta_{k-2} \times \lfloor r_1/(2^{(k-1)}) \rfloor\} + \alpha\} \% (2^m) \quad \text{Formula (1)}$$

Herein, $r_0$ is a row identifier corresponding to the first bit data in the bit square matrix before position transformation in the bit square matrix range; $r_1$ is a row identifier corresponding to the first bit data after position transformation in the bit square matrix range; $c_1$ is a column identifier corresponding to the first bit data after position transformation in the bit square matrix range; g is the global offset constraint factor, β is the local offset constraint factor, α is the start offset parameter, and g, β, and α are all preset integers; and k is an index identifier of β, a value of g is determined based on $2^p$, and p is an integer greater than 1. It should be noted that the formula (1) is merely a constraint form of the row transformation mapping relationship, and another transformed formula corresponding to the formula should also fall within the protection scope of this application. For example, the formula (1) may be transformed into $r_0 = \{c_1 + g \times r_1 + \Sigma_{k=2}^{m}\{\beta_{k-2} \times \lfloor r_1/(2^{(k-1)}) \rfloor\} + \alpha + v \times 2^m\} \% (2^m)$. For another example, the formula (1) may be transformed into $r_0 = \{c_1 - g \times r_1 - \Sigma_{k=2}^{m}\{\beta_{k-2} \times \lfloor r_1/(2^{(k-1)}) \rfloor\} + \alpha\} \% (2^m)$, or the like.

In an embodiment, when m is 4, g may be any one of {−8, −4, 4}, and $β_2$ may be any one of {−7, −5, −3, −1, 1, 3, 5, 7}. When g=−8, values of $β_0$ and $β_1$ may be any combination in Table 1:

TABLE 1

| $β_0$ | −6 | −6 | −4 | −4 | −4 | −4 | −2 | −2 | 2 | 2 | 4 | 4 | 4 | 4 | 6 | 6 |
|---|---|---|---|---|---|---|---|---|---|---|---|---|---|---|---|---|
| $β_1$ | −8 | 0 | −6 | −2 | 2 | 6 | −8 | 0 | −8 | 0 | −6 | −2 | 2 | 6 | −8 | 0 |

When g=−4 or g=4, the values of $β_0$ and $β_1$ may be any combination in Table 2:

TABLE 2

| $β_0$ | −6 | −2 | 0 | 0 | 0 | 0 | 2 | 6 |
|---|---|---|---|---|---|---|---|---|
| $β_1$ | 4 | −4 | −6 | −2 | 2 | 6 | 4 | −4 |

In an embodiment, the first mapping relationship further includes a column transformation mapping relationship. The column transformation mapping relationship may indicate a column identifier mapping relationship before and after position transformation of the bit data in the bit square matrix range. In an embodiment, for any first bit data in a bit square matrix whose quantities of rows and columns are both $2^m$ (m is an integer greater than 3), a column transformation mapping relationship of the first bit data may be constrained by using the following formula (2):

$$c_0 = \{c_1 + h \times r_1 + \Sigma_{w=2}^{m} \{\gamma_{w-2} \times \lfloor r_1/(2^{(w-1)}) \rfloor\} + \theta\} \% (2^m) \quad \text{Formula (2)}$$

Herein, $c_0$ is a column identifier corresponding to the first bit data before position transformation in the bit square matrix range; $r_1$ is the row identifier corresponding to the first bit data after position transformation in the bit square matrix range; $c_1$ is the column identifier corresponding to the first bit data after position transformation in the bit square matrix range; and h, γ, and θ are all preset integers, and w is an index identifier of γ. It should be noted that the formula (2) is merely a constraint form of the column transformation mapping relationship, and another transformed formula corresponding to the formula should also fall within the protection scope of this application. For example, the formula (2) may be transformed into:

$$c_0 = \{c_1 + h \times r_1 + \Sigma_{w=2}^{m} \{\gamma_{w-2} \times \lfloor r_1/(2^{(w-1)}) \rfloor\} + \theta + v \times 2^m\} \% (2^m).$$

Herein, v is an integer. For another example, the formula (2) may be transformed into:

$$c_0 = \{c_1 - h \times r_1 - \Sigma_{w=2}^{m} \{\gamma_{w-2} \times \lfloor r_1/(2^{(w-1)}) \rfloor\} - \theta - v \times 2^m\} \% (2^m).$$

When bit data position transformation is performed in the bit square matrix range, for column transformation, bit data in a same column before transformation may be dispersed to different columns after transformation. In addition, in adjacent bit columns after transformation, a column spacing between bit data from a same column before transformation is enabled to be relatively large, so that the bit data from the same column before transformation may be evenly and discretely dispersed in the bit square matrix after transformation. Bit data in a same column before transformation needs to correspond to a specific column offset when being transformed to another column, and when a plurality of pieces of bit data in a same column are transformed to different bit columns, corresponding column offsets are also different. A column offset when bit data in a same column before transformation is transformed to another column is constrained in a targeted and diversified manner by using the formula (2), so that discreteness and evenness of bit data position transformation in the bit square matrix range are improved.

In an embodiment, the first matrix is divided into bit square matrices including 16 bit rows and 16 bit columns. In the formula (1), a value of g is set to −4, a value of $\beta_0$ is set to 0, a value of $\beta_1$ is set to −2, a value of $\beta_2$ is set to 3, and a value of α is set to 0, to obtain a formula (3):

$$r_0 = \{c_1 - 4r_1 - 2\lfloor r_1/4 \rfloor + 3\lfloor r_1/8 \rfloor\} \% 16 \quad \text{Formula (3)}$$

In the formula (2), a value of h is set to −2, a value of $\gamma_0$ is set to 0, a value of $\gamma_1$ is set to 7, a value of $\gamma_2$ is set to −7, and a value of θ is set to 0, to obtain a formula (4):

$$c_0 = \{c_1 - 2r_1 + 7\lfloor r_1/4 \rfloor - 7\lfloor r_1/8 \rfloor\} \% 16 \quad \text{Formula (4)}$$

In the formula (3) and the formula (4), $r_1$ is a row identifier corresponding to the bit data after position transformation in the bit square matrix range; $c_1$ is a column identifier corresponding to the bit data after position transformation in the bit square matrix range; $r_0$ is a row identifier corresponding to the bit data before position transformation in the bit square matrix range; and $c_0$ is a column identifier corresponding to the bit data before position transformation in the bit square matrix range. A first mapping relationship may be determined by using the formula (3) and the formula (4). The formula (3) constrains a row transformation mapping relationship of the bit square matrix, and the formula (4) constrains a column transformation mapping relationship of the bit square matrix. The first mapping relationship corresponding to the formula (3) and the formula (4) may be represented by a first mapping table of 16 rows×16 columns, and the first mapping table is represented by Table 3:

TABLE 3

| | | | | | | | |
|---|---|---|---|---|---|---|---|
| (0, 0) | (1, 1) | (2, 2) | (3, 3) | (4, 4) | (5, 5) | (6, 6) | (7, 7) |
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |

TABLE 3-continued

| | | | | | | | |
|---|---|---|---|---|---|---|---|
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) |

Table 3 has 16 rows (which are respectively denoted by a row 0 to a row 15 from left to right) and 16 columns (which are respectively denoted by a column 0 to a column 15 from top to bottom), including 256 table cells, and there is corresponding mapping position data in each table cell. For any first table cell in Table 3, mapping position data included in the first table cell is represented by (s, t), where s and t are both integers greater than or equal to 0 and less than 16, and (s, t) indicates a position that is of bit data stored in the first table cell and that is before position transformation in the bit square matrix range. For example, mapping position data included in a table cell at a position of a row 2 and a column 5 in Table 3 is (13, 1), indicating that in a position transformation process in the bit square matrix range, bit data in a row 13 and a column 1 is transformed to the position of the row 2 and the column 5 in the bit square matrix.

In another embodiment, the first matrix is divided into bit square matrices including 32 bit rows and 32 bit columns. In the formula (1), a value of g is set to −4, a value of $\beta_0$ is set to 0, a value of $\beta_1$ is set to 14, a value of $\beta_2$ is set to −12, a value of $\beta_3$ is set to −1, and a value of $\alpha$ is set to 0, to obtain a formula (5):

$$r_0=\{c_1-4r_1+14\lfloor r_1/4\rfloor-12\lfloor r_1/8\rfloor-\lfloor r_1/16\rfloor\}\%32 \qquad \text{Formula (5)}$$

In the formula (2), a value of h is set to −2, a value of $\gamma_0$ is set to 0, a value of $\gamma_1$ is set to 7, a value of $\gamma_2$ is set to −7, a value of $\gamma_3$ is set to 0, and a value of 0 is set to 0, to obtain a formula (6):

$$c_0=\{c_1-2r_1+7\lfloor r_1/4\rfloor-7\lfloor r_1/8\rfloor\}\%32 \qquad \text{Formula (6)}$$

In the formula (5) and the formula (6), $r_1$ is a row identifier corresponding to the bit data after position transformation in the bit square matrix range; $c_1$ is a column identifier corresponding to the bit data after position transformation in the bit square matrix range; $r_0$ is a row identifier corresponding to the bit data before position transformation in the bit square matrix range; and $c_0$ is a column identifier corresponding to the bit data before position transformation in the bit square matrix range. A first mapping relationship may be determined by using the formula (5) and the formula (6). The formula (5) constrains a row transformation mapping relationship of the bit square matrix, and the formula (6) constrains a column transformation mapping relationship of the bit square matrix. The first mapping relationship corresponding to the formula (5) and the formula (6) may be represented by a second mapping table of 32 rows×32 columns. A first column to a 16$^{th}$ column of the second mapping table may be represented by Table 4, and a 17$^{th}$ column to a 32$^{nd}$ column of the second mapping table may be represented by Table 5 (Table 4 and Table 5 are shown below).

It should be noted that, merely to clearly show the second mapping table constrained by using the formula (5) and the formula (6) herein, the second mapping table is shown by using the foregoing two tables: Table 4 and Table 5. In actual use, for example, the mapping table is an entire table when being stored in the transmit end device, and data in Table 5 is arranged adjacent to and on a right side of data in Table 4, forming the second mapping table of 32 rows × 32 columns.

In a further embodiment, the first matrix is divided into bit square matrices including 64 bit rows and 64 bit columns. In the formula (1), a value of g is set to −4, a value of $\beta_0$ is set to 0, a value of $\beta_1$ is set to 14, a value of $\beta_2$ is set to −12, a value of $\beta_3$ is set to 0, a value of $\beta_4$ is set to −1, and a value of $\alpha$ is set to 0, to obtain a formula (7):

$$r_0=\{c_1-4r_1+14\lfloor r_1/4\rfloor-12\lfloor r_1/8\rfloor-\lfloor r_1/32\rfloor\}\%64 \qquad \text{Formula (7)}$$

In the formula (2), a value of h is set to −2, a value of $\gamma_0$ is set to 0, a value of $\gamma_1$ is set to 7, a value of $\gamma_2$ is set to −7, a value of $\gamma_3$ is set to 0, a value of $\gamma_4$ is set to 0, and a value of $\theta$ is set to 0, to obtain a formula (8):

$$c_0=\{c_1-2r_1+7\lfloor r_1/4\rfloor-7\lfloor r_1/8\rfloor\}\%64 \qquad \text{Formula (8)}$$

In the formula (7) and the formula (8), $r_1$ is a row identifier corresponding to the bit data after position transformation in the bit square matrix range; $c_1$ is a column identifier corresponding to the bit data after position transformation in the bit square matrix range; $r_0$ is a row identifier corresponding to the bit data before position transformation in the bit square matrix range; and $c_0$ is a column identifier corresponding to the bit data before position transformation in the bit square matrix range. A first mapping relationship may be determined by using the formula (7) and the formula (8). The formula (7) constrains a row transformation mapping relationship of the bit square matrix, and the formula (8) constrains a column transformation mapping relationship of the bit square matrix. The first mapping relationship corresponding to the formula (7) and the formula (8) may be represented by a third mapping table of 64 rows×64 columns. A first column to a 16$^{th}$ column of the third mapping table may be represented by Table 6, a 17$^{th}$ column to a 32$^{nd}$ column of the third mapping table may be represented by Table 7, a 33$^{rd}$ column to a 48$^{th}$ column of the third mapping table may be represented by Table 8, and a 49$^{th}$ column to a 64$^{th}$ column of the third mapping table may be represented by Table 9. Table 4 to Table 9 are shown below.

TABLE 4

| | | | | | | | |
|---|---|---|---|---|---|---|---|
| (0, 0) | (1, 1) | (2, 2) | (3, 3) | (4, 4) | (5, 5) | (6, 6) | (7, 7) |
| (28, 30) | (29, 31) | (30, 0) | (31, 1) | (0, 2) | (1, 3) | (2, 4) | (3, 5) |
| (24, 28) | (25, 29) | (26, 30) | (27, 31) | (28, 0) | (29, 1) | (30, 2) | (31, 3) |
| (20, 26) | (21, 27) | (22, 28) | (23, 29) | (24, 30) | (25, 31) | (26, 0) | (27, 1) |
| (30, 31) | (31, 0) | (0, 1) | (1, 2) | (2, 3) | (3, 4) | (4, 5) | (5, 6) |
| (26, 29) | (27, 30) | (28, 31) | (29, 0) | (30, 1) | (31, 2) | (0, 3) | (1, 4) |
| (22, 27) | (23, 28) | (24, 29) | (25, 30) | (26, 31) | (27, 0) | (28, 1) | (29, 2) |
| (18, 25) | (19, 26) | (20, 27) | (21, 28) | (22, 29) | (23, 30) | (24, 31) | (25, 0) |
| (16, 23) | (17, 24) | (18, 25) | (19, 26) | (20, 27) | (21, 28) | (22, 29) | (23, 30) |
| (12, 21) | (13, 22) | (14, 23) | (15, 24) | (16, 25) | (17, 26) | (18, 27) | (19, 28) |

TABLE 4-continued

| | | | | | | |
|---|---|---|---|---|---|---|
| (8, 19) | (9, 20) | (10, 21) | (11, 22) | (12, 23) | (13, 24) | (14, 25) | (15, 26) |
| (4, 17) | (5, 18) | (6, 19) | (7, 20) | (8, 21) | (9, 22) | (10, 23) | (11, 24) |
| (14, 22) | (15, 23) | (16, 24) | (17, 25) | (18, 26) | (19, 27) | (20, 28) | (21, 29) |
| (10, 20) | (11, 21) | (12, 22) | (13, 23) | (14, 24) | (15, 25) | (16, 26) | (17, 27) |
| (6, 18) | (7, 19) | (8, 20) | (9, 21) | (10, 22) | (11, 23) | (12, 24) | (13, 25) |
| (2, 16) | (3, 17) | (4, 18) | (5, 19) | (6, 20) | (7, 21) | (8, 22) | (9, 23) |
| (31, 14) | (0, 15) | (1, 16) | (2, 17) | (3, 18) | (4, 19) | (5, 20) | (6, 21) |
| (27, 12) | (28, 13) | (29, 14) | (30, 15) | (31, 16) | (0, 17) | (1, 18) | (2, 19) |
| (23, 10) | (24, 11) | (25, 12) | (26, 13) | (27, 14) | (28, 15) | (29, 16) | (30, 17) |
| (19, 8) | (20, 9) | (21, 10) | (22, 11) | (23, 12) | (24, 13) | (25, 14) | (26, 15) |
| (29, 13) | (30, 14) | (31, 15) | (0, 16) | (1, 17) | (2, 18) | (3, 19) | (4, 20) |
| (25, 11) | (26, 12) | (27, 13) | (28, 14) | (29, 15) | (30, 16) | (31, 17) | (0, 18) |
| (21, 9) | (22, 10) | (23, 11) | (24, 12) | (25, 13) | (26, 14) | (27, 15) | (28, 16) |
| (17, 7) | (18, 8) | (19, 9) | (20, 10) | (21, 11) | (22, 12) | (23, 13) | (24, 14) |
| (15, 5) | (16, 6) | (17, 7) | (18, 8) | (19, 9) | (20, 10) | (21, 11) | (22, 12) |
| (11, 3) | (12, 4) | (13, 5) | (14, 6) | (15, 7) | (16, 8) | (17, 9) | (18, 10) |
| (7, 1) | (8, 2) | (9, 3) | (10, 4) | (11, 5) | (12, 6) | (13, 7) | (14, 8) |
| (3, 31) | (4, 0) | (5, 1) | (6, 2) | (7, 3) | (8, 4) | (9, 5) | (10, 6) |
| (13, 4) | (14, 5) | (15, 6) | (16, 7) | (17, 8) | (18, 9) | (19, 10) | (20, 11) |
| (9, 2) | (10, 3) | (11, 4) | (12, 5) | (13, 6) | (14, 7) | (15, 8) | (16, 9) |
| (5, 0) | (6, 1) | (7, 2) | (8, 3) | (9, 4) | (10, 5) | (11, 6) | (12, 7) |
| (1, 30) | (2, 31) | (3, 0) | (4, 1) | (5, 2) | (6, 3) | (7, 4) | (8, 5) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (28, 2) | (29, 3) | (30, 4) | (31, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (30, 3) | (31, 4) | (0, 5) | (1, 6) | (2, 7) | (3, 8) | (4, 9) | (5, 10) |
| (26, 1) | (27, 2) | (28, 3) | (29, 4) | (30, 5) | (31, 6) | (0, 7) | (1, 8) |
| (24, 31) | (25, 0) | (26, 1) | (27, 2) | (28, 3) | (29, 4) | (30, 5) | (31, 6) |
| (20, 29) | (21, 30) | (22, 31) | (23, 0) | (24, 1) | (25, 2) | (26, 3) | (27, 4) |
| (16, 27) | (17, 28) | (18, 29) | (19, 30) | (20, 31) | (21, 0) | (22, 1) | (23, 2) |
| (12, 25) | (13, 26) | (14, 27) | (15, 28) | (16, 29) | (17, 30) | (18, 31) | (19, 0) |
| (22, 30) | (23, 31) | (24, 0) | (25, 1) | (26, 2) | (27, 3) | (28, 4) | (29, 5) |
| (18, 28) | (19, 29) | (20, 30) | (21, 31) | (22, 0) | (23, 1) | (24, 2) | (25, 3) |
| (14, 26) | (15, 27) | (16, 28) | (17, 29) | (18, 30) | (19, 31) | (20, 0) | (21, 1) |
| (10, 24) | (11, 25) | (12, 26) | (13, 27) | (14, 28) | (15, 29) | (16, 30) | (17, 31) |
| (7, 22) | (8, 23) | (9, 24) | (10, 25) | (11, 26) | (12, 27) | (13, 28) | (14, 29) |
| (3, 20) | (4, 21) | (5, 22) | (6, 23) | (7, 24) | (8, 25) | (9, 26) | (10, 27) |
| (31, 18) | (0, 19) | (1, 20) | (2, 21) | (3, 22) | (4, 23) | (5, 24) | (6, 25) |
| (27, 16) | (28, 17) | (29, 18) | (30, 19) | (31, 20) | (0, 21) | (1, 22) | (2, 23) |
| (5, 21) | (6, 22) | (7, 23) | (8, 24) | (9, 25) | (10, 26) | (11, 27) | (12, 28) |
| (1, 19) | (2, 20) | (3, 21) | (4, 22) | (5, 23) | (6, 24) | (7, 25) | (8, 26) |
| (29, 17) | (30, 18) | (31, 19) | (0, 20) | (1, 21) | (2, 22) | (3, 23) | (4, 24) |
| (25, 15) | (26, 16) | (27, 17) | (28, 18) | (29, 19) | (30, 20) | (31, 21) | (0, 22) |
| (23, 13) | (24, 14) | (25, 15) | (26, 16) | (27, 17) | (28, 18) | (29, 19) | (30, 20) |
| (19, 11) | (20, 12) | (21, 13) | (22, 14) | (23, 15) | (24, 16) | (25, 17) | (26, 18) |
| (15, 9) | (16, 10) | (17, 11) | (18, 12) | (19, 13) | (20, 14) | (21, 15) | (22, 16) |
| (11, 7) | (12, 8) | (13, 9) | (14, 10) | (15, 11) | (16, 12) | (17, 13) | (18, 14) |
| (21, 12) | (22, 13) | (23, 14) | (24, 15) | (25, 16) | (26, 17) | (27, 18) | (28, 19) |
| (17, 10) | (18, 11) | (19, 12) | (20, 13) | (21, 14) | (22, 15) | (23, 16) | (24, 17) |
| (13, 8) | (14, 9) | (15, 10) | (16, 11) | (17, 12) | (18, 13) | (19, 14) | (20, 15) |
| (9, 6) | (10, 7) | (11, 8) | (12, 9) | (13, 10) | (14, 11) | (15, 12) | (16, 13) |

TABLE 5

| | | | | | | |
|---|---|---|---|---|---|---|
| (16, 16) | (17, 17) | (18, 18) | (19, 19) | (20, 20) | (21, 21) | (22, 22) | (23, 23) |
| (12, 14) | (13, 15) | (14, 16) | (15, 17) | (16, 18) | (17, 19) | (18, 20) | (19, 21) |
| (8, 12) | (9, 13) | (10, 14) | (11, 15) | (12, 16) | (13, 17) | (14, 18) | (15, 19) |
| (4, 10) | (5, 11) | (6, 12) | (7, 13) | (8, 14) | (9, 15) | (10, 16) | (11, 17) |
| (14, 15) | (15, 16) | (16, 17) | (17, 18) | (18, 19) | (19, 20) | (20, 21) | (21, 22) |
| (10, 13) | (11, 14) | (12, 15) | (13, 16) | (14, 17) | (15, 18) | (16, 19) | (17, 20) |
| (6, 11) | (7, 12) | (8, 13) | (9, 14) | (10, 15) | (11, 16) | (12, 17) | (13, 18) |
| (2, 9) | (3, 10) | (4, 11) | (5, 12) | (6, 13) | (7, 14) | (8, 15) | (9, 16) |
| (0, 7) | (1, 8) | (2, 9) | (3, 10) | (4, 11) | (5, 12) | (6, 13) | (7, 14) |
| (28, 5) | (29, 6) | (30, 7) | (31, 8) | (0, 9) | (1, 10) | (2, 11) | (3, 12) |
| (24, 3) | (25, 4) | (26, 5) | (27, 6) | (28, 7) | (29, 8) | (30, 9) | (31, 10) |
| (20, 1) | (21, 2) | (22, 3) | (23, 4) | (24, 5) | (25, 6) | (26, 7) | (27, 8) |
| (30, 6) | (31, 7) | (0, 8) | (1, 9) | (2, 10) | (3, 11) | (4, 12) | (5, 13) |
| (26, 4) | (27, 5) | (28, 6) | (29, 7) | (30, 8) | (31, 9) | (0, 10) | (1, 11) |
| (22, 2) | (23, 3) | (24, 4) | (25, 5) | (26, 6) | (27, 7) | (28, 8) | (29, 9) |
| (18, 0) | (19, 1) | (20, 2) | (21, 3) | (22, 4) | (23, 5) | (24, 6) | (25, 7) |
| (15, 30) | (16, 31) | (17, 0) | (18, 1) | (19, 2) | (20, 3) | (21, 4) | (22, 5) |
| (11, 28) | (12, 29) | (13, 30) | (14, 31) | (15, 0) | (16, 1) | (17, 2) | (18, 3) |
| (7, 26) | (8, 27) | (9, 28) | (10, 29) | (11, 30) | (12, 31) | (13, 0) | (14, 1) |

TABLE 5-continued

| | | | | | | |
|---|---|---|---|---|---|---|
| (3, 24) | (4, 25) | (5, 26) | (6, 27) | (7, 28) | (8, 29) | (9, 30) | (10, 31) |
| (13, 29) | (14, 30) | (15, 31) | (16, 0) | (17, 1) | (18, 2) | (19, 3) | (20, 4) |
| (9, 27) | (10, 28) | (11, 29) | (12, 30) | (13, 31) | (14, 0) | (15, 1) | (16, 2) |
| (5, 25) | (6, 26) | (7, 27) | (8, 28) | (9, 29) | (10, 30) | (11, 31) | (12, 0) |
| (1, 23) | (2, 24) | (3, 25) | (4, 26) | (5, 27) | (6, 28) | (7, 29) | (8, 30) |
| (31, 21) | (0, 22) | (1, 23) | (2, 24) | (3, 25) | (4, 26) | (5, 27) | (6, 28) |
| (27, 19) | (28, 20) | (29, 21) | (30, 22) | (31, 23) | (0, 24) | (1, 25) | (2, 26) |
| (23, 17) | (24, 18) | (25, 19) | (26, 20) | (27, 21) | (28, 22) | (29, 23) | (30, 24) |
| (19, 15) | (20, 16) | (21, 17) | (22, 18) | (23, 19) | (24, 20) | (25, 21) | (26, 22) |
| (29, 20) | (30, 21) | (31, 22) | (0, 23) | (1, 24) | (2, 25) | (3, 26) | (4, 27) |
| (25, 18) | (26, 19) | (27, 20) | (28, 21) | (29, 22) | (30, 23) | (31, 24) | (0, 25) |
| (21, 16) | (22, 17) | (23, 18) | (24, 19) | (25, 20) | (26, 21) | (27, 22) | (28, 23) |
| (17, 14) | (18, 15) | (19, 16) | (20, 17) | (21, 18) | (22, 19) | (23, 20) | (24, 21) |
| (24, 24) | (25, 25) | (26, 26) | (27, 27) | (28, 28) | (29, 29) | (30, 30) | (31, 31) |
| (20, 22) | (21, 23) | (22, 24) | (23, 25) | (24, 26) | (25, 27) | (26, 28) | (27, 29) |
| (16, 20) | (17, 21) | (18, 22) | (19, 23) | (20, 24) | (21, 25) | (22, 26) | (23, 27) |
| (12, 18) | (13, 19) | (14, 20) | (15, 21) | (16, 22) | (17, 23) | (18, 24) | (19, 25) |
| (22, 23) | (23, 24) | (24, 25) | (25, 26) | (26, 27) | (27, 28) | (28, 29) | (29, 30) |
| (18, 21) | (19, 22) | (20, 23) | (21, 24) | (22, 25) | (23, 26) | (24, 27) | (25, 28) |
| (14, 19) | (15, 20) | (16, 21) | (17, 22) | (18, 23) | (19, 24) | (20, 25) | (21, 26) |
| (10, 17) | (11, 18) | (12, 19) | (13, 20) | (14, 21) | (15, 22) | (16, 23) | (17, 24) |
| (8, 15) | (9, 16) | (10, 17) | (11, 18) | (12, 19) | (13, 20) | (14, 21) | (15, 22) |
| (4, 13) | (5, 14) | (6, 15) | (7, 16) | (8, 17) | (9, 18) | (10, 19) | (11, 20) |
| (0, 11) | (1, 12) | (2, 13) | (3, 14) | (4, 15) | (5, 16) | (6, 17) | (7, 18) |
| (28, 9) | (29, 10) | (30, 11) | (31, 12) | (0, 13) | (1, 14) | (2, 15) | (3, 16) |
| (6, 14) | (7, 15) | (8, 16) | (9, 17) | (10, 18) | (11, 19) | (12, 20) | (13, 21) |
| (2, 12) | (3, 13) | (4, 14) | (5, 15) | (6, 16) | (7, 17) | (8, 18) | (9, 19) |
| (30, 10) | (31, 11) | (0, 12) | (1, 13) | (2, 14) | (3, 15) | (4, 16) | (5, 17) |
| (26, 8) | (27, 9) | (28, 10) | (29, 11) | (30, 12) | (31, 13) | (0, 14) | (1, 15) |
| (23, 6) | (24, 7) | (25, 8) | (26, 9) | (27, 10) | (28, 11) | (29, 12) | (30, 13) |
| (19, 4) | (20, 5) | (21, 6) | (22, 7) | (23, 8) | (24, 9) | (25, 10) | (26, 11) |
| (15, 2) | (16, 3) | (17, 4) | (18, 5) | (19, 6) | (20, 7) | (21, 8) | (22, 9) |
| (11, 0) | (12, 1) | (13, 2) | (14, 3) | (15, 4) | (16, 5) | (17, 6) | (18, 7) |
| (21, 5) | (22, 6) | (23, 7) | (24, 8) | (25, 9) | (26, 10) | (27, 11) | (28, 12) |
| (17, 3) | (18, 4) | (19, 5) | (20, 6) | (21, 7) | (22, 8) | (23, 9) | (24, 10) |
| (13, 1) | (14, 2) | (15, 3) | (16, 4) | (17, 5) | (18, 6) | (19, 7) | (20, 8) |
| (9, 31) | (10, 0) | (11, 1) | (12, 2) | (13, 3) | (14, 4) | (15, 5) | (16, 6) |
| (7, 29) | (8, 30) | (9, 31) | (10, 0) | (11, 1) | (12, 2) | (13, 3) | (14, 4) |
| (3, 27) | (4, 28) | (5, 29) | (6, 30) | (7, 31) | (8, 0) | (9, 1) | (10, 2) |
| (31, 25) | (0, 26) | (1, 27) | (2, 28) | (3, 29) | (4, 30) | (5, 31) | (6, 0) |
| (27, 23) | (28, 24) | (29, 25) | (30, 26) | (31, 27) | (0, 28) | (1, 29) | (2, 30) |
| (5, 28) | (6, 29) | (7, 30) | (8, 31) | (9, 0) | (10, 1) | (11, 2) | (12, 3) |
| (1, 26) | (2, 27) | (3, 28) | (4, 29) | (5, 30) | (6, 31) | (7, 0) | (8, 1) |
| (29, 24) | (30, 25) | (31, 26) | (0, 27) | (1, 28) | (2, 29) | (3, 30) | (4, 31) |
| (25, 22) | (26, 23) | (27, 24) | (28, 25) | (29, 26) | (30, 27) | (31, 28) | (0, 29) |

TABLE 6

| | | | | | | |
|---|---|---|---|---|---|---|
| (0, 0) | (1, 1) | (2, 2) | (3, 3) | (4, 4) | (5, 5) | (6, 6) | (7, 7) |
| (60, 62) | (61, 63) | (62, 0) | (63, 1) | (0, 2) | (1, 3) | (2, 4) | (3, 5) |
| (56, 60) | (57, 61) | (58, 62) | (59, 63) | (60, 0) | (61, 1) | (62, 2) | (63, 3) |
| (52, 58) | (53, 59) | (54, 60) | (55, 61) | (56, 62) | (57, 63) | (58, 0) | (59, 1) |
| (62, 63) | (63, 0) | (0, 1) | (1, 2) | (2, 3) | (3, 4) | (4, 5) | (5, 6) |
| (58, 61) | (59, 62) | (60, 63) | (61, 0) | (62, 1) | (63, 2) | (0, 3) | (1, 4) |
| (54, 59) | (55, 60) | (56, 61) | (57, 62) | (58, 63) | (59, 0) | (60, 1) | (61, 2) |
| (50, 57) | (51, 58) | (52, 59) | (53, 60) | (54, 61) | (55, 62) | (56, 63) | (57, 0) |
| (48, 55) | (49, 56) | (50, 57) | (51, 58) | (52, 59) | (53, 60) | (54, 61) | (55, 62) |
| (44, 53) | (45, 54) | (46, 55) | (47, 56) | (48, 57) | (49, 58) | (50, 59) | (51, 60) |
| (40, 51) | (41, 52) | (42, 53) | (43, 54) | (44, 55) | (45, 56) | (46, 57) | (47, 58) |
| (36, 49) | (37, 50) | (38, 51) | (39, 52) | (40, 53) | (41, 54) | (42, 55) | (43, 56) |
| (46, 54) | (47, 55) | (48, 56) | (49, 57) | (50, 58) | (51, 59) | (52, 60) | (53, 61) |
| (42, 52) | (43, 53) | (44, 54) | (45, 55) | (46, 56) | (47, 57) | (48, 58) | (49, 59) |
| (38, 50) | (39, 51) | (40, 52) | (41, 53) | (42, 54) | (43, 55) | (44, 56) | (45, 57) |
| (34, 48) | (35, 49) | (36, 50) | (37, 51) | (38, 52) | (39, 53) | (40, 54) | (41, 55) |
| (32, 46) | (33, 47) | (34, 48) | (35, 49) | (36, 50) | (37, 51) | (38, 52) | (39, 53) |
| (28, 44) | (29, 45) | (30, 46) | (31, 47) | (32, 48) | (33, 49) | (34, 50) | (35, 51) |
| (24, 42) | (25, 43) | (26, 44) | (27, 45) | (28, 46) | (29, 47) | (30, 48) | (31, 49) |
| (20, 40) | (21, 41) | (22, 42) | (23, 43) | (24, 44) | (25, 45) | (26, 46) | (27, 47) |
| (30, 45) | (31, 46) | (32, 47) | (33, 48) | (34, 49) | (35, 50) | (36, 51) | (37, 52) |
| (26, 43) | (27, 44) | (28, 45) | (29, 46) | (30, 47) | (31, 48) | (32, 49) | (33, 50) |
| (22, 41) | (23, 42) | (24, 43) | (25, 44) | (26, 45) | (27, 46) | (28, 47) | (29, 48) |
| (18, 39) | (19, 40) | (20, 41) | (21, 42) | (22, 43) | (23, 44) | (24, 45) | (25, 46) |
| (16, 37) | (17, 38) | (18, 39) | (19, 40) | (20, 41) | (21, 42) | (22, 43) | (23, 44) |
| (12, 35) | (13, 36) | (14, 37) | (15, 38) | (16, 39) | (17, 40) | (18, 41) | (19, 42) |
| (8, 33) | (9, 34) | (10, 35) | (11, 36) | (12, 37) | (13, 38) | (14, 39) | (15, 40) |
| (4, 31) | (5, 32) | (6, 33) | (7, 34) | (8, 35) | (9, 36) | (10, 37) | (11, 38) |

TABLE 6-continued

| | | | | | | |
|---|---|---|---|---|---|---|
| (14, 36) | (15, 37) | (16, 38) | (17, 39) | (18, 40) | (19, 41) | (20, 42) | (21, 43) |
| (10, 34) | (11, 35) | (12, 36) | (13, 37) | (14, 38) | (15, 39) | (16, 40) | (17, 41) |
| (6, 32) | (7, 33) | (8, 34) | (9, 35) | (10, 36) | (11, 37) | (12, 38) | (13, 39) |
| (2, 30) | (3, 31) | (4, 32) | (5, 33) | (6, 34) | (7, 35) | (8, 36) | (9, 37) |
| (63, 28) | (0, 29) | (1, 30) | (2, 31) | (3, 32) | (4, 33) | (5, 34) | (6, 35) |
| (59, 26) | (60, 27) | (61, 28) | (62, 29) | (63, 30) | (0, 31) | (1, 32) | (2, 33) |
| (55, 24) | (56, 25) | (57, 26) | (58, 27) | (59, 28) | (60, 29) | (61, 30) | (62, 31) |
| (51, 22) | (52, 23) | (53, 24) | (54, 25) | (55, 26) | (56, 27) | (57, 28) | (58, 29) |
| (61, 27) | (62, 28) | (63, 29) | (0, 30) | (1, 31) | (2, 32) | (3, 33) | (4, 34) |
| (57, 25) | (58, 26) | (59, 27) | (60, 28) | (61, 29) | (62, 30) | (63, 31) | (0, 32) |
| (53, 23) | (54, 24) | (55, 25) | (56, 26) | (57, 27) | (58, 28) | (59, 29) | (60, 30) |
| (49, 21) | (50, 22) | (51, 23) | (52, 24) | (53, 25) | (54, 26) | (55, 27) | (56, 28) |
| (47, 19) | (48, 20) | (49, 21) | (50, 22) | (51, 23) | (52, 24) | (53, 25) | (54, 26) |
| (43, 17) | (44, 18) | (45, 19) | (46, 20) | (47, 21) | (48, 22) | (49, 23) | (50, 24) |
| (39, 15) | (40, 16) | (41, 17) | (42, 18) | (43, 19) | (44, 20) | (45, 21) | (46, 22) |
| (35, 13) | (36, 14) | (37, 15) | (38, 16) | (39, 17) | (40, 18) | (41, 19) | (42, 20) |
| (45, 18) | (46, 19) | (47, 20) | (48, 21) | (49, 22) | (50, 23) | (51, 24) | (52, 25) |
| (41, 16) | (42, 17) | (43, 18) | (44, 19) | (45, 20) | (46, 21) | (47, 22) | (48, 23) |
| (37, 14) | (38, 15) | (39, 16) | (40, 17) | (41, 18) | (42, 19) | (43, 20) | (44, 21) |
| (33, 12) | (34, 13) | (35, 14) | (36, 15) | (37, 16) | (38, 17) | (39, 18) | (40, 19) |
| (31, 10) | (32, 11) | (33, 12) | (34, 13) | (35, 14) | (36, 15) | (37, 16) | (38, 17) |
| (27, 8) | (28, 9) | (29, 10) | (30, 11) | (31, 12) | (32, 13) | (33, 14) | (34, 15) |
| (23, 6) | (24, 7) | (25, 8) | (26, 9) | (27, 10) | (28, 11) | (29, 12) | (30, 13) |
| (19, 4) | (20, 5) | (21, 6) | (22, 7) | (23, 8) | (24, 9) | (25, 10) | (26, 11) |
| (29, 9) | (30, 10) | (31, 11) | (32, 12) | (33, 13) | (34, 14) | (35, 15) | (36, 16) |
| (25, 7) | (26, 8) | (27, 9) | (28, 10) | (29, 11) | (30, 12) | (31, 13) | (32, 14) |
| (21, 5) | (22, 6) | (23, 7) | (24, 8) | (25, 9) | (26, 10) | (27, 11) | (28, 12) |
| (17, 3) | (18, 4) | (19, 5) | (20, 6) | (21, 7) | (22, 8) | (23, 9) | (24, 10) |
| (15, 1) | (16, 2) | (17, 3) | (18, 4) | (19, 5) | (20, 6) | (21, 7) | (22, 8) |
| (11, 63) | (12, 0) | (13, 1) | (14, 2) | (15, 3) | (16, 4) | (17, 5) | (18, 6) |
| (7, 61) | (8, 62) | (9, 63) | (10, 0) | (11, 1) | (12, 2) | (13, 3) | (14, 4) |
| (3, 59) | (4, 60) | (5, 61) | (6, 62) | (7, 63) | (8, 0) | (9, 1) | (10, 2) |
| (13, 0) | (14, 1) | (15, 2) | (16, 3) | (17, 4) | (18, 5) | (19, 6) | (20, 7) |
| (9, 62) | (10, 63) | (11, 0) | (12, 1) | (13, 2) | (14, 3) | (15, 4) | (16, 5) |
| (5, 60) | (6, 61) | (7, 62) | (8, 63) | (9, 0) | (10, 1) | (11, 2) | (12, 3) |
| (1, 58) | (2, 59) | (3, 60) | (4, 61) | (5, 62) | (6, 63) | (7, 0) | (8, 1) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (60, 2) | (61, 3) | (62, 4) | (63, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (62, 3) | (63, 4) | (0, 5) | (1, 6) | (2, 7) | (3, 8) | (4, 9) | (5, 10) |
| (58, 1) | (59, 2) | (60, 3) | (61, 4) | (62, 5) | (63, 6) | (0, 7) | (1, 8) |
| (56, 63) | (57, 0) | (58, 1) | (59, 2) | (60, 3) | (61, 4) | (62, 5) | (63, 6) |
| (52, 61) | (53, 62) | (54, 63) | (55, 0) | (56, 1) | (57, 2) | (58, 3) | (59, 4) |
| (48, 59) | (49, 60) | (50, 61) | (51, 62) | (52, 63) | (53, 0) | (54, 1) | (55, 2) |
| (44, 57) | (45, 58) | (46, 59) | (47, 60) | (48, 61) | (49, 62) | (50, 63) | (51, 0) |
| (54, 62) | (55, 63) | (56, 0) | (57, 1) | (58, 2) | (59, 3) | (60, 4) | (61, 5) |
| (50, 60) | (51, 61) | (52, 62) | (53, 63) | (54, 0) | (55, 1) | (56, 2) | (57, 3) |
| (46, 58) | (47, 59) | (48, 60) | (49, 61) | (50, 62) | (51, 63) | (52, 0) | (53, 1) |
| (42, 56) | (43, 57) | (44, 58) | (45, 59) | (46, 60) | (47, 61) | (48, 62) | (49, 63) |
| (40, 54) | (41, 55) | (42, 56) | (43, 57) | (44, 58) | (45, 59) | (46, 60) | (47, 61) |
| (36, 52) | (37, 53) | (38, 54) | (39, 55) | (40, 56) | (41, 57) | (42, 58) | (43, 59) |
| (32, 50) | (33, 51) | (34, 52) | (35, 53) | (36, 54) | (37, 55) | (38, 56) | (39, 57) |
| (28, 48) | (29, 49) | (30, 50) | (31, 51) | (32, 52) | (33, 53) | (34, 54) | (35, 55) |
| (38, 53) | (39, 54) | (40, 55) | (41, 56) | (42, 57) | (43, 58) | (44, 59) | (45, 60) |
| (34, 51) | (35, 52) | (36, 53) | (37, 54) | (38, 55) | (39, 56) | (40, 57) | (41, 58) |
| (30, 49) | (31, 50) | (32, 51) | (33, 52) | (34, 53) | (35, 54) | (36, 55) | (37, 56) |
| (26, 47) | (27, 48) | (28, 49) | (29, 50) | (30, 51) | (31, 52) | (32, 53) | (33, 54) |
| (24, 45) | (25, 46) | (26, 47) | (27, 48) | (28, 49) | (29, 50) | (30, 51) | (31, 52) |
| (20, 43) | (21, 44) | (22, 45) | (23, 46) | (24, 47) | (25, 48) | (26, 49) | (27, 50) |
| (16, 41) | (17, 42) | (18, 43) | (19, 44) | (20, 45) | (21, 46) | (22, 47) | (23, 48) |
| (12, 39) | (13, 40) | (14, 41) | (15, 42) | (16, 43) | (17, 44) | (18, 45) | (19, 46) |
| (22, 44) | (23, 45) | (24, 46) | (25, 47) | (26, 48) | (27, 49) | (28, 50) | (29, 51) |
| (18, 42) | (19, 43) | (20, 44) | (21, 45) | (22, 46) | (23, 47) | (24, 48) | (25, 49) |
| (14, 40) | (15, 41) | (16, 42) | (17, 43) | (18, 44) | (19, 45) | (20, 46) | (21, 47) |
| (10, 38) | (11, 39) | (12, 40) | (13, 41) | (14, 42) | (15, 43) | (16, 44) | (17, 45) |
| (7, 36) | (8, 37) | (9, 38) | (10, 39) | (11, 40) | (12, 41) | (13, 42) | (14, 43) |
| (3, 34) | (4, 35) | (5, 36) | (6, 37) | (7, 38) | (8, 39) | (9, 40) | (10, 41) |
| (63, 32) | (0, 33) | (1, 34) | (2, 35) | (3, 36) | (4, 37) | (5, 38) | (6, 39) |
| (59, 30) | (60, 31) | (61, 32) | (62, 33) | (63, 34) | (0, 35) | (1, 36) | (2, 37) |
| (5, 35) | (6, 36) | (7, 37) | (8, 38) | (9, 39) | (10, 40) | (11, 41) | (12, 42) |
| (1, 33) | (2, 34) | (3, 35) | (4, 36) | (5, 37) | (6, 38) | (7, 39) | (8, 40) |
| (61, 31) | (62, 32) | (63, 33) | (0, 34) | (1, 35) | (2, 36) | (3, 37) | (4, 38) |
| (57, 29) | (58, 30) | (59, 31) | (60, 32) | (61, 33) | (62, 34) | (63, 35) | (0, 36) |
| (55, 27) | (56, 28) | (57, 29) | (58, 30) | (59, 31) | (60, 32) | (61, 33) | (62, 34) |
| (51, 25) | (52, 26) | (53, 27) | (54, 28) | (55, 29) | (56, 30) | (57, 31) | (58, 32) |
| (47, 23) | (48, 24) | (49, 25) | (50, 26) | (51, 27) | (52, 28) | (53, 29) | (54, 30) |

TABLE 6-continued

| | | | | | | |
|---|---|---|---|---|---|---|
| (43, 21) | (44, 22) | (45, 23) | (46, 24) | (47, 25) | (48, 26) | (49, 27) | (50, 28) |
| (53, 26) | (54, 27) | (55, 28) | (56, 29) | (57, 30) | (58, 31) | (59, 32) | (60, 33) |
| (49, 24) | (50, 25) | (51, 26) | (52, 27) | (53, 28) | (54, 29) | (55, 30) | (56, 31) |
| (45, 22) | (46, 23) | (47, 24) | (48, 25) | (49, 26) | (50, 27) | (51, 28) | (52, 29) |
| (41, 20) | (42, 21) | (43, 22) | (44, 23) | (45, 24) | (46, 25) | (47, 26) | (48, 27) |
| (39, 18) | (40, 19) | (41, 20) | (42, 21) | (43, 22) | (44, 23) | (45, 24) | (46, 25) |
| (35, 16) | (36, 17) | (37, 18) | (38, 19) | (39, 20) | (40, 21) | (41, 22) | (42, 23) |
| (31, 14) | (32, 15) | (33, 16) | (34, 17) | (35, 18) | (36, 19) | (37, 20) | (38, 21) |
| (27, 12) | (28, 13) | (29, 14) | (30, 15) | (31, 16) | (32, 17) | (33, 18) | (34, 19) |
| (37, 17) | (38, 18) | (39, 19) | (40, 20) | (41, 21) | (42, 22) | (43, 23) | (44, 24) |
| (33, 15) | (34, 16) | (35, 17) | (36, 18) | (37, 19) | (38, 20) | (39, 21) | (40, 22) |
| (29, 13) | (30, 14) | (31, 15) | (32, 16) | (33, 17) | (34, 18) | (35, 19) | (36, 20) |
| (25, 11) | (26, 12) | (27, 13) | (28, 14) | (29, 15) | (30, 16) | (31, 17) | (32, 18) |
| (23, 9) | (24, 10) | (25, 11) | (26, 12) | (27, 13) | (28, 14) | (29, 15) | (30, 16) |
| (19, 7) | (20, 8) | (21, 9) | (22, 10) | (23, 11) | (24, 12) | (25, 13) | (26, 14) |
| (15, 5) | (16, 6) | (17, 7) | (18, 8) | (19, 9) | (20, 10) | (21, 11) | (22, 12) |
| (11, 3) | (12, 4) | (13, 5) | (14, 6) | (15, 7) | (16, 8) | (17, 9) | (18, 10) |
| (21, 8) | (22, 9) | (23, 10) | (24, 11) | (25, 12) | (26, 13) | (27, 14) | (28, 15) |
| (17, 6) | (18, 7) | (19, 8) | (20, 9) | (21, 10) | (22, 11) | (23, 12) | (24, 13) |
| (13, 4) | (14, 5) | (15, 6) | (16, 7) | (17, 8) | (18, 9) | (19, 10) | (20, 11) |
| (9, 2) | (10, 3) | (11, 4) | (12, 5) | (13, 6) | (14, 7) | (15, 8) | (16, 9) |

TABLE 7

| | | | | | | |
|---|---|---|---|---|---|---|
| (16, 16) | (17, 17) | (18, 18) | (19, 19) | (20, 20) | (21, 21) | (22, 22) | (23, 23) |
| (12, 14) | (13, 15) | (14, 16) | (15, 17) | (16, 18) | (17, 19) | (18, 20) | (19, 21) |
| (8, 12) | (9, 13) | (10, 14) | (11, 15) | (12, 16) | (13, 17) | (14, 18) | (15, 19) |
| (4, 10) | (5, 11) | (6, 12) | (7, 13) | (8, 14) | (9, 15) | (10, 16) | (11, 17) |
| (14, 15) | (15, 16) | (16, 17) | (17, 18) | (18, 19) | (19, 20) | (20, 21) | (21, 22) |
| (10, 13) | (11, 14) | (12, 15) | (13, 16) | (14, 17) | (15, 18) | (16, 19) | (17, 20) |
| (6, 11) | (7, 12) | (8, 13) | (9, 14) | (10, 15) | (11, 16) | (12, 17) | (13, 18) |
| (2, 9) | (3, 10) | (4, 11) | (5, 12) | (6, 13) | (7, 14) | (8, 15) | (9, 16) |
| (0, 7) | (1, 8) | (2, 9) | (3, 10) | (4, 11) | (5, 12) | (6, 13) | (7, 14) |
| (60, 5) | (61, 6) | (62, 7) | (63, 8) | (0, 9) | (1, 10) | (2, 11) | (3, 12) |
| (56, 3) | (57, 4) | (58, 5) | (59, 6) | (60, 7) | (61, 8) | (62, 9) | (63, 10) |
| (52, 1) | (53, 2) | (54, 3) | (55, 4) | (56, 5) | (57, 6) | (58, 7) | (59, 8) |
| (62, 6) | (63, 7) | (0, 8) | (1, 9) | (2, 10) | (3, 11) | (4, 12) | (5, 13) |
| (58, 4) | (59, 5) | (60, 6) | (61, 7) | (62, 8) | (63, 9) | (0, 10) | (1, 11) |
| (54, 2) | (55, 3) | (56, 4) | (57, 5) | (58, 6) | (59, 7) | (60, 8) | (61, 9) |
| (50, 0) | (51, 1) | (52, 2) | (53, 3) | (54, 4) | (55, 5) | (56, 6) | (57, 7) |
| (48, 62) | (49, 63) | (50, 0) | (51, 1) | (52, 2) | (53, 3) | (54, 4) | (55, 5) |
| (44, 60) | (45, 61) | (46, 62) | (47, 63) | (48, 0) | (49, 1) | (50, 2) | (51, 3) |
| (40, 58) | (41, 59) | (42, 60) | (43, 61) | (44, 62) | (45, 63) | (46, 0) | (47, 1) |
| (36, 56) | (37, 57) | (38, 58) | (39, 59) | (40, 60) | (41, 61) | (42, 62) | (43, 63) |
| (46, 61) | (47, 62) | (48, 63) | (49, 0) | (50, 1) | (51, 2) | (52, 3) | (53, 4) |
| (42, 59) | (43, 60) | (44, 61) | (45, 62) | (46, 63) | (47, 0) | (48, 1) | (49, 2) |
| (38, 57) | (39, 58) | (40, 59) | (41, 60) | (42, 61) | (43, 62) | (44, 63) | (45, 0) |
| (34, 55) | (35, 56) | (36, 57) | (37, 58) | (38, 59) | (39, 60) | (40, 61) | (41, 62) |
| (32, 53) | (33, 54) | (34, 55) | (35, 56) | (36, 57) | (37, 58) | (38, 59) | (39, 60) |
| (28, 51) | (29, 52) | (30, 53) | (31, 54) | (32, 55) | (33, 56) | (34, 57) | (35, 58) |
| (24, 49) | (25, 50) | (26, 51) | (27, 52) | (28, 53) | (29, 54) | (30, 55) | (31, 56) |
| (20, 47) | (21, 48) | (22, 49) | (23, 50) | (24, 51) | (25, 52) | (26, 53) | (27, 54) |
| (30, 52) | (31, 53) | (32, 54) | (33, 55) | (34, 56) | (35, 57) | (36, 58) | (37, 59) |
| (26, 50) | (27, 51) | (28, 52) | (29, 53) | (30, 54) | (31, 55) | (32, 56) | (33, 57) |
| (22, 48) | (23, 49) | (24, 50) | (25, 51) | (26, 52) | (27, 53) | (28, 54) | (29, 55) |
| (18, 46) | (19, 47) | (20, 48) | (21, 49) | (22, 50) | (23, 51) | (24, 52) | (25, 53) |
| (15, 44) | (16, 45) | (17, 46) | (18, 47) | (19, 48) | (20, 49) | (21, 50) | (22, 51) |
| (11, 42) | (12, 43) | (13, 44) | (14, 45) | (15, 46) | (16, 47) | (17, 48) | (18, 49) |
| (7, 40) | (8, 41) | (9, 42) | (10, 43) | (11, 44) | (12, 45) | (13, 46) | (14, 47) |
| (3, 38) | (4, 39) | (5, 40) | (6, 41) | (7, 42) | (8, 43) | (9, 44) | (10, 45) |
| (13, 43) | (14, 44) | (15, 45) | (16, 46) | (17, 47) | (18, 48) | (19, 49) | (20, 50) |
| (9, 41) | (10, 42) | (11, 43) | (12, 44) | (13, 45) | (14, 46) | (15, 47) | (16, 48) |
| (5, 39) | (6, 40) | (7, 41) | (8, 42) | (9, 43) | (10, 44) | (11, 45) | (12, 46) |
| (1, 37) | (2, 38) | (3, 39) | (4, 40) | (5, 41) | (6, 42) | (7, 43) | (8, 44) |
| (63, 35) | (0, 36) | (1, 37) | (2, 38) | (3, 39) | (4, 40) | (5, 41) | (6, 42) |
| (59, 33) | (60, 34) | (61, 35) | (62, 36) | (63, 37) | (0, 38) | (1, 39) | (2, 40) |
| (55, 31) | (56, 32) | (57, 33) | (58, 34) | (59, 35) | (60, 36) | (61, 37) | (62, 38) |
| (51, 29) | (52, 30) | (53, 31) | (54, 32) | (55, 33) | (56, 34) | (57, 35) | (58, 36) |
| (61, 34) | (62, 35) | (63, 36) | (0, 37) | (1, 38) | (2, 39) | (3, 40) | (4, 41) |
| (57, 32) | (58, 33) | (59, 34) | (60, 35) | (61, 36) | (62, 37) | (63, 38) | (0, 39) |
| (53, 30) | (54, 31) | (55, 32) | (56, 33) | (57, 34) | (58, 35) | (59, 36) | (60, 37) |
| (49, 28) | (50, 29) | (51, 30) | (52, 31) | (53, 32) | (54, 33) | (55, 34) | (56, 35) |
| (47, 26) | (48, 27) | (49, 28) | (50, 29) | (51, 30) | (52, 31) | (53, 32) | (54, 33) |
| (43, 24) | (44, 25) | (45, 26) | (46, 27) | (47, 28) | (48, 29) | (49, 30) | (50, 31) |
| (39, 22) | (40, 23) | (41, 24) | (42, 25) | (43, 26) | (44, 27) | (45, 28) | (46, 29) |
| (35, 20) | (36, 21) | (37, 22) | (38, 23) | (39, 24) | (40, 25) | (41, 26) | (42, 27) |
| (45, 25) | (46, 26) | (47, 27) | (48, 28) | (49, 29) | (50, 30) | (51, 31) | (52, 32) |

TABLE 7-continued

| | | | | | | |
|---|---|---|---|---|---|---|
| (41, 23) | (42, 24) | (43, 25) | (44, 26) | (45, 27) | (46, 28) | (47, 29) | (48, 30) |
| (37, 21) | (38, 22) | (39, 23) | (40, 24) | (41, 25) | (42, 26) | (43, 27) | (44, 28) |
| (33, 19) | (34, 20) | (35, 21) | (36, 22) | (37, 23) | (38, 24) | (39, 25) | (40, 26) |
| (31, 17) | (32, 18) | (33, 19) | (34, 20) | (35, 21) | (36, 22) | (37, 23) | (38, 24) |
| (27, 15) | (28, 16) | (29, 17) | (30, 18) | (31, 19) | (32, 20) | (33, 21) | (34, 22) |
| (23, 13) | (24, 14) | (25, 15) | (26, 16) | (27, 17) | (28, 18) | (29, 19) | (30, 20) |
| (19, 11) | (20, 12) | (21, 13) | (22, 14) | (23, 15) | (24, 16) | (25, 17) | (26, 18) |
| (29, 16) | (30, 17) | (31, 18) | (32, 19) | (33, 20) | (34, 21) | (35, 22) | (36, 23) |
| (25, 14) | (26, 15) | (27, 16) | (28, 17) | (29, 18) | (30, 19) | (31, 20) | (32, 21) |
| (21, 12) | (22, 13) | (23, 14) | (24, 15) | (25, 16) | (26, 17) | (27, 18) | (28, 19) |
| (17, 10) | (18, 11) | (19, 12) | (20, 13) | (21, 14) | (22, 15) | (23, 16) | (24, 17) |
| (24, 24) | (25, 25) | (26, 26) | (27, 27) | (28, 28) | (29, 29) | (30, 30) | (31, 31) |
| (20, 22) | (21, 23) | (22, 24) | (23, 25) | (24, 26) | (25, 27) | (26, 28) | (27, 29) |
| (16, 20) | (17, 21) | (18, 22) | (19, 23) | (20, 24) | (21, 25) | (22, 26) | (23, 27) |
| (12, 18) | (13, 19) | (14, 20) | (15, 21) | (16, 22) | (17, 23) | (18, 24) | (19, 25) |
| (22, 23) | (23, 24) | (24, 25) | (25, 26) | (26, 27) | (27, 28) | (28, 29) | (29, 30) |
| (18, 21) | (19, 22) | (20, 23) | (21, 24) | (22, 25) | (23, 26) | (24, 27) | (25, 28) |
| (14, 19) | (15, 20) | (16, 21) | (17, 22) | (18, 23) | (19, 24) | (20, 25) | (21, 26) |
| (10, 17) | (11, 18) | (12, 19) | (13, 20) | (14, 21) | (15, 22) | (16, 23) | (17, 24) |
| (8, 15) | (9, 16) | (10, 17) | (11, 18) | (12, 19) | (13, 20) | (14, 21) | (15, 22) |
| (4, 13) | (5, 14) | (6, 15) | (7, 16) | (8, 17) | (9, 18) | (10, 19) | (11, 20) |
| (0, 11) | (1, 12) | (2, 13) | (3, 14) | (4, 15) | (5, 16) | (6, 17) | (7, 18) |
| (60, 9) | (61, 10) | (62, 11) | (63, 12) | (0, 13) | (1, 14) | (2, 15) | (3, 16) |
| (6, 14) | (7, 15) | (8, 16) | (9, 17) | (10, 18) | (11, 19) | (12, 20) | (13, 21) |
| (2, 12) | (3, 13) | (4, 14) | (5, 15) | (6, 16) | (7, 17) | (8, 18) | (9, 19) |
| (62, 10) | (63, 11) | (0, 12) | (1, 13) | (2, 14) | (3, 15) | (4, 16) | (5, 17) |
| (58, 8) | (59, 9) | (60, 10) | (61, 11) | (62, 12) | (63, 13) | (0, 14) | (1, 15) |
| (56, 6) | (57, 7) | (58, 8) | (59, 9) | (60, 10) | (61, 11) | (62, 12) | (63, 13) |
| (52, 4) | (53, 5) | (54, 6) | (55, 7) | (56, 8) | (57, 9) | (58, 10) | (59, 11) |
| (48, 2) | (49, 3) | (50, 4) | (51, 5) | (52, 6) | (53, 7) | (54, 8) | (55, 9) |
| (44, 0) | (45, 1) | (46, 2) | (47, 3) | (48, 4) | (49, 5) | (50, 6) | (51, 7) |
| (54, 5) | (55, 6) | (56, 7) | (57, 8) | (58, 9) | (59, 10) | (60, 11) | (61, 12) |
| (50, 3) | (51, 4) | (52, 5) | (53, 6) | (54, 7) | (55, 8) | (56, 9) | (57, 10) |
| (46, 1) | (47, 2) | (48, 3) | (49, 4) | (50, 5) | (51, 6) | (52, 7) | (53, 8) |
| (42, 63) | (43, 0) | (44, 1) | (45, 2) | (46, 3) | (47, 4) | (48, 5) | (49, 6) |
| (40, 61) | (41, 62) | (42, 63) | (43, 0) | (44, 1) | (45, 2) | (46, 3) | (47, 4) |
| (36, 59) | (37, 60) | (38, 61) | (39, 62) | (40, 63) | (41, 0) | (42, 1) | (43, 2) |
| (32, 57) | (33, 58) | (34, 59) | (35, 60) | (36, 61) | (37, 62) | (38, 63) | (39, 0) |
| (28, 55) | (29, 56) | (30, 57) | (31, 58) | (32, 59) | (33, 60) | (34, 61) | (35, 62) |
| (38, 60) | (39, 61) | (40, 62) | (41, 63) | (42, 0) | (43, 1) | (44, 2) | (45, 3) |
| (34, 58) | (35, 59) | (36, 60) | (37, 61) | (38, 62) | (39, 63) | (40, 0) | (41, 1) |
| (30, 56) | (31, 57) | (32, 58) | (33, 59) | (34, 60) | (35, 61) | (36, 62) | (37, 63) |
| (26, 54) | (27, 55) | (28, 56) | (29, 57) | (30, 58) | (31, 59) | (32, 60) | (33, 61) |
| (23, 52) | (24, 53) | (25, 54) | (26, 55) | (27, 56) | (28, 57) | (29, 58) | (30, 59) |
| (19, 50) | (20, 51) | (21, 52) | (22, 53) | (23, 54) | (24, 55) | (25, 56) | (26, 57) |
| (15, 48) | (16, 49) | (17, 50) | (18, 51) | (19, 52) | (20, 53) | (21, 54) | (22, 55) |
| (11, 46) | (12, 47) | (13, 48) | (14, 49) | (15, 50) | (16, 51) | (17, 52) | (18, 53) |
| (21, 51) | (22, 52) | (23, 53) | (24, 54) | (25, 55) | (26, 56) | (27, 57) | (28, 58) |
| (17, 49) | (18, 50) | (19, 51) | (20, 52) | (21, 53) | (22, 54) | (23, 55) | (24, 56) |
| (13, 47) | (14, 48) | (15, 49) | (16, 50) | (17, 51) | (18, 52) | (19, 53) | (20, 54) |
| (9, 45) | (10, 46) | (11, 47) | (12, 48) | (13, 49) | (14, 50) | (15, 51) | (16, 52) |
| (7, 43) | (8, 44) | (9, 45) | (10, 46) | (11, 47) | (12, 48) | (13, 49) | (14, 50) |
| (3, 41) | (4, 42) | (5, 43) | (6, 44) | (7, 45) | (8, 46) | (9, 47) | (10, 48) |
| (63, 39) | (0, 40) | (1, 41) | (2, 42) | (3, 43) | (4, 44) | (5, 45) | (6, 46) |
| (59, 37) | (60, 38) | (61, 39) | (62, 40) | (63, 41) | (0, 42) | (1, 43) | (2, 44) |
| (5, 42) | (6, 43) | (7, 44) | (8, 45) | (9, 46) | (10, 47) | (11, 48) | (12, 49) |
| (1, 40) | (2, 41) | (3, 42) | (4, 43) | (5, 44) | (6, 45) | (7, 46) | (8, 47) |
| (61, 38) | (62, 39) | (63, 40) | (0, 41) | (1, 42) | (2, 43) | (3, 44) | (4, 45) |
| (57, 36) | (58, 37) | (59, 38) | (60, 39) | (61, 40) | (62, 41) | (63, 42) | (0, 43) |
| (55, 34) | (56, 35) | (57, 36) | (58, 37) | (59, 38) | (60, 39) | (61, 40) | (62, 41) |
| (51, 32) | (52, 33) | (53, 34) | (54, 35) | (55, 36) | (56, 37) | (57, 38) | (58, 39) |
| (47, 30) | (48, 31) | (49, 32) | (50, 33) | (51, 34) | (52, 35) | (53, 36) | (54, 37) |
| (43, 28) | (44, 29) | (45, 30) | (46, 31) | (47, 32) | (48, 33) | (49, 34) | (50, 35) |
| (53, 33) | (54, 34) | (55, 35) | (56, 36) | (57, 37) | (58, 38) | (59, 39) | (60, 40) |
| (49, 31) | (50, 32) | (51, 33) | (52, 34) | (53, 35) | (54, 36) | (55, 37) | (56, 38) |
| (45, 29) | (46, 30) | (47, 31) | (48, 32) | (49, 33) | (50, 34) | (51, 35) | (52, 36) |
| (41, 27) | (42, 28) | (43, 29) | (44, 30) | (45, 31) | (46, 32) | (47, 33) | (48, 34) |
| (39, 25) | (40, 26) | (41, 27) | (42, 28) | (43, 29) | (44, 30) | (45, 31) | (46, 32) |
| (35, 23) | (36, 24) | (37, 25) | (38, 26) | (39, 27) | (40, 28) | (41, 29) | (42, 30) |
| (31, 21) | (32, 22) | (33, 23) | (34, 24) | (35, 25) | (36, 26) | (37, 27) | (38, 28) |
| (27, 19) | (28, 20) | (29, 21) | (30, 22) | (31, 23) | (32, 24) | (33, 25) | (34, 26) |
| (37, 24) | (38, 25) | (39, 26) | (40, 27) | (41, 28) | (42, 29) | (43, 30) | (44, 31) |
| (33, 22) | (34, 23) | (35, 24) | (36, 25) | (37, 26) | (38, 27) | (39, 28) | (40, 29) |
| (29, 20) | (30, 21) | (31, 22) | (32, 23) | (33, 24) | (34, 25) | (35, 26) | (36, 27) |
| (25, 18) | (26, 19) | (27, 20) | (28, 21) | (29, 22) | (30, 23) | (31, 24) | (32, 25) |

TABLE 8

| | | | | | | |
|---|---|---|---|---|---|---|
| (32, 32) | (33, 33) | (34, 34) | (35, 35) | (36, 36) | (37, 37) | (38, 38) | (39, 39) |
| (28, 30) | (29, 31) | (30, 32) | (31, 33) | (32, 34) | (33, 35) | (34, 36) | (35, 37) |
| (24, 28) | (25, 29) | (26, 30) | (27, 31) | (28, 32) | (29, 33) | (30, 34) | (31, 35) |
| (20, 26) | (21, 27) | (22, 28) | (23, 29) | (24, 30) | (25, 31) | (26, 32) | (27, 33) |
| (30, 31) | (31, 32) | (32, 33) | (33, 34) | (34, 35) | (35, 36) | (36, 37) | (37, 38) |
| (26, 29) | (27, 30) | (28, 31) | (29, 32) | (30, 33) | (31, 34) | (32, 35) | (33, 36) |
| (22, 27) | (23, 28) | (24, 29) | (25, 30) | (26, 31) | (27, 32) | (28, 33) | (29, 34) |
| (18, 25) | (19, 26) | (20, 27) | (21, 28) | (22, 29) | (23, 30) | (24, 31) | (25, 32) |
| (16, 23) | (17, 24) | (18, 25) | (19, 26) | (20, 27) | (21, 28) | (22, 29) | (23, 30) |
| (12, 21) | (13, 22) | (14, 23) | (15, 24) | (16, 25) | (17, 26) | (18, 27) | (19, 28) |
| (8, 19) | (9, 20) | (10, 21) | (11, 22) | (12, 23) | (13, 24) | (14, 25) | (15, 26) |
| (4, 17) | (5, 18) | (6, 19) | (7, 20) | (8, 21) | (9, 22) | (10, 23) | (11, 24) |
| (14, 22) | (15, 23) | (16, 24) | (17, 25) | (18, 26) | (19, 27) | (20, 28) | (21, 29) |
| (10, 20) | (11, 21) | (12, 22) | (13, 23) | (14, 24) | (15, 25) | (16, 26) | (17, 27) |
| (6, 18) | (7, 19) | (8, 20) | (9, 21) | (10, 22) | (11, 23) | (12, 24) | (13, 25) |
| (2, 16) | (3, 17) | (4, 18) | (5, 19) | (6, 20) | (7, 21) | (8, 22) | (9, 23) |
| (0, 14) | (1, 15) | (2, 16) | (3, 17) | (4, 18) | (5, 19) | (6, 20) | (7, 21) |
| (60, 12) | (61, 13) | (62, 14) | (63, 15) | (0, 16) | (1, 17) | (2, 18) | (3, 19) |
| (56, 10) | (57, 11) | (58, 12) | (59, 13) | (60, 14) | (61, 15) | (62, 16) | (63, 17) |
| (52, 8) | (53, 9) | (54, 10) | (55, 11) | (56, 12) | (57, 13) | (58, 14) | (59, 15) |
| (62, 13) | (63, 14) | (0, 15) | (1, 16) | (2, 17) | (3, 18) | (4, 19) | (5, 20) |
| (58, 11) | (59, 12) | (60, 13) | (61, 14) | (62, 15) | (63, 16) | (0, 17) | (1, 18) |
| (54, 9) | (55, 10) | (56, 11) | (57, 12) | (58, 13) | (59, 14) | (60, 15) | (61, 16) |
| (50, 7) | (51, 8) | (52, 9) | (53, 10) | (54, 11) | (55, 12) | (56, 13) | (57, 14) |
| (48, 5) | (49, 6) | (50, 7) | (51, 8) | (52, 9) | (53, 10) | (54, 11) | (55, 12) |
| (44, 3) | (45, 4) | (46, 5) | (47, 6) | (48, 7) | (49, 8) | (50, 9) | (51, 10) |
| (40, 1) | (41, 2) | (42, 3) | (43, 4) | (44, 5) | (45, 6) | (46, 7) | (47, 8) |
| (36, 63) | (37, 0) | (38, 1) | (39, 2) | (40, 3) | (41, 4) | (42, 5) | (43, 6) |
| (46, 4) | (47, 5) | (48, 6) | (49, 7) | (50, 8) | (51, 9) | (52, 10) | (53, 11) |
| (42, 2) | (43, 3) | (44, 4) | (45, 5) | (46, 6) | (47, 7) | (48, 8) | (49, 9) |
| (38, 0) | (39, 1) | (40, 2) | (41, 3) | (42, 4) | (43, 5) | (44, 6) | (45, 7) |
| (34, 62) | (35, 63) | (36, 0) | (37, 1) | (38, 2) | (39, 3) | (40, 4) | (41, 5) |
| (31, 60) | (32, 61) | (33, 62) | (34, 63) | (35, 0) | (36, 1) | (37, 2) | (38, 3) |
| (27, 58) | (28, 59) | (29, 60) | (30, 61) | (31, 62) | (32, 63) | (33, 0) | (34, 1) |
| (23, 56) | (24, 57) | (25, 58) | (26, 59) | (27, 60) | (28, 61) | (29, 62) | (30, 63) |
| (19, 54) | (20, 55) | (21, 56) | (22, 57) | (23, 58) | (24, 59) | (25, 60) | (26, 61) |
| (29, 59) | (30, 60) | (31, 61) | (32, 62) | (33, 63) | (34, 0) | (35, 1) | (36, 2) |
| (25, 57) | (26, 58) | (27, 59) | (28, 60) | (29, 61) | (30, 62) | (31, 63) | (32, 0) |
| (21, 55) | (22, 56) | (23, 57) | (24, 58) | (25, 59) | (26, 60) | (27, 61) | (28, 62) |
| (17, 53) | (18, 54) | (19, 55) | (20, 56) | (21, 57) | (22, 58) | (23, 59) | (24, 60) |
| (15, 51) | (16, 52) | (17, 53) | (18, 54) | (19, 55) | (20, 56) | (21, 57) | (22, 58) |
| (11, 49) | (12, 50) | (13, 51) | (14, 52) | (15, 53) | (16, 54) | (17, 55) | (18, 56) |
| (7, 47) | (8, 48) | (9, 49) | (10, 50) | (11, 51) | (12, 52) | (13, 53) | (14, 54) |
| (3, 45) | (4, 46) | (5, 47) | (6, 48) | (7, 49) | (8, 50) | (9, 51) | (10, 52) |
| (13, 50) | (14, 51) | (15, 52) | (16, 53) | (17, 54) | (18, 55) | (19, 56) | (20, 57) |
| (9, 48) | (10, 49) | (11, 50) | (12, 51) | (13, 52) | (14, 53) | (15, 54) | (16, 55) |
| (5, 46) | (6, 47) | (7, 48) | (8, 49) | (9, 50) | (10, 51) | (11, 52) | (12, 53) |
| (1, 44) | (2, 45) | (3, 46) | (4, 47) | (5, 48) | (6, 49) | (7, 50) | (8, 51) |
| (63, 42) | (0, 43) | (1, 44) | (2, 45) | (3, 46) | (4, 47) | (5, 48) | (6, 49) |
| (59, 40) | (60, 41) | (61, 42) | (62, 43) | (63, 44) | (0, 45) | (1, 46) | (2, 47) |
| (55, 38) | (56, 39) | (57, 40) | (58, 41) | (59, 42) | (60, 43) | (61, 44) | (62, 45) |
| (51, 36) | (52, 37) | (53, 38) | (54, 39) | (55, 40) | (56, 41) | (57, 42) | (58, 43) |
| (61, 41) | (62, 42) | (63, 43) | (0, 44) | (1, 45) | (2, 46) | (3, 47) | (4, 48) |
| (57, 39) | (58, 40) | (59, 41) | (60, 42) | (61, 43) | (62, 44) | (63, 45) | (0, 46) |
| (53, 37) | (54, 38) | (55, 39) | (56, 40) | (57, 41) | (58, 42) | (59, 43) | (60, 44) |
| (49, 35) | (50, 36) | (51, 37) | (52, 38) | (53, 39) | (54, 40) | (55, 41) | (56, 42) |
| (47, 33) | (48, 34) | (49, 35) | (50, 36) | (51, 37) | (52, 38) | (53, 39) | (54, 40) |
| (43, 31) | (44, 32) | (45, 33) | (46, 34) | (47, 35) | (48, 36) | (49, 37) | (50, 38) |
| (39, 29) | (40, 30) | (41, 31) | (42, 32) | (43, 33) | (44, 34) | (45, 35) | (46, 36) |
| (35, 27) | (36, 28) | (37, 29) | (38, 30) | (39, 31) | (40, 32) | (41, 33) | (42, 34) |
| (45, 32) | (46, 33) | (47, 34) | (48, 35) | (49, 36) | (50, 37) | (51, 38) | (52, 39) |
| (41, 30) | (42, 31) | (43, 32) | (44, 33) | (45, 34) | (46, 35) | (47, 36) | (48, 37) |
| (37, 28) | (38, 29) | (39, 30) | (40, 31) | (41, 32) | (42, 33) | (43, 34) | (44, 35) |
| (33, 26) | (34, 27) | (35, 28) | (36, 29) | (37, 30) | (38, 31) | (39, 32) | (40, 33) |
| (40, 40) | (41, 41) | (42, 42) | (43, 43) | (44, 44) | (45, 45) | (46, 46) | (47, 47) |
| (36, 38) | (37, 39) | (38, 40) | (39, 41) | (40, 42) | (41, 43) | (42, 44) | (43, 45) |
| (32, 36) | (33, 37) | (34, 38) | (35, 39) | (36, 40) | (37, 41) | (38, 42) | (39, 43) |
| (28, 34) | (29, 35) | (30, 36) | (31, 37) | (32, 38) | (33, 39) | (34, 40) | (35, 41) |
| (38, 39) | (39, 40) | (40, 41) | (41, 42) | (42, 43) | (43, 44) | (44, 45) | (45, 46) |
| (34, 37) | (35, 38) | (36, 39) | (37, 40) | (38, 41) | (39, 42) | (40, 43) | (41, 44) |
| (30, 35) | (31, 36) | (32, 37) | (33, 38) | (34, 39) | (35, 40) | (36, 41) | (37, 42) |
| (26, 33) | (27, 34) | (28, 35) | (29, 36) | (30, 37) | (31, 38) | (32, 39) | (33, 40) |
| (24, 31) | (25, 32) | (26, 33) | (27, 34) | (28, 35) | (29, 36) | (30, 37) | (31, 38) |
| (20, 29) | (21, 30) | (22, 31) | (23, 32) | (24, 33) | (25, 34) | (26, 35) | (27, 36) |
| (16, 27) | (17, 28) | (18, 29) | (19, 30) | (20, 31) | (21, 32) | (22, 33) | (23, 34) |
| (12, 25) | (13, 26) | (14, 27) | (15, 28) | (16, 29) | (17, 30) | (18, 31) | (19, 32) |
| (22, 30) | (23, 31) | (24, 32) | (25, 33) | (26, 34) | (27, 35) | (28, 36) | (29, 37) |
| (18, 28) | (19, 29) | (20, 30) | (21, 31) | (22, 32) | (23, 33) | (24, 34) | (25, 35) |
| (14, 26) | (15, 27) | (16, 28) | (17, 29) | (18, 30) | (19, 31) | (20, 32) | (21, 33) |

TABLE 8-continued

| | | | | | | |
|---|---|---|---|---|---|---|
| (10, 24) | (11, 25) | (12, 26) | (13, 27) | (14, 28) | (15, 29) | (16, 30) | (17, 31) |
| (8, 22) | (9, 23) | (10, 24) | (11, 25) | (12, 26) | (13, 27) | (14, 28) | (15, 29) |
| (4, 20) | (5, 21) | (6, 22) | (7, 23) | (8, 24) | (9, 25) | (10, 26) | (11, 27) |
| (0, 18) | (1, 19) | (2, 20) | (3, 21) | (4, 22) | (5, 23) | (6, 24) | (7, 25) |
| (60, 16) | (61, 17) | (62, 18) | (63, 19) | (0, 20) | (1, 21) | (2, 22) | (3, 23) |
| (6, 21) | (7, 22) | (8, 23) | (9, 24) | (10, 25) | (11, 26) | (12, 27) | (13, 28) |
| (2, 19) | (3, 20) | (4, 21) | (5, 22) | (6, 23) | (7, 24) | (8, 25) | (9, 26) |
| (62, 17) | (63, 18) | (0, 19) | (1, 20) | (2, 21) | (3, 22) | (4, 23) | (5, 24) |
| (58, 15) | (59, 16) | (60, 17) | (61, 18) | (62, 19) | (63, 20) | (0, 21) | (1, 22) |
| (56, 13) | (57, 14) | (58, 15) | (59, 16) | (60, 17) | (61, 18) | (62, 19) | (63, 20) |
| (52, 11) | (53, 12) | (54, 13) | (55, 14) | (56, 15) | (57, 16) | (58, 17) | (59, 18) |
| (48, 9) | (49, 10) | (50, 11) | (51, 12) | (52, 13) | (53, 14) | (54, 15) | (55, 16) |
| (44, 7) | (45, 8) | (46, 9) | (47, 10) | (48, 11) | (49, 12) | (50, 13) | (51, 14) |
| (54, 12) | (55, 13) | (56, 14) | (57, 15) | (58, 16) | (59, 17) | (60, 18) | (61, 19) |
| (50, 10) | (51, 11) | (52, 12) | (53, 13) | (54, 14) | (55, 15) | (56, 16) | (57, 17) |
| (46, 8) | (47, 9) | (48, 10) | (49, 11) | (50, 12) | (51, 13) | (52, 14) | (53, 15) |
| (42, 6) | (43, 7) | (44, 8) | (45, 9) | (46, 10) | (47, 11) | (48, 12) | (49, 13) |
| (39, 4) | (40, 5) | (41, 6) | (42, 7) | (43, 8) | (44, 9) | (45, 10) | (46, 11) |
| (35, 2) | (36, 3) | (37, 4) | (38, 5) | (39, 6) | (40, 7) | (41, 8) | (42, 9) |
| (31, 0) | (32, 1) | (33, 2) | (34, 3) | (35, 4) | (36, 5) | (37, 6) | (38, 7) |
| (27, 62) | (28, 63) | (29, 0) | (30, 1) | (31, 2) | (32, 3) | (33, 4) | (34, 5) |
| (37, 3) | (38, 4) | (39, 5) | (40, 6) | (41, 7) | (42, 8) | (43, 9) | (44, 10) |
| (33, 1) | (34, 2) | (35, 3) | (36, 4) | (37, 5) | (38, 6) | (39, 7) | (40, 8) |
| (29, 63) | (30, 0) | (31, 1) | (32, 2) | (33, 3) | (34, 4) | (35, 5) | (36, 6) |
| (25, 61) | (26, 62) | (27, 63) | (28, 0) | (29, 1) | (30, 2) | (31, 3) | (32, 4) |
| (23, 59) | (24, 60) | (25, 61) | (26, 62) | (27, 63) | (28, 0) | (29, 1) | (30, 2) |
| (19, 57) | (20, 58) | (21, 59) | (22, 60) | (23, 61) | (24, 62) | (25, 63) | (26, 0) |
| (15, 55) | (16, 56) | (17, 57) | (18, 58) | (19, 59) | (20, 60) | (21, 61) | (22, 62) |
| (11, 53) | (12, 54) | (13, 55) | (14, 56) | (15, 57) | (16, 58) | (17, 59) | (18, 60) |
| (21, 58) | (22, 59) | (23, 60) | (24, 61) | (25, 62) | (26, 63) | (27, 0) | (28, 1) |
| (17, 56) | (18, 57) | (19, 58) | (20, 59) | (21, 60) | (22, 61) | (23, 62) | (24, 63) |
| (13, 54) | (14, 55) | (15, 56) | (16, 57) | (17, 58) | (18, 59) | (19, 60) | (20, 61) |
| (9, 52) | (10, 53) | (11, 54) | (12, 55) | (13, 56) | (14, 57) | (15, 58) | (16, 59) |
| (7, 50) | (8, 51) | (9, 52) | (10, 53) | (11, 54) | (12, 55) | (13, 56) | (14, 57) |
| (3, 48) | (4, 49) | (5, 50) | (6, 51) | (7, 52) | (8, 53) | (9, 54) | (10, 55) |
| (63, 46) | (0, 47) | (1, 48) | (2, 49) | (3, 50) | (4, 51) | (5, 52) | (6, 53) |
| (59, 44) | (60, 45) | (61, 46) | (62, 47) | (63, 48) | (0, 49) | (1, 50) | (2, 51) |
| (5, 49) | (6, 50) | (7, 51) | (8, 52) | (9, 53) | (10, 54) | (11, 55) | (12, 56) |
| (1, 47) | (2, 48) | (3, 49) | (4, 50) | (5, 51) | (6, 52) | (7, 53) | (8, 54) |
| (61, 45) | (62, 46) | (63, 47) | (0, 48) | (1, 49) | (2, 50) | (3, 51) | (4, 52) |
| (57, 43) | (58, 44) | (59, 45) | (60, 46) | (61, 47) | (62, 48) | (63, 49) | (0, 50) |
| (55, 41) | (56, 42) | (57, 43) | (58, 44) | (59, 45) | (60, 46) | (61, 47) | (62, 48) |
| (51, 39) | (52, 40) | (53, 41) | (54, 42) | (55, 43) | (56, 44) | (57, 45) | (58, 46) |
| (47, 37) | (48, 38) | (49, 39) | (50, 40) | (51, 41) | (52, 42) | (53, 43) | (54, 44) |
| (43, 35) | (44, 36) | (45, 37) | (46, 38) | (47, 39) | (48, 40) | (49, 41) | (50, 42) |
| (53, 40) | (54, 41) | (55, 42) | (56, 43) | (57, 44) | (58, 45) | (59, 46) | (60, 47) |
| (49, 38) | (50, 39) | (51, 40) | (52, 41) | (53, 42) | (54, 43) | (55, 44) | (56, 45) |
| (45, 36) | (46, 37) | (47, 38) | (48, 39) | (49, 40) | (50, 41) | (51, 42) | (52, 43) |
| (41, 34) | (42, 35) | (43, 36) | (44, 37) | (45, 38) | (46, 39) | (47, 40) | (48, 41) |

TABLE 9

| | | | | | | |
|---|---|---|---|---|---|---|
| (48, 48) | (49, 49) | (50, 50) | (51, 51) | (52, 52) | (53, 53) | (54, 54) | (55, 55) |
| (44, 46) | (45, 47) | (46, 48) | (47, 49) | (48, 50) | (49, 51) | (50, 52) | (51, 53) |
| (40, 44) | (41, 45) | (42, 46) | (43, 47) | (44, 48) | (45, 49) | (46, 50) | (47, 51) |
| (36, 42) | (37, 43) | (38, 44) | (39, 45) | (40, 46) | (41, 47) | (42, 48) | (43, 49) |
| (46, 47) | (47, 48) | (48, 49) | (49, 50) | (50, 51) | (51, 52) | (52, 53) | (53, 54) |
| (42, 45) | (43, 46) | (44, 47) | (45, 48) | (46, 49) | (47, 50) | (48, 51) | (49, 52) |
| (38, 43) | (39, 44) | (40, 45) | (41, 46) | (42, 47) | (43, 48) | (44, 49) | (45, 50) |
| (34, 41) | (35, 42) | (36, 43) | (37, 44) | (38, 45) | (39, 46) | (40, 47) | (41, 48) |
| (32, 39) | (33, 40) | (34, 41) | (35, 42) | (36, 43) | (37, 44) | (38, 45) | (39, 46) |
| (28, 37) | (29, 38) | (30, 39) | (31, 40) | (32, 41) | (33, 42) | (34, 43) | (35, 44) |
| (24, 35) | (25, 36) | (26, 37) | (27, 38) | (28, 39) | (29, 40) | (30, 41) | (31, 42) |
| (20, 33) | (21, 34) | (22, 35) | (23, 36) | (24, 37) | (25, 38) | (26, 39) | (27, 40) |
| (30, 38) | (31, 39) | (32, 40) | (33, 41) | (34, 42) | (35, 43) | (36, 44) | (37, 45) |
| (26, 36) | (27, 37) | (28, 38) | (29, 39) | (30, 40) | (31, 41) | (32, 42) | (33, 43) |
| (22, 34) | (23, 35) | (24, 36) | (25, 37) | (26, 38) | (27, 39) | (28, 40) | (29, 41) |
| (18, 32) | (19, 33) | (20, 34) | (21, 35) | (22, 36) | (23, 37) | (24, 38) | (25, 39) |
| (16, 30) | (17, 31) | (18, 32) | (19, 33) | (20, 34) | (21, 35) | (22, 36) | (23, 37) |
| (12, 28) | (13, 29) | (14, 30) | (15, 31) | (16, 32) | (17, 33) | (18, 34) | (19, 35) |
| (8, 26) | (9, 27) | (10, 28) | (11, 29) | (12, 30) | (13, 31) | (14, 32) | (15, 33) |
| (4, 24) | (5, 25) | (6, 26) | (7, 27) | (8, 28) | (9, 29) | (10, 30) | (11, 31) |
| (14, 29) | (15, 30) | (16, 31) | (17, 32) | (18, 33) | (19, 34) | (20, 35) | (21, 36) |
| (10, 27) | (11, 28) | (12, 29) | (13, 30) | (14, 31) | (15, 32) | (16, 33) | (17, 34) |
| (6, 25) | (7, 26) | (8, 27) | (9, 28) | (10, 29) | (11, 30) | (12, 31) | (13, 32) |
| (2, 23) | (3, 24) | (4, 25) | (5, 26) | (6, 27) | (7, 28) | (8, 29) | (9, 30) |
| (0, 21) | (1, 22) | (2, 23) | (3, 24) | (4, 25) | (5, 26) | (6, 27) | (7, 28) |

TABLE 9-continued

| | | | | | | |
|---|---|---|---|---|---|---|
| (60, 19) | (61, 20) | (62, 21) | (63, 22) | (0, 23) | (1, 24) | (2, 25) | (3, 26) |
| (56, 17) | (57, 18) | (58, 19) | (59, 20) | (60, 21) | (61, 22) | (62, 23) | (63, 24) |
| (52, 15) | (53, 16) | (54, 17) | (55, 18) | (56, 19) | (57, 20) | (58, 21) | (59, 22) |
| (62, 20) | (63, 21) | (0, 22) | (1, 23) | (2, 24) | (3, 25) | (4, 26) | (5, 27) |
| (58, 18) | (59, 19) | (60, 20) | (61, 21) | (62, 22) | (63, 23) | (0, 24) | (1, 25) |
| (54, 16) | (55, 17) | (56, 18) | (57, 19) | (58, 20) | (59, 21) | (60, 22) | (61, 23) |
| (50, 14) | (51, 15) | (52, 16) | (53, 17) | (54, 18) | (55, 19) | (56, 20) | (57, 21) |
| (47, 12) | (48, 13) | (49, 14) | (50, 15) | (51, 16) | (52, 17) | (53, 18) | (54, 19) |
| (43, 10) | (44, 11) | (45, 12) | (46, 13) | (47, 14) | (48, 15) | (49, 16) | (50, 17) |
| (39, 8) | (40, 9) | (41, 10) | (42, 11) | (43, 12) | (44, 13) | (45, 14) | (46, 15) |
| (35, 6) | (36, 7) | (37, 8) | (38, 9) | (39, 10) | (40, 11) | (41, 12) | (42, 13) |
| (45, 11) | (46, 12) | (47, 13) | (48, 14) | (49, 15) | (50, 16) | (51, 17) | (52, 18) |
| (41, 9) | (42, 10) | (43, 11) | (44, 12) | (45, 13) | (46, 14) | (47, 15) | (48, 16) |
| (37, 7) | (38, 8) | (39, 9) | (40, 10) | (41, 11) | (42, 12) | (43, 13) | (44, 14) |
| (33, 5) | (34, 6) | (35, 7) | (36, 8) | (37, 9) | (38, 10) | (39, 11) | (40, 12) |
| (31, 3) | (32, 4) | (33, 5) | (34, 6) | (35, 7) | (36, 8) | (37, 9) | (38, 10) |
| (27, 1) | (28, 2) | (29, 3) | (30, 4) | (31, 5) | (32, 6) | (33, 7) | (34, 8) |
| (23, 63) | (24, 0) | (25, 1) | (26, 2) | (27, 3) | (28, 4) | (29, 5) | (30, 6) |
| (19, 61) | (20, 62) | (21, 63) | (22, 0) | (23, 1) | (24, 2) | (25, 3) | (26, 4) |
| (29, 2) | (30, 3) | (31, 4) | (32, 5) | (33, 6) | (34, 7) | (35, 8) | (36, 9) |
| (25, 0) | (26, 1) | (27, 2) | (28, 3) | (29, 4) | (30, 5) | (31, 6) | (32, 7) |
| (21, 62) | (22, 63) | (23, 0) | (24, 1) | (25, 2) | (26, 3) | (27, 4) | (28, 5) |
| (17, 60) | (18, 61) | (19, 62) | (20, 63) | (21, 0) | (22, 1) | (23, 2) | (24, 3) |
| (15, 58) | (16, 59) | (17, 60) | (18, 61) | (19, 62) | (20, 63) | (21, 0) | (22, 1) |
| (11, 56) | (12, 57) | (13, 58) | (14, 59) | (15, 60) | (16, 61) | (17, 62) | (18, 63) |
| (7, 54) | (8, 55) | (9, 56) | (10, 57) | (11, 58) | (12, 59) | (13, 60) | (14, 61) |
| (3, 52) | (4, 53) | (5, 54) | (6, 55) | (7, 56) | (8, 57) | (9, 58) | (10, 59) |
| (13, 57) | (14, 58) | (15, 59) | (16, 60) | (17, 61) | (18, 62) | (19, 63) | (20, 0) |
| (9, 55) | (10, 56) | (11, 57) | (12, 58) | (13, 59) | (14, 60) | (15, 61) | (16, 62) |
| (5, 53) | (6, 54) | (7, 55) | (8, 56) | (9, 57) | (10, 58) | (11, 59) | (12, 60) |
| (1, 51) | (2, 52) | (3, 53) | (4, 54) | (5, 55) | (6, 56) | (7, 57) | (8, 58) |
| (63, 49) | (0, 50) | (1, 51) | (2, 52) | (3, 53) | (4, 54) | (5, 55) | (6, 56) |
| (59, 47) | (60, 48) | (61, 49) | (62, 50) | (63, 51) | (0, 52) | (1, 53) | (2, 54) |
| (55, 45) | (56, 46) | (57, 47) | (58, 48) | (59, 49) | (60, 50) | (61, 51) | (62, 52) |
| (51, 43) | (52, 44) | (53, 45) | (54, 46) | (55, 47) | (56, 48) | (57, 49) | (58, 50) |
| (61, 48) | (62, 49) | (63, 50) | (0, 51) | (1, 52) | (2, 53) | (3, 54) | (4, 55) |
| (57, 46) | (58, 47) | (59, 48) | (60, 49) | (61, 50) | (62, 51) | (63, 52) | (0, 53) |
| (53, 44) | (54, 45) | (55, 46) | (56, 47) | (57, 48) | (58, 49) | (59, 50) | (60, 51) |
| (49, 42) | (50, 43) | (51, 44) | (52, 45) | (53, 46) | (54, 47) | (55, 48) | (56, 49) |
| (56, 56) | (57, 57) | (58, 58) | (59, 59) | (60, 60) | (61, 61) | (62, 62) | (63, 63) |
| (52, 54) | (53, 55) | (54, 56) | (55, 57) | (56, 58) | (57, 59) | (58, 60) | (59, 61) |
| (48, 52) | (49, 53) | (50, 54) | (51, 55) | (52, 56) | (53, 57) | (54, 58) | (55, 59) |
| (44, 50) | (45, 51) | (46, 52) | (47, 53) | (48, 54) | (49, 55) | (50, 56) | (51, 57) |
| (54, 55) | (55, 56) | (56, 57) | (57, 58) | (58, 59) | (59, 60) | (60, 61) | (61, 62) |
| (50, 53) | (51, 54) | (52, 55) | (53, 56) | (54, 57) | (55, 58) | (56, 59) | (57, 60) |
| (46, 51) | (47, 52) | (48, 53) | (49, 54) | (50, 55) | (51, 56) | (52, 57) | (53, 58) |
| (42, 49) | (43, 50) | (44, 51) | (45, 52) | (46, 53) | (47, 54) | (48, 55) | (49, 56) |
| (40, 47) | (41, 48) | (42, 49) | (43, 50) | (44, 51) | (45, 52) | (46, 53) | (47, 54) |
| (36, 45) | (37, 46) | (38, 47) | (39, 48) | (40, 49) | (41, 50) | (42, 51) | (43, 52) |
| (32, 43) | (33, 44) | (34, 45) | (35, 46) | (36, 47) | (37, 48) | (38, 49) | (39, 50) |
| (28, 41) | (29, 42) | (30, 43) | (31, 44) | (32, 45) | (33, 46) | (34, 47) | (35, 48) |
| (38, 46) | (39, 47) | (40, 48) | (41, 49) | (42, 50) | (43, 51) | (44, 52) | (45, 53) |
| (34, 44) | (35, 45) | (36, 46) | (37, 47) | (38, 48) | (39, 49) | (40, 50) | (41, 51) |
| (30, 42) | (31, 43) | (32, 44) | (33, 45) | (34, 46) | (35, 47) | (36, 48) | (37, 49) |
| (26, 40) | (27, 41) | (28, 42) | (29, 43) | (30, 44) | (31, 45) | (32, 46) | (33, 47) |
| (24, 38) | (25, 39) | (26, 40) | (27, 41) | (28, 42) | (29, 43) | (30, 44) | (31, 45) |
| (20, 36) | (21, 37) | (22, 38) | (23, 39) | (24, 40) | (25, 41) | (26, 42) | (27, 43) |
| (16, 34) | (17, 35) | (18, 36) | (19, 37) | (20, 38) | (21, 39) | (22, 40) | (23, 41) |
| (12, 32) | (13, 33) | (14, 34) | (15, 35) | (16, 36) | (17, 37) | (18, 38) | (19, 39) |
| (22, 37) | (23, 38) | (24, 39) | (25, 40) | (26, 41) | (27, 42) | (28, 43) | (29, 44) |
| (18, 35) | (19, 36) | (20, 37) | (21, 38) | (22, 39) | (23, 40) | (24, 41) | (25, 42) |
| (14, 33) | (15, 34) | (16, 35) | (17, 36) | (18, 37) | (19, 38) | (20, 39) | (21, 40) |
| (10, 31) | (11, 32) | (12, 33) | (13, 34) | (14, 35) | (15, 36) | (16, 37) | (17, 38) |
| (8, 29) | (9, 30) | (10, 31) | (11, 32) | (12, 33) | (13, 34) | (14, 35) | (15, 36) |
| (4, 27) | (5, 28) | (6, 29) | (7, 30) | (8, 31) | (9, 32) | (10, 33) | (11, 34) |
| (0, 25) | (1, 26) | (2, 27) | (3, 28) | (4, 29) | (5, 30) | (6, 31) | (7, 32) |
| (60, 23) | (61, 24) | (62, 25) | (63, 26) | (0, 27) | (1, 28) | (2, 29) | (3, 30) |
| (6, 28) | (7, 29) | (8, 30) | (9, 31) | (10, 32) | (11, 33) | (12, 34) | (13, 35) |
| (2, 26) | (3, 27) | (4, 28) | (5, 29) | (6, 30) | (7, 31) | (8, 32) | (9, 33) |
| (62, 24) | (63, 25) | (0, 26) | (1, 27) | (2, 28) | (3, 29) | (4, 30) | (5, 31) |
| (58, 22) | (59, 23) | (60, 24) | (61, 25) | (62, 26) | (63, 27) | (0, 28) | (1, 29) |
| (55, 20) | (56, 21) | (57, 22) | (58, 23) | (59, 24) | (60, 25) | (61, 26) | (62, 27) |
| (51, 18) | (52, 19) | (53, 20) | (54, 21) | (55, 22) | (56, 23) | (57, 24) | (58, 25) |
| (47, 16) | (48, 17) | (49, 18) | (50, 19) | (51, 20) | (52, 21) | (53, 22) | (54, 23) |
| (43, 14) | (44, 15) | (45, 16) | (46, 17) | (47, 18) | (48, 19) | (49, 20) | (50, 21) |
| (53, 19) | (54, 20) | (55, 21) | (56, 22) | (57, 23) | (58, 24) | (59, 25) | (60, 26) |
| (49, 17) | (50, 18) | (51, 19) | (52, 20) | (53, 21) | (54, 22) | (55, 23) | (56, 24) |
| (45, 15) | (46, 16) | (47, 17) | (48, 18) | (49, 19) | (50, 20) | (51, 21) | (52, 22) |
| (41, 13) | (42, 14) | (43, 15) | (44, 16) | (45, 17) | (46, 18) | (47, 19) | (48, 20) |

TABLE 9-continued

| | | | | | | | |
|---|---|---|---|---|---|---|---|
| (39, 11) | (40, 12) | (41, 13) | (42, 14) | (43, 15) | (44, 16) | (45, 17) | (46, 18) |
| (35, 9) | (36, 10) | (37, 11) | (38, 12) | (39, 13) | (40, 14) | (41, 15) | (42, 16) |
| (31, 7) | (32, 8) | (33, 9) | (34, 10) | (35, 11) | (36, 12) | (37, 13) | (38, 14) |
| (27, 5) | (28, 6) | (29, 7) | (30, 8) | (31, 9) | (32, 10) | (33, 11) | (34, 12) |
| (37, 10) | (38, 11) | (39, 12) | (40, 13) | (41, 14) | (42, 15) | (43, 16) | (44, 17) |
| (33, 8) | (34, 9) | (35, 10) | (36, 11) | (37, 12) | (38, 13) | (39, 14) | (40, 15) |
| (29, 6) | (30, 7) | (31, 8) | (32, 9) | (33, 10) | (34, 11) | (35, 12) | (36, 13) |
| (25, 4) | (26, 5) | (27, 6) | (28, 7) | (29, 8) | (30, 9) | (31, 10) | (32, 11) |
| (23, 2) | (24, 3) | (25, 4) | (26, 5) | (27, 6) | (28, 7) | (29, 8) | (30, 9) |
| (19, 0) | (20, 1) | (21, 2) | (22, 3) | (23, 4) | (24, 5) | (25, 6) | (26, 7) |
| (15, 62) | (16, 63) | (17, 0) | (18, 1) | (19, 2) | (20, 3) | (21, 4) | (22, 5) |
| (11, 60) | (12, 61) | (13, 62) | (14, 63) | (15, 0) | (16, 1) | (17, 2) | (18, 3) |
| (21, 1) | (22, 2) | (23, 3) | (24, 4) | (25, 5) | (26, 6) | (27, 7) | (28, 8) |
| (17, 63) | (18, 0) | (19, 1) | (20, 2) | (21, 3) | (22, 4) | (23, 5) | (24, 6) |
| (13, 61) | (14, 62) | (15, 63) | (16, 0) | (17, 1) | (18, 2) | (19, 3) | (20, 4) |
| (9, 59) | (10, 60) | (11, 61) | (12, 62) | (13, 63) | (14, 0) | (15, 1) | (16, 2) |
| (7, 57) | (8, 58) | (9, 59) | (10, 60) | (11, 61) | (12, 62) | (13, 63) | (14, 0) |
| (3, 55) | (4, 56) | (5, 57) | (6, 58) | (7, 59) | (8, 60) | (9, 61) | (10, 62) |
| (63, 53) | (0, 54) | (1, 55) | (2, 56) | (3, 57) | (4, 58) | (5, 59) | (6, 60) |
| (59, 51) | (60, 52) | (61, 53) | (62, 54) | (63, 55) | (0, 56) | (1, 57) | (2, 58) |
| (5, 56) | (6, 57) | (7, 58) | (8, 59) | (9, 60) | (10, 61) | (11, 62) | (12, 63) |
| (1, 54) | (2, 55) | (3, 56) | (4, 57) | (5, 58) | (6, 59) | (7, 60) | (8, 61) |
| (61, 52) | (62, 53) | (63, 54) | (0, 55) | (1, 56) | (2, 57) | (3, 58) | (4, 59) |
| (57, 50) | (58, 51) | (59, 52) | (60, 53) | (61, 54) | (62, 55) | (63, 56) | (0, 57) |

It should be noted that, merely to clearly show the third mapping table constrained by using the formula (7) and the formula (8) herein, the third mapping table is shown by using the foregoing four tables: Table 6, Table 7, Table 8, and Table 9. In actual use, for example, the mapping table is an entire table when being stored in the transmit end device, and Table 6, Table 7, Table 8, and Table 9 are arranged in a manner shown in Table 10, forming the third mapping table of 64 rows×64 columns.

TABLE 10

| Table 6 | Table 7 | Table 8 | Table 9 |
|---|---|---|---|

After position transformation in the bit square matrix range is performed on each bit square matrix in the first matrix based on the first mapping relationship, the second matrix after the position transformation is obtained. The second matrix has a same size as the first matrix, and includes a plurality of bit square matrices having the same size as the bit square matrices of the first matrix. In operation S202, the two first matrices obtained in operation S201 are processed to obtain second matrices respectively corresponding to the two first matrices. Sizes of the two second matrices are the same. For ease of description below, the two second matrices may be respectively denoted by I0 and I1.

In operation S203, the transmit end device performs, on the second matrix, bit data position transformation among bit square matrices, to obtain a third matrix.

In a process of performing, on the second matrix, bit data position transformation among bit square matrices, the transmit end device separately divides I0 and I1 into a plurality of grouped matrices of a same size, separately obtains one grouped matrix of I0 and I1 each time for simultaneous processing, and performs processing for Z times to process all grouped matrices. For example, if the second matrix is a matrix with 672×Z bit rows and 128 bit columns, each second matrix may be divided into Z grouped matrices including 672 bit rows and 128 bit columns. Optionally, because the sizes of I0 and I1 are the same, when grouped matrices are obtained from I0 and I1, a position that is of a grouped matrix obtained from I0 and that is in I0 is the same as a position that is of a grouped matrix obtained from I1 and that is in I1.

In an embodiment, the transmit end device includes an inter-block interleaving cache matrix. A quantity of bit rows included in the inter-block interleaving cache matrix is twice a quantity of bit rows included in the grouped matrix of the second matrix, and a quantity of bit columns included in the inter-block interleaving cache matrix is the same as a quantity of bit columns of the second matrix. The inter-block interleaving cache matrix may be divided into a plurality of bit square matrices having the same size as the bit square matrices of the second matrix. For example, if the second matrix includes 672×Z bit rows and 128 bit columns, the inter-block interleaving cache matrix includes 1344 bit rows and 128 bit columns.

An inter-block interleaving cache matrix whose size is 1344 bit rows×128 bit columns is used as an example to describe position transformation among bit square matrices performed by the transmit end device on bit data in the second matrix whose size is 672×Z bit rows×128 bit columns. The inter-block interleaving cache matrix may be divided into a plurality of bit square matrices including 16 bit rows and 16 bit columns. The transmit end device obtains one grouped matrix from each of I0 and I1, sequentially places square matrix rows of a grouped matrix obtained from I0 into even-numbered square matrix rows of the inter-block interleaving cache matrix, and sequentially places square matrix rows of a grouped matrix obtained from I1 into odd-numbered square matrix rows of the inter-block interleaving cache matrix, to obtain a third matrix after position transformation performed on bit data among bit square matrices. The foregoing process is performed for Z times.

In operation S204, the transmit end device modulates a to-be-sent first symbol sequence based on the third matrix.

Figure 4:
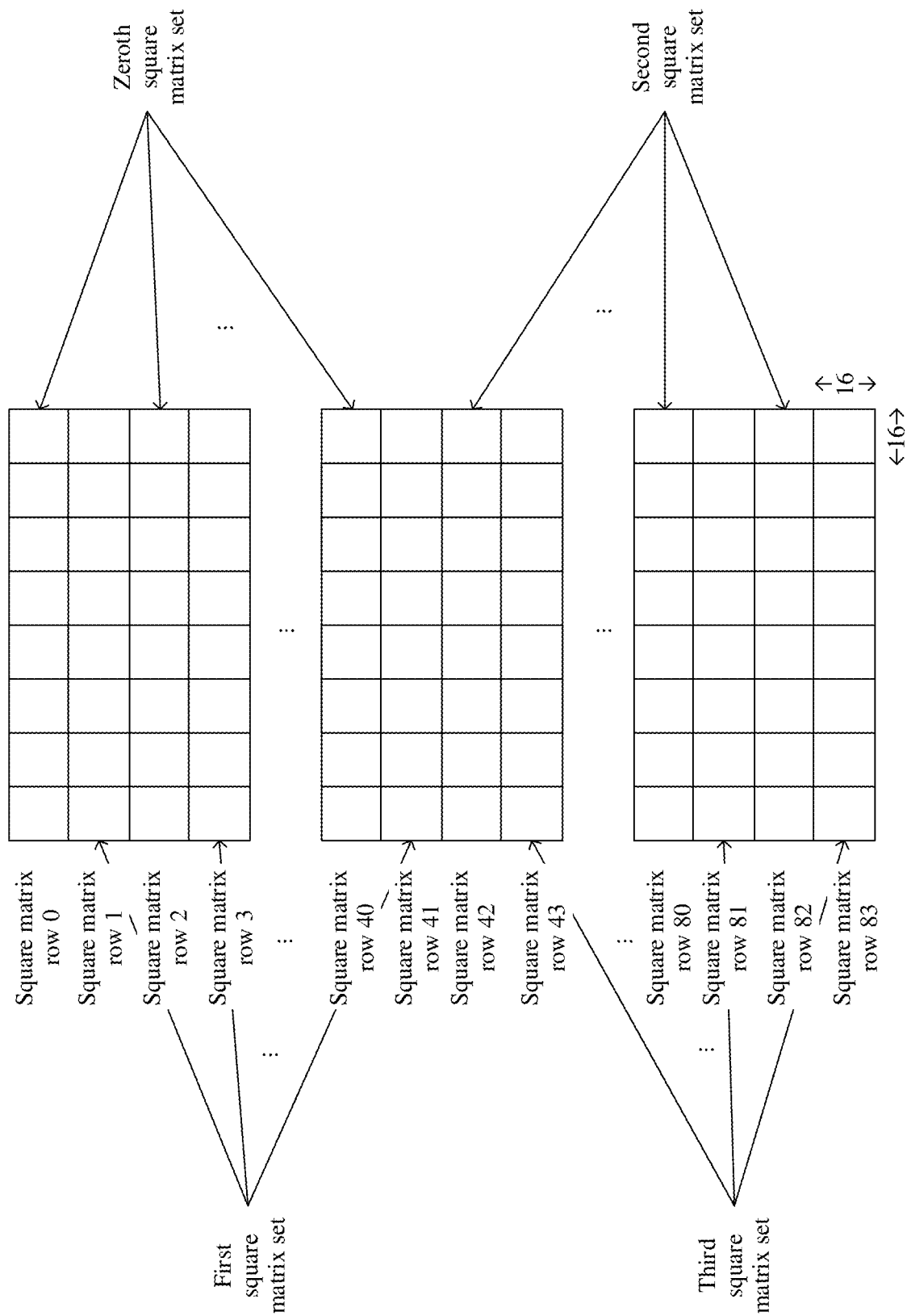
FIG. 4 is a schematic diagram of an inter-block interleaving square matrix set according to this application.

After the third matrix is determined, the transmit end device reads bit data from the inter-block interleaving cache matrix based on a preset reading rule, and sequentially arranges the read bit data to obtain a second bit sequence. Before the bit data is read from the inter-block interleaving cache matrix, the bit square matrices in the inter-block interleaving cache matrix may be divided into different square matrix sets. For details, refer to FIG. 4. FIG. 4 is a schematic diagram of an inter-block interleaving square matrix set according to this application. As shown in FIG. 4, the square matrix rows of the inter-block interleaving cache matrix may be divided into a zeroth square matrix set, a first square matrix set, a second square matrix set, and a third square matrix set. The zeroth square matrix set includes 2r square matrix rows of the inter-block interleaving cache matrix, where r is a nonnegative integer less than 2l. The first square matrix set includes 2x+1 square matrix rows of the inter-block interleaving cache matrix, where x is a nonnegative integer less than 2l. The second square matrix set includes 2y square matrix rows of the inter-block interleaving cache matrix, where y is an integer greater than 20 and less than 42. The third square matrix set includes 2e square matrix rows of the inter-block interleaving cache matrix, where e is an integer greater than 20 and less than 42.

The inter-block interleaving cache matrix has 128 columns in total, and each column has bit data of 1344 bits. When reading the bit data from the inter-block interleaving cache matrix based on the preset reading rule, the transmit end device may read the bit data by bit columns of the inter-block interleaving cache matrix. Bit data in the bit columns is sequentially read from the inter-block interleaving cache matrix in a left-to-right order, and each time after bit data in one bit column is read, bit data continues to be read from an adjacent bit column on a right side, until all bit data in the inter-block interleaving cache matrix is read. A specific process of reading bit data in each bit column is: reading bit data of first eight bits belonging to a square matrix row 0 from the bit column, sequentially reading bit data of first eight bits belonging to a square matrix row 1 from the bit column, sequentially reading bit data of first eight bits belonging to a square matrix row 42 from the bit column, and sequentially reading bit data of first eight bits belonging to a square matrix row 43 from the bit column; sequentially reading bit data of last eight bits belonging to the square matrix row 0 from the bit column, sequentially reading bit data of last eight bits belonging to the square matrix row 1 from the bit column, sequentially reading bit data of last eight bits belonging to the square matrix row 42 from the bit column, and sequentially reading bit data of last eight bits belonging to the square matrix row 43 from the bit column, and so on. Bit data of eight bits is cyclically read from the bit column in an order of the zeroth square matrix set, the first square matrix set, the second square matrix set, and the third square matrix set, and each time when bit data of eight bits is read from a square matrix set, bit data of uppermost eight bits that are in the square matrix set and that are in unread bit data in the bit column is read, until all bit data in the bit column is read.

Herein, a specified amount of bit data in the second bit sequence may be modulated into one modulation symbol, and consecutive modulation symbols form the first symbol sequence. The first symbol sequence may be modulated in a QAM modulation scheme, or the first symbol sequence may be modulated in a QPSK modulation scheme, or the like. In different modulation schemes, an amount of bit data corresponding to one modulation symbol is different.

For example, 16QAM is a QAM modulation scheme that includes 16 symbols. In a dual-polarization 16QAM modulation scheme (that is, DP-16QAM modulation), there are 16 symbols in any polarization direction, and the 16 symbols are represented by two bit pairs. One bit pair represents an I component (in-phase component) in a complex plane, and the other bit pair represents a Q component (quadrature component) in the complex plane. FIG. 5 is a constellation diagram of 16QAM according to an embodiment of this application. The 16 symbols respectively correspond to different points in the complex plane, and are mapped to points that are corresponding to different symbols and that are in the complex plane by using different values of the two bit pairs. FIG. 5 shows points that are corresponding to the 16 symbols of 16QAM in any polarization direction and that are in the complex plane. In a manner, a correspondence between a binary bit pair and a symbol amplitude may be: (0, 0)→−3, (0, 1)→−1, (1, 1)→1, and (1, 0)→3. If an I component of a symbol in a polarization direction is (1, 1), and a Q component is (0, 1), the symbol in the polarization direction corresponds to a point 1 in FIG. 5. Further, a phase and an amplitude of the symbol are determined based on the point 1. In another manner, a correspondence between a binary bit pair and a symbol amplitude may be: (0, 0)→3, (0, 1)→1, (1, 1)→−1, and (1, 0)→−3. If an I component of a symbol in a polarization direction is (1, 1), and a Q component is (0, 1), the symbol in the polarization direction corresponds to a point 2 in FIG. 5. Further, a phase and an amplitude of the symbol are determined based on the point 2.

For another example, QPSK is a modulation scheme in which four different phase differences of a carrier are used to represent an input digital signal. Four carrier phases are specified in QPSK. Binary data needs to be converted into quaternary data, to match a quaternary carrier phase. The quaternary data is represented by four corresponding symbols. In a dual-polarization QPSK modulation scheme (that is, DP-QPSK modulation), there are four symbols in any polarization direction, and the four symbols are determined by using different values of one bit pair. In the bit pair, one bit represents an I component in a complex plane, and the other bit represents a Q component in the complex plane. FIG. 6 is a constellation diagram of QPSK according to an embodiment of this application. The four symbols respectively correspond to different points in the complex plane, and are mapped to points that are corresponding to different symbols and that are in the complex plane by using different values of the bit pair. FIG. 6 shows points that are corresponding to the four symbols of QPSK in any polarization direction and that are in the complex plane. In a manner, a correspondence between a binary bit and a symbol amplitude may be: (0)→−1, and (1)→1. If an I component of a symbol in a polarization direction is (1), and a Q component is (0), the symbol in the polarization direction corresponds to a point 3 in FIG. 6. Further, a phase of the symbol is determined based on the point 3. In another manner, a correspondence between a binary bit and a symbol amplitude may be: (0)→1, and (1)→−1. If an I component of a symbol in a polarization direction is (1), and a Q component is (0), the symbol in the polarization direction corresponds to a point 4 in FIG. 6. Further, a phase of the symbol is determined based on the point 4.

In a process of mapping bit data in the second bit sequence to a modulation symbol, the bit data needs to be first obtained from the second bit sequence, and is determined as a component of the modulation symbol in a complex plane. During specific implementation, the process may be implemented in different manners. In a manner, when the modulation scheme is modulation in dual polarization directions, adjacent pieces of bit data of a specified amount in the second bit sequence may be determined as components of a same modulation symbol in a same polarization direction. In another manner, when the modulation scheme is modulation in dual polarization directions, separated pieces of bit data of a specified amount in the second bit sequence may be determined as components of a same modulation symbol in a same polarization direction.

For example, FIG. 7 is a schematic diagram of a bit sequence according to an embodiment of this application. As shown in FIG. 7, b0 to b7 are bit data of first eight bits in the second bit sequence. If the modulation scheme uses 16QAM modulation in two polarization directions that are an X direction and a Y direction, bit data of four bits needs to be used to perform mapping in each polarization direction. A bit pair (b0, b1) may be determined as an I component of a symbol 0 in the X polarization direction, a bit pair (b2, b3) may be determined as a Q component of the symbol 0 in the X polarization direction, a bit pair (b4, b5) may be determined as an I component of the symbol 0 in the Y polarization direction, a bit pair (b6, b7) may be determined as a Q component of the symbol 0 in the Y polarization direction, and so on. Components corresponding to each symbol are sequentially obtained from the bit sequence. If the modulation scheme uses QPSK modulation in two polarization directions that are an X direction and a Y direction, bit data of two bits needs to be used to perform mapping in each polarization direction. (b0) may be determined as an I component of a symbol 0 in the X polarization direction, (b1) may be determined as a Q component of the symbol 0 in the X polarization direction, (b2) may be determined as an I component of the symbol 0 in the Y polarization direction, and (b3) may be determined as a Q component of the symbol 0 in the Y polarization direction; (b4) may be determined as an I component of a symbol 1 in the X polarization direction, (b5) may be determined as a Q component of the symbol 1 in the X polarization direction, (b6) may be determined as an I component of the symbol 1 in the Y polarization direction, and (b7) may be determined as a Q component of the symbol 1 in the Y polarization direction, and so on. Components corresponding to each symbol are sequentially obtained from the second bit sequence.

It is not difficult to learn that, if the transmit end device uses a manner in which separated pieces of bit data of a specified amount in the second bit sequence are determined as components of a same modulation symbol in a same polarization direction, the bit data in the bit sequence may be further dispersed on a basis of position transformation performed on the bit data, so that a specific burst tolerance capability may be improved. If the transmit end device uses a manner in which adjacent pieces of bit data of a specified amount in the second bit sequence are determined as components of a same modulation symbol in a same polarization direction, consecutive pieces of bit data are mapped to components of a same symbol in this manner. Therefore, in this manner, there is a higher performance requirement on a discreteness degree and an evenness degree of bit data position transformation performed by the transmit end device.

In a process of modulating the second bit sequence, in an optional implementation, adjacent pieces of bit data of a specified amount in the second bit sequence may be determined as components of a same modulation symbol in a same polarization direction.

In an optional implementation, the second bit sequence may be modulated in a dual-polarization quadrature amplitude modulation scheme, or the second bit sequence may be modulated in a dual-polarization quadrature phase shift keying scheme.

In an embodiment, in a process of modulating the second bit sequence in the dual-polarization quadrature phase shift keying scheme, bit data of every four adjacent bits in the second bit sequence may be determined as one first modulation mapping unit in a front-to-back order, and the bit data in each first modulation mapping unit is used to modulate a same modulation symbol. For any first target modulation mapping unit in the first modulation mapping unit, bit data of first two bits in the first target modulation mapping unit may be mapped to a component of a first modulation symbol in an X polarization direction, and bit data of last two bits in the first target modulation mapping unit may be mapped to a component of the first modulation symbol in a Y polarization direction. Further, the first modulation symbol is modulated based on the component of the first modulation symbol in the X polarization direction and the component of the first modulation symbol in the Y polarization direction.

For example, if the second bit sequence is $C_t$, a length of $C_t$ is 172032×4 bits, and $C_t=\{c_{0,0}, c_{0,1}, c_{0,2}, c_{0,3}, c_{1,0}, c_{1,1}, c_{1,2}, c_{1,3}, \ldots, c_{172031,0}, c_{172031,1}, c_{172031,2}, c_{172031,3}\}$, bit data of every four adjacent bits in $C_t$ is determined as one first modulation mapping unit in a front-to-back order, to obtain $C_t=\{\{c_{0,0}, c_{0,1}, c_{0,2}, c_{0,3}\}, \{c_{1,0}, c_{1,1}, c_{1,2}, c_{1,3}\}, \ldots, \{c_{172031,0}, c_{172031,1}, c_{172031,2}, c_{172031,3}\}\}$. For example, $\{c_{0,0}, c_{0,1}, c_{0,2}, c_{0,3}\}$ is one first modulation mapping unit, $\{c_{1,0}, c_{1,1}, c_{1,2}, c_{1,3}\}$ is one first modulation mapping unit, and $\{c_{172031,0}, c_{172031,1}, c_{172031,2}, c_{172031,3}\}$ is one first modulation mapping unit. Optionally, an arrangement order of all bit data in the first modulation mapping unit is the same as an arrangement order of the bit data in the second bit sequence. The bit data in the second bit sequence may be modulated to obtain a modulation symbol sequence $S_t$, where $S_t=\{s_0, s_1, \ldots, s_{172031}\}$.

For any first modulation mapping unit $c_i=\{c_{i,0}, c_{i,1}, c_{i,2}, c_{i,3}\}$, bit data included in the first modulation mapping unit $c_i=\{c_{i,0}, c_{i,1}, c_{i,2}, c_{i,3}\}$ may be correspondingly modulated into one modulation symbol $s_i$, where i is a nonnegative integer less than 172032. $(c_{i,0}, c_{i,1})$ may be determined as a component of the modulation symbol $s_i$ in an X polarization direction, and $(c_{i,2}, c_{i,3})$ may be determined as a component of the modulation symbol $s_i$ in a Y polarization direction. Specifically, $(c_{i,0})$ may be determined as an I component of the modulation symbol $s_i$ in the X polarization direction, $(c_{i,1})$ may be determined as a Q component of the modulation symbol $s_i$ in the X polarization direction, $(c_{i,2})$ may be determined as an I component of the modulation symbol $s_i$ in the Y polarization direction, and $(c_{i,3})$ may be determined as a Q component of the modulation symbol $s_i$ in the Y polarization direction. Further, the symbol $s_i$ is modulated based on the I component of the modulation symbol $s_i$ in the X polarization direction, the Q component of the modulation symbol $s_i$ in the X polarization direction, the I component of the modulation symbol $s_i$ in the Y polarization direction, and the Q component of the modulation symbol $s_i$ in the Y polarization direction.

In another optional specific implementation, in a process of modulating the second bit sequence in the dual-polarization quadrature phase shift keying scheme, bit data of every eight adjacent bits in the second bit sequence may be determined as one second modulation mapping unit in a front-to-back order, and the bit data in each second modulation mapping unit is used to modulate two modulation symbols. For any second target modulation mapping unit in the second modulation mapping unit, bit data of first two bits in the second target modulation mapping unit may be mapped to a component of a second modulation symbol in an X polarization direction, bit data of a third bit and a fourth bit in the second target modulation mapping unit may be mapped to a component of a third modulation symbol in the X polarization direction, bit data of a fifth bit and a sixth bit in the second target modulation mapping unit may be mapped to a component of the second modulation symbol in a Y polarization direction, and bit data of a seventh bit and an eighth bit in the second target modulation mapping unit may be mapped to a component of the third modulation symbol in the Y polarization direction. Further, the second modulation symbol is modulated based on the component of the second modulation symbol in the X polarization direction and the component of the second modulation symbol in the Y polarization direction, and the third modulation symbol is modulated based on the component of the third modulation symbol in the X polarization direction and the component of the third modulation symbol in the Y polarization direction.

For example, if the second bit sequence is $C_t$, a length of $C_t$ is 172032×4 bits, and $C_t=\{c_{0,0}, c_{0,1}, \ldots, c_{0,7}, c_{1,0}, c_{1,1}, c_{1,2}, \ldots, c_{1,7}, \ldots, C_{86015,0}, C_{86015,1}, \ldots, C_{86015,7}\}$, bit data of every eight adjacent bits in $C_t$ is determined as one second modulation mapping unit in a front-to-back order, to obtain $C_t=\{\{c_{0,0}, c_{0,1}, \ldots, c_{0,7}\}, \{c_{1,0}, c_{1,1}, \ldots, c_{1,7}\}, \ldots, \{c_{86015,0}, C_{86015,1}, \ldots, C_{86015,7}\}\}$. For example, $\{c_{0,0}, c_{0,1}, \ldots, c_{0,7}\}$ is one second modulation mapping unit, $\{c_{1,0}, c_{1,1}, \ldots, c_{1,7}\}$ is one second modulation mapping unit, and $\{c_{86015,0}, C_{86015,1}, \ldots, C_{86015,7}\}$ is one second modulation mapping unit. Optionally, an arrangement order of all bit data in the second modulation mapping unit is the same as an arrangement order of the bit data in the second bit sequence. The bit data in the second bit sequence may be modulated to obtain a modulation symbol sequence $S_t$, where $S_t=\{s_0, s_1, \ldots, s_{172031}\}$.

For any second modulation mapping unit $c_i=\{c_{i,0}, c_{i,1}, c_{i,2}, c_{i,3}, c_{i,4}, c_{i,5}, c_{i,6}, c_{i,7}\}$, bit data included in the second modulation mapping unit $c_i=\{c_{i,0}, c_{i,1}, c_{i,2}, c_{i,3}, c_{i,4}, c_{i,5}, c_{i,6}, c_{i,7}\}$ may be correspondingly modulated into two modulation symbols $s_{2i}$ and $s_{2i+1}$, where i is a nonnegative integer less than 86016. $(c_{i,0}, c_{i,1})$ may be determined as a component of the modulation symbol $s_{2i}$ in an X polarization direction, $(c_{i,2}, c_{i,3})$ may be determined as a component of the modulation symbol $s_{2i+1}$ in the X polarization direction, $(c_{i,4}, c_{i,5})$ may be determined as a component of the modulation symbol $s_{2i}$ in a Y polarization direction, and $(c_{i,6}, c_{i,7})$ may be determined as a component of the modulation symbol $s_{2i+1}$ in the Y polarization direction. Specifically, $(c_{i,0})$ may be determined as an I component of the modulation symbol $s_{2i}$ in the X polarization direction, $(c_{i,1})$ may be determined as a Q component of the modulation symbol $s_{2i}$ in the X polarization direction, $(c_{i,2})$ may be determined as an I component of the modulation symbol $s_{2i+1}$ in the X polarization direction, $(c_{i,3})$ may be determined as a Q component of the modulation symbol $s_{2i+1}$ in the X polarization direction, $(c_{i,4})$ may be determined as an I component of the modulation symbol $s_{2i}$ in the Y polarization direction, $(c_{i,5})$ may be determined as a Q component of the modulation symbol $s_{2i}$ in the Y polarization direction, $(c_{i,6})$ may be determined as an I component of the modulation symbol $s_{2i+1}$ in the Y polarization direction, and $(c_{i,7})$ may be determined as a Q component of the modulation symbol $s_{2i+1}$ in the Y polarization direction. Further, the symbol $s_{2i}$ is modulated based on the I component of the modulation symbol $s_{2i}$ in the X polarization direction, the Q component of the modulation symbol $s_{2i}$ in the X polarization direction, the I component of the modulation symbol $s_{2i}$ in the Y polarization direction, and the Q component of the modulation symbol $s_{2i}$ in the Y polarization direction. The symbol $s_{2i+1}$ is modulated based on the I component of the modulation symbol $s_{2i+1}$ in the X polarization direction, the Q component of the modulation symbol $s_{2i+1}$ in the X polarization direction, the I component of the modulation symbol $s_{2i+1}$ in the Y polarization direction, and the Q component of the modulation symbol $s_{2i+1}$ in the Y polarization direction.

In another embodiment, in a process of modulating the second bit sequence in the dual-polarization quadrature amplitude modulation scheme, bit data of every eight adjacent bits in the second bit sequence may be determined as one third modulation mapping unit in a front-to-back order, and the bit data in each third modulation mapping unit is used to modulate a same modulation symbol. For any third target modulation mapping unit in the third modulation mapping unit, bit data of first four bits in the third target modulation mapping unit is mapped to a component of a fourth modulation symbol in an X polarization direction, and bit data of last four bits in the third target modulation mapping unit is mapped to a component of the fourth modulation symbol in a Y polarization direction. Specifically, first two bits in the bit data of the first four bits may be mapped to an I component of the fourth modulation symbol in the X polarization direction, last two bits in the bit data of the first four bits may be mapped to a Q component of the fourth modulation symbol in the X polarization direction, bit data of first two bits in the bit data of the last four bits may be mapped to an I component of the fourth modulation symbol in the Y direction, and bit data of last two bits in the bit data of the last four bits may be mapped to a Q component of the fourth modulation symbol in the Y direction. Further, the fourth modulation symbol is modulated based on the component of the fourth modulation symbol in the X polarization direction and the component of the fourth modulation symbol in the Y polarization direction.

For example, if the second bit sequence is $C_t$, a length of $C_t$ is 172032×8 bits, and $C_t=\{c_{0,0}, c_{0,1}, \ldots, c_{0,7}, c_{1,0}, c_{1,1}, \ldots, c_{1,7}, \ldots, c_{172031,0}, c_{172031,1}, \ldots, c_{172031,7}\}$, bit data of every eight adjacent bits in $C_t$ is determined as one third modulation mapping unit in a front-to-back order, to obtain $C_t=\{\{c_{0,0}, c_{0,1}, \ldots, c_{0,7}\}, \{c_{1,0}, c_{1,1}, \ldots, c_{1,7}\}, \ldots, \{c_{172031,0}, c_{172031,1}, \ldots, c_{172031,7}\}\}$. For example, $\{c_{0,0}, c_{0,1}, \ldots, c_{0,7}\}$ is one third modulation mapping unit, $\{c_{1,0}, c_{1,1}, \ldots, c_{1,7}\}$ is one third modulation mapping unit, and $\{c_{172031,0}, c_{172031,1}, \ldots, c_{172031,7}\}$ is one third modulation mapping unit. Optionally, an arrangement order of all bit data in the third modulation mapping unit is the same as an arrangement order of the bit data in the second bit sequence. The bit data in the second bit sequence may be modulated to obtain a modulation symbol sequence $S_t$, where $S_t=\{s_0, s_1, \ldots, s_{172031}\}$.

For any third modulation mapping unit $c_i=\{c_{i,0}, c_{i,1}, c_{i,2}, c_{i,3}, c_{i,4}, c_{i,5}, c_{i,6}, c_{i,7}\}$, bit data included in the third modulation mapping unit $c_i=\{c_{i,0}, c_{i,1}, c_{i,2}, c_{i,3}, c_{i,4}, c_{i,5}, c_{i,6}, c_{i,7}\}$ may be correspondingly modulated into one modulation symbols $s_i$, where i is a nonnegative integer less than 172032. $(c_{i,0}, c_{i,1}, c_{i,2}, c_{i,3})$ may be determined as a component of the modulation symbol $s_i$ in an X polarization direction, and $(c_{i,4}, c_{i,5}, c_{i,6}, c_{i,7})$ may be determined as a component of the modulation symbol $s_i$ in a Y polarization direction. Specifically, $(c_{i,0}, c_{i,1})$ may be determined as an I component of the modulation symbol $s_i$ in the X polarization direction, $(c_{i,2}, c_{i,3})$ may be determined as a Q component of the modulation symbol $s_i$ in the X polarization direction, $(c_{i,4}, c_{i,5})$ may be determined as an I component of the modulation symbol $s_i$ in the Y polarization direction, and $(c_{i,6}, c_{i,7})$ may be determined as a Q component of the modulation symbol $s_i$ in the Y polarization direction. Further, the symbol $s_i$ is modulated based on the I component of the modulation symbol $s_i$ in the X polarization direction, the Q component of the modulation symbol $s_i$ in the X polarization direction, the I component of the modulation symbol $s_i$ in the Y polarization direction, and the Q component of the modulation symbol $s_i$ in the Y polarization direction.

In operations S201 to S204, the transmit end device encodes the input first bit sequence, to obtain the first matrix; performs, based on the first mapping relationship, position transformation in the orientation of each bit square matrix on the bit data of each bit square matrix in the first matrix, to obtain the second matrix; performs, on the second matrix, bit data position transformation among bit square matrices, to determine the second bit sequence; and further modulates the to-be-sent first symbol sequence based on the second bit sequence. The first mapping relationship indicates the position mapping relationship before and after position transformation of each piece of bit data in the bit square matrix range, and includes the row transformation mapping relationship and the column transformation mapping relationship. The row transformation mapping relationship is constrained by using the global offset constraint factor and the at least two local offset constraint factors. The global offset constraint factor is used to constrain the position offset of row transformation of each piece of bit data in the bit square matrix. The local offset constraint factor is used to constrain the position offsets of row transformation of bit data located in some bit rows in the bit square matrix. Position offsets of row transformation of bit data in different bit rows are constrained in a targeted and diversified manner by using the global offset constraint factor and the at least two local offset constraint factors, so that position transformation is more discretely and evenly performed on the bit data in the first matrix, thereby improving a burst tolerance capability of information transmission.

In operation S205, the transmit end device sends the first symbol sequence to the receive end device.

In an embodiment, the transmit end device may send the first symbol sequence to the receive end device by using an optical network transmission channel.

In operation S206, the receive end device demodulates the first symbol sequence, to obtain a fourth matrix.

A manner in which the receive end device demodulates the received first symbol sequence is a demodulation scheme corresponding to the modulation scheme used by the transmit end device to modulate the first symbol sequence. For example, if the transmit end device modulates the first symbol sequence in the QAM modulation scheme, the receive end device also demodulates the received first symbol sequence in a QAM demodulation scheme. If the transmit end device modulates the first symbol sequence in the QPSK modulation scheme, the receive end device also demodulates the received first symbol sequence in a QPSK demodulation scheme.

The first symbol sequence includes a plurality of modulation symbols. The receive end device demodulates each modulation symbol to obtain a component corresponding to each modulation symbol in a complex plane, and further determines corresponding bit data based on the component in the complex plane. In different modulation schemes, an amount of bit data corresponding to one modulation symbol is different.

For example, if the demodulation scheme is the QAM demodulation scheme, for any modulation symbol, the receive end device determines, based on a corresponding phase and amplitude of the modulation symbol, a point corresponding to the modulation symbol in the complex plane; further determines an I component and a Q component that are corresponding to the point in the complex plane; determines, based on an amplitude of the I component and a preset mapping relationship between an amplitude and a binary bit pair, a bit pair corresponding to the I component; and determines a bit pair corresponding to the Q component in a same manner. The bit pairs respectively corresponding to the I component and the Q component are data of four bits corresponding to the symbol. The preset mapping relationship between an amplitude and a binary bit pair is the same as a mapping relationship that is between an amplitude and a binary bit pair and that is used when the transmit end device modulates the first symbol sequence.

For another example, if the demodulation scheme is QPSK, for any modulation symbol, the receive end device determines, based on a corresponding phase of the modulation symbol, a point corresponding to the modulation symbol in the complex plane; further determines an I component and a Q component that are corresponding to the point in the complex plane; determines, based on an amplitude of the I component and a preset mapping relationship between an amplitude and a binary bit, bit data corresponding to the I component; and determines bit data corresponding to the Q component in a same manner. Bits respectively corresponding to the I component and the Q component are data of two bits corresponding to the symbol. The preset mapping relationship between an amplitude and a binary bit is the same as a mapping relationship that is between an amplitude and a binary bit and that is used when the transmit end device modulates the first symbol sequence.

After the bit data corresponding to the modulation symbol is determined, the receive end device needs to place the bit data corresponding to each modulation symbol into a demodulated bit sequence. There are a plurality of different placement manners herein. For example, when the demodulation scheme is demodulation in dual polarization directions, in a manner, components of a same modulation symbol in a same polarization direction may be placed at adjacent positions in the demodulated bit sequence. In another manner, components of a same modulation symbol in a same polarization direction may be placed at separated positions in the demodulated bit sequence.

After the modulation symbols in the first symbol sequence are demodulated, the obtained demodulated bit sequence is converted into a form of a matrix for processing. Specifically, the receive end device includes an inter-block deinterleaving cache matrix whose size is the same as the size of the inter-block interleaving deinterleaving matrix of the transmit end device. The inter-block deinterleaving matrix may be divided into bit square matrices of a same size in a manner the same as the manner in which the inter-block interleaving cache matrix is divided into bit square matrices. The receive end device may divide the demodulated bit sequence into different groups based on an amount of bit data accommodated in the inter-block deinterleaving cache matrix, and sequentially place the groups into the deinterleaving cache matrix for processing. For example, a length of the demodulated bit sequence is 172032×Z bits, and the inter-block deinterleaving matrix may accommodate a data volume of 172032 bits. The demodulated bit sequence may be divided into Z groups, and bit data of 172032 bits is processed in each group. The processing is cyclically performed for Z times on one demodulated bit sequence.

An inter-block deinterleaving cache matrix whose size is 1344 bit rows×128 bit columns is used as an example to describe a manner in which the receive end device determines a fourth matrix corresponding to each group in the demodulated bit sequence. The inter-block deinterleaving cache matrix may be divided into a zeroth square matrix set, a first square matrix set, a second square matrix set, and a third square matrix set in advance. The zeroth square matrix set includes 2a square matrix rows of the inter-block deinterleaving cache matrix, where a is a nonnegative integer less than 21. The first square matrix set includes 2b+1 square matrix rows of the inter-block deinterleaving cache matrix, where b is a nonnegative integer less than 21. The second square matrix set includes 2c square matrix rows of the inter-block deinterleaving cache matrix, where c is an integer greater than 20 and less than 42. The third square matrix set includes 2d square matrix rows of the inter-block deinterleaving cache matrix, where d is an integer greater than 20 and less than 42. A manner of dividing the inter-block deinterleaving cache matrix into square matrix sets is similar to the manner of dividing the inter-block interleaving cache matrix into square matrix sets, and the matrix in FIG. 4 may also be considered as an inter-block deinterleaving cache matrix divided into square matrix sets.

The inter-block deinterleaving cache matrix is filled with bit data by using a column as a unit. Bit columns are sequentially filled in a left-to-right order in the inter-block deinterleaving cache matrix, and each time after a bit column is filled, an adjacent bit column on a right side continues to be filled, until all bit columns in the inter-block deinterleaving cache matrix are filled.

A specific process of filling each bit column with bit data may be: obtaining bit data of first eight bits from the bit sequence, and sequentially filling uppermost eight bit rows of a square matrix row 0 in the bit column with the bit data of the first eight bits; obtaining bit data of a ninth bit to a $16^{th}$ bit from the bit sequence, and sequentially filling uppermost eight bit rows of a square matrix row 1 in the bit column with the bit data of the ninth bit to the $16^{th}$ bit; obtaining bit data of a $17^{th}$ bit to a $24^{th}$ bit from the bit sequence, and sequentially filling uppermost eight bit rows of a square matrix row 42 in the bit column with the bit data of the $17^{th}$ bit to the $24^{th}$ bit; obtaining bit data of a $25^{th}$ bit to a $32^{nd}$ bit from the bit sequence, and sequentially filling uppermost eight bit rows of a square matrix row 43 in the bit column with the bit data of the $25^{th}$ bit to the $32^{nd}$ bit; obtaining bit data of a $33^{rd}$ bit to a $40^{th}$ bit from the bit sequence, and sequentially filling lowermost eight bit rows of the square matrix row 0 in the bit column with the bit data of the $33^{rd}$ bit to the $40^{th}$ bit; obtaining bit data of a $41^{st}$ bit to a $48^{th}$ bit from the bit sequence, and sequentially filling lowermost eight bit rows of the square matrix row 1 in the bit column with the bit data of the $41^{st}$ bit to the $48^{th}$ bit; obtaining bit data of a $49^{th}$ bit to a $56^{th}$ bit from the bit sequence, and sequentially filling lowermost eight bit rows of the square matrix row 42 in the bit column with the bit data of the $49^{th}$ bit to the $56^{th}$ bit; obtaining bit data of a $57^{th}$ bit to a $64^{th}$ bit from the bit sequence, and sequentially filling lowermost eight bit rows of the square matrix row 43 in the bit column with the bit data of the $57^{th}$ bit to the $64^{th}$ bit, and so on. Filling with bit data of eight bits sequentially obtained from the bit sequence is cyclically performed in an order of the zeroth square matrix set, the first square matrix set, the second square matrix set, and the third square matrix set. Each time when each square matrix set is filled with bit data of eight bits, uppermost eight bit rows in unfilled bit rows of the square matrix set in the bit column are filled with the bit data of eight bits, until the inter-block deinterleaving cache matrix is fully filled, to obtain the fourth matrix corresponding to the group.

In operation S207, the receive end device performs, on the fourth matrix, bit data position transformation among bit square matrices, to obtain a fifth matrix.

The receive end device further includes two intra-block deinterleaving cache matrices (denoted by I'0 and I'1). The intra-block deinterleaving cache matrix may also be divided into bit square matrices having the same size as the bit square matrices of the inter-block deinterleaving cache matrix. A quantity of square matrix rows in the intra-block deinterleaving cache matrix is z/2 times a quantity of square matrix rows in the inter-block deinterleaving cache matrix, and a quantity of bit columns in the intra-block deinterleaving cache matrix is the same as a quantity of bit columns in the inter-block deinterleaving cache matrix. After determining a fourth matrix of any group in a demodulated encoding matrix, the receive end device sequentially fills uppermost square matrix rows in unfilled square matrix rows in I'0 with bit data of even-numbered square matrix rows in the fourth matrix, and sequentially fills uppermost square matrix rows in unfilled square matrix rows in I'1 with bit data of odd-numbered square matrix rows in the fourth matrix. After the filling process of the inter-block deinterleaving cache matrix is performed for Z times, I'0 and I'1 are separately fully filled, to complete position transformation among bit square matrices on bit data of bit square matrices in the fourth matrix. The fully filled I'0 and I'1 are obtained fifth matrices.

In operation S208, the receive end device performs, based on a second mapping relationship, position transformation in an orientation of each bit square matrix on bit data of each bit square matrix in the fifth matrix, to obtain a sixth matrix after the transformation.

For any fifth matrix, the receive end device obtains any bit square matrix in the fifth matrix, and performs, by using the bit square matrix as a unit, bit data position transformation in a range of the bit square matrix, to obtain a sixth matrix after bit data position transformation in the bit square matrix is performed on each bit square matrix. During specific implementation, the receive end device may perform bit data position transformation in the bit square matrix range based on a preset second mapping relationship. The second mapping relationship may be the same as the first mapping relationship used when the transmit end device performs bit data position transformation in the bit square matrix range, or may be a mapping relationship that is opposite to the first mapping relationship used when the transmit end device performs bit data position transformation in the bit square matrix range.

For example, if the second mapping relationship is the same as the first mapping relationship used when the transmit end device performs bit data position transformation in the bit square matrix range, and if the first mapping relationship in the transmit end device indicates to transform bit data at a position of a bit row 0 and a bit column 2 to a position of a bit row 1 and a bit column 4 in the bit square matrix, the second mapping relationship (also the first mapping relationship) in the receive end device indicates to transform bit data at the position of the bit row 1 and the bit column 4 in the bit square matrix to the position of the bit row 0 and the bit column 2. If the second mapping relationship is the mapping relationship that is opposite to the first mapping relationship used when the transmit end device performs bit data position transformation in the bit square matrix range, and if the first mapping relationship in the transmit end device includes indication information that indicates to transform bit data at a position of a bit row 0 and a bit column 2 to a position of a bit row 1 and a bit column 4 in the bit square matrix, the second mapping relationship necessarily includes indication information that indicates to transform bit data at the position of the bit row 1 and the bit column 4 in the bit square matrix to the position of the bit row 0 and the bit column 2 in the bit square matrix.

That is, a row transformation mapping relationship in the second mapping relationship may also be constrained by using a global offset constraint factor and at least two local offset constraint factors. In an optional manner, the row transformation mapping relationship may be further constrained by using a start offset parameter. It may be understood that, in the second mapping relationship herein, values of the constraint parameters are equal to values of the constraint parameters of the first mapping relationship in the transmit end device.

In an optional manner, the global offset constraint factor, the local offset constraint factors, and the start offset parameter constrain the row transformation mapping relationship of the second mapping relationship by using the following formula:

$$r_0 = \{c_1 + g \times r_1 + \Sigma_{k=2}^m \{\beta_{k-2} \times \lfloor r_1/(2^{(k-1)}) \rfloor\} + \alpha\} \% (2^m) \quad \text{Formula (9)}$$

Herein, $r_0$ is a row identifier corresponding to first bit data in the bit square matrix after position transformation in the bit square matrix range, and the first bit data is any bit data in the bit square matrix of the fifth matrix; $r_1$ is a row identifier corresponding to the first bit data before position transformation in the bit square matrix range; $c_1$ is a column identifier corresponding to the first bit data before position transformation in the bit square matrix range; g is the global offset constraint factor, β is the local offset constraint factor, α is the start offset parameter, and g, β, and α are all preset integers; and k is an index identifier of β, a value of g is determined based on $2^p$, and p is an integer greater than 1.

In an embodiment, the second mapping relationship further includes a column transformation mapping relationship, and the column transformation mapping relationship is constrained by using the following formula:

$$c_0 = \{c_1 + h \times r_1 + \Sigma_{v=2}^n \{\gamma_{w-2} \times \lfloor r_1/(2^{(w-1)}) \rfloor\} + \theta\} \% (2 \quad m) \quad \text{Formula (10)}$$

Herein, $c_0$ is a column identifier corresponding to the first bit data after position transformation in the bit square matrix range; $r_1$ is a row identifier corresponding to the first bit data before position transformation in the bit square matrix range; $c_1$ is a column identifier corresponding to the first bit data before position transformation in the bit square matrix range; and h, γ, and θ are all preset integers, and w is an index identifier of γ.

Values of parameters in the formula (9) and the formula (10) are correspondingly the same as value ranges of the parameters in the formulas that constrain the first mapping relationship in the transmit end device. For example, a value of β in the formula (9) may also meet corresponding descriptions in Table 1 and Table 2. Details are not described herein. In addition, the formula (9) and the formula (10) are also merely constraint forms of the row transformation mapping relationship and the column transformation mapping relationship in the second mapping relationship respectively, and other transformed formulas corresponding to the formulas should also fall within the protection scope of this application.

In operation S209, the receive end device performs decoding based on the sixth matrix, to obtain a third bit sequence.

After a sixth matrix corresponding to any fifth matrix is determined, the sixth matrix is processed into a form of a decoded bit sequence, to perform decoding. Specifically, for the sixth matrix, bit data is read by using every two square matrix rows as a unit, and when bit data of the two square matrix rows is read, the bit data is read by square matrix columns. When a bit square matrix in a square matrix column is read, bit rows in the bit square matrix are sequentially read. According to this method, all bit data in the obtained sixth matrix is sequentially read, to obtain a corresponding third bit sequence.

A process in which the receive end device reads the bit sequence from the sixth matrix is opposite to a process in which the transmit end device converts the encoded first bit sequence into the matrix form. Refer to FIG. 3. The matrix shown in FIG. 3 may be considered as the sixth matrix corresponding to the receive end device. A numeral in the matrix in FIG. 3 may be considered as an order that is of bit data at a corresponding position and that is in the bit sequence after the bit data is read. For example, in the bit square matrix located in the square matrix row 0 and the square matrix column 0 in FIG. 3, bit data in a first bit row is sequentially placed at positions of bits 0 to 15 in the decoded bit sequence after being read (the bit 0 represents a first bit in the bit sequence), bit data in a second bit row is sequentially placed at positions of bits 16 to 31 in the decoded bit sequence after being read, and reading is sequentially performed, until bit data in a $16^{th}$ bit row is sequentially placed at positions of bits 240 to 255 in the decoded bit sequence after being read, so that all bit data in the bit square matrix located in the square matrix row 0 and the square matrix column 0 is read. Further, in the same manner, bit data in the bit square matrix located in the square matrix row 1 and the square matrix column 0 is read (the bit data in the bit square matrix is placed at positions 256 to 511 in the bit sequence), bit data in the bit square matrix located in the square matrix row 0 and the square matrix column 1 is read (the bit data in the bit square matrix is placed at positions 512 to 767 in the decoded bit sequence), and so on, until bit data in a bit square matrix located in the square matrix row 1 and a square matrix column 7 is placed at positions 3840 to 4095 in the decoded bit sequence after being read. In the same manner, reading is performed by using every two square matrix rows as a unit, until all bit data in the matrix is read, so that the third bit sequence is obtained.

After the third bit sequence is determined, the receive end device decodes the third bit sequence, to restore information that needs to be transmitted by the transmit end device. A decoding scheme of the third bit sequence matches an encoding scheme of the transmit end device.

In operations S206 to S209, after demodulating the received first symbol sequence, the receive end device determines the fourth matrix based on the demodulated bit sequence; performs, on the fourth matrix, bit data position transformation among bit square matrices, to obtain the fifth matrix; further performs, based on the second mapping relationship, position transformation in the orientation of each bit square matrix on the bit data of each bit square matrix in the fifth matrix, to obtain the sixth matrix after the transformation; and performs decoding based on the sixth matrix, to obtain the third bit sequence. The second mapping relationship may be the same as the first mapping relationship used when the transmit end device performs bit data position transformation in the bit square matrix range, or may be the mapping relationship that is opposite to the first mapping relationship used when the transmit end device performs bit data position transformation in the bit square matrix range. The second mapping relationship is constrained by using a global offset constraint factor and at least two local offset constraint factors. Information data that originally belongs to a same matrix row (that is, belongs to a same matrix row before the transmit end device performs bit data position transformation in the bit square matrix) and that is dispersed to positions of different rows in the matrix (dispersed to positions of different rows in the matrix after the transmit end device performs bit data position transformation in the bit square matrix) is restored to the same matrix row, so that the information is restored, and burst errors that may occur in an information transmission process are evenly dispersed and transformed into random errors, thereby reducing a bit error rate of information transmission.

Figure 8:
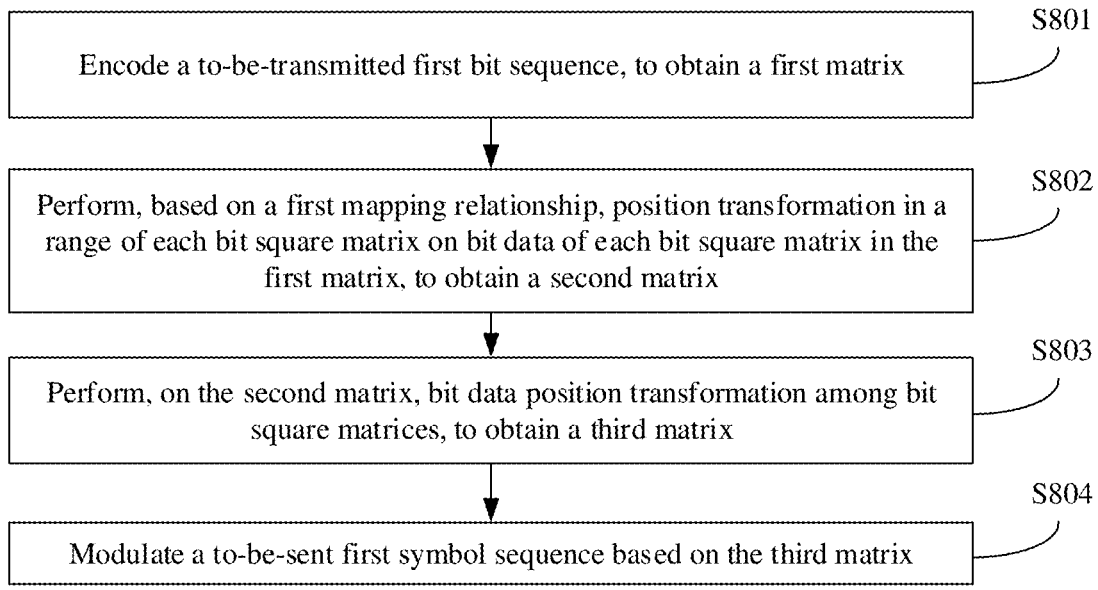
FIG. 8 is a schematic flowchart of another communication method according to an embodiment of this application.

FIG. 8 is a schematic flowchart of another communication method according to an embodiment of this application. The communication method may be performed by a transmit end device in a communication network. As shown in FIG. 8, the method may include operations S801 to S804.

In operation S801, a to-be-transmitted first bit sequence is encoded, to obtain a first matrix.

The first matrix includes a plurality of bit square matrices of a same size, and each bit square matrix includes a plurality of pieces of bit data.

In an embodiment, the to-be-transmitted first bit sequence is encoded to obtain two parallel bit sequences, and the parallel bit sequences are converted into a matrix form to obtain first matrices. For a specific implementation, refer to the specific implementation in operation S201 in the embodiment corresponding to FIG. 2. Details are not described herein.

In an embodiment, the parallel bit sequences may be obtained by using an encoder in the transmit end device, and the first matrix may be obtained by using an interleaver in the transmit end device.

In operation S802, position transformation in a range of each bit square matrix on the bit data of each bit square matrix in the first matrix is performed based on a first mapping relationship, to obtain a second matrix.

The first mapping relationship indicates a position mapping relationship before and after position transformation of each piece of bit data in the bit square matrix range, and includes a row transformation mapping relationship. The row transformation mapping relationship is constrained by using a global offset constraint factor and at least two local offset constraint factors. The global offset constraint factor is used to constrain a position offset of row transformation of each piece of bit data in the bit square matrix. The local offset constraint factor is used to constrain position offsets of row transformation of bit data located in some bit rows in the bit square matrix.

For a specific implementation, refer to the specific implementation in operation S202 in the embodiment corresponding to FIG. 2. Details are not described herein.

In an embodiment, the second matrix may be obtained by using the interleaver in the transmit end device.

In operation S803, bit data position transformation among bit square matrices is performed on the second matrix, to obtain a third matrix.

For a specific execution manner, refer to the specific implementation in operation S203 in the embodiment corresponding to FIG. 2. Details are not described herein. In an embodiment, the third matrix may be obtained by using the interleaver in the transmit end device.

In operation S804, a to-be-sent first symbol sequence is modulated based on the third matrix.

In an embodiment, after the third matrix is obtained, the third matrix is converted into a bit sequence form, to obtain a second bit sequence. Further, modulation is performed based on the second bit sequence, to obtain the first symbol sequence. For a specific execution manner, refer to the specific implementation in operation S204 in the embodiment corresponding to FIG. 2. Details are not described herein.

In an embodiment, the second bit sequence may be obtained by using the interleaver in the transmit end device, and the first symbol sequence may be obtained by using a modulator in the transmit end device.

In an embodiment of this application, the transmit end device encodes the input first bit sequence, to obtain the first matrix; performs, based on the first mapping relationship, position transformation in the orientation of each bit square matrix on the bit data of each bit square matrix in the first matrix, to obtain the second matrix; performs, on the second matrix, bit data position transformation among bit square matrices, to determine the second bit sequence; and further modulates the to-be-sent first symbol sequence based on the second bit sequence. The first mapping relationship indicates the position mapping relationship before and after position transformation of each piece of bit data in the bit square matrix range, and includes the row transformation mapping relationship and a column transformation mapping relationship. The row transformation mapping relationship is constrained by using the global offset constraint factor and the at least two local offset constraint factors. The global offset constraint factor is used to constrain the position offset of row transformation of each piece of bit data in the bit square matrix. The local offset constraint factor is used to constrain the position offsets of row transformation of bit data located in some bit rows in the bit square matrix. Position offsets of row transformation of bit data in different bit rows are constrained in a targeted and diversified manner by using the global offset constraint factor and the at least two local offset constraint factors, so that position transformation is more discretely and evenly performed on the bit data in the first matrix, thereby improving a burst tolerance capability of information transmission.

Figure 9:
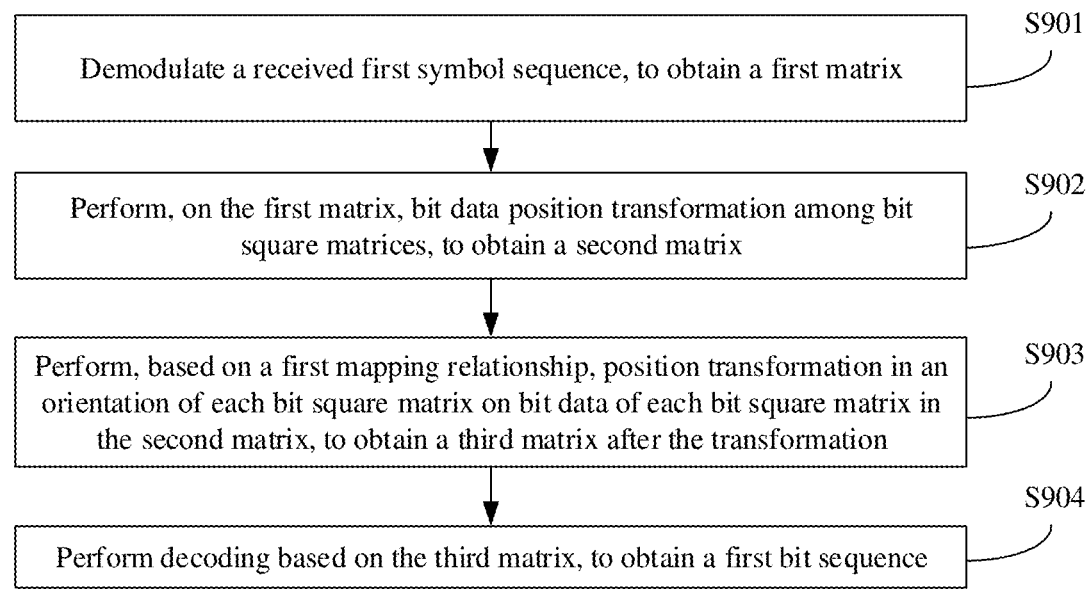
FIG. 9 is a schematic flowchart of another communication method according to an embodiment of this application.

FIG. 9 is a schematic flowchart of another communication method according to an embodiment of this application. The method may be performed by a receive end device in a communication network. As shown in FIG. 9, the method may include operations S901 to S904.

In operation S901, a received first symbol sequence is demodulated to obtain a first matrix.

The first matrix includes a plurality of bit square matrices of a same size, and each bit square matrix includes a plurality of pieces of bit data.

The receive end device demodulates the first symbol sequence to obtain a demodulated bit sequence, and further converts the demodulated bit sequence into a matrix form to obtain the first matrix. For a specific implementation, refer to the specific implementation of demodulating the first symbol sequence to obtain a fourth matrix in operation S206 in the embodiment corresponding to FIG. 2. Details are not described herein.

In an embodiment, the first matrix may be obtained by using a demodulator in the receive end device.

In operation S902, bit data position transformation among bit square matrices is performed on the first matrix to obtain a second matrix.

For a specific implementation, refer to the specific implementation of performing, on the fourth matrix, bit data position transformation among bit square matrices to obtain a fifth matrix in operation S207 in the embodiment corresponding to FIG. 2. Details are not described herein. In an embodiment, the second matrix may be obtained by using a deinterleaver in the receive end device.

In operation S903, position transformation in an orientation of each bit square matrix on bit data of each bit square matrix in the second matrix is performed based on a first mapping relationship to obtain a third matrix after the transformation.

The first mapping relationship indicates a position mapping relationship before and after position transformation of each piece of bit data in the bit square matrix range, and includes a row transformation mapping relationship. The row transformation mapping relationship is constrained by using a global offset constraint factor and at least two local offset constraint factors. The global offset constraint factor is used to constrain a position offset of row transformation of each piece of bit data in the bit square matrix. The local offset constraint factor is used to constrain position offsets of row transformation of bit data located in some bit rows in the bit square matrix.

For a specific implementation, refer to the specific implementation of performing, based on a second mapping relationship, position transformation in an orientation of each bit square matrix on bit data of each bit square matrix in the fifth matrix, to obtain a sixth matrix after the transformation in operation S208 in the embodiment corresponding to FIG. 2. Details are not described herein.

In an embodiment, the third matrix may be obtained by using the deinterleaver in the receive end device.

In operation S904, decoding is performed based on the third matrix to obtain a first bit sequence.

The third matrix is converted into a bit sequence form, to obtain a decoded bit sequence. Further, decoding is performed on the decoded bit sequence, to obtain the first bit sequence. For a specific implementation, refer to the specific implementation of performing decoding based on the sixth matrix to obtain a third bit sequence in operation S209 in the embodiment corresponding to FIG. 2. Details are not described herein.

In an embodiment, the decoded bit sequence may be obtained by using the deinterleaver in the receive end device, and the first bit sequence may be obtained by using a decoder in the receive end device.

In this embodiment of this application, after demodulating the received first symbol sequence, the receive end device determines the fourth matrix based on the demodulated bit sequence; performs, on the fourth matrix, bit data position transformation among bit square matrices, to obtain the fifth matrix; further performs, based on the second mapping relationship, position transformation in the orientation of each bit square matrix on the bit data of each bit square matrix in the fifth matrix, to obtain the sixth matrix after the transformation; and performs decoding based on the sixth matrix, to obtain the third bit sequence. The second mapping relationship may be the same as the first mapping relationship used when the transmit end device performs bit data position transformation in the bit square matrix range, or may be a mapping relationship that is opposite to the first mapping relationship used when the transmit end device performs bit data position transformation in the bit square matrix range. The second mapping relationship is constrained by using a global offset constraint factor and at least two local offset constraint factors. Information data that originally belongs to a same matrix row (that is, belongs to a same matrix row before the transmit end device performs bit data position transformation in the bit square matrix) and that is dispersed to positions of different rows in the matrix (dispersed to positions of different rows in the matrix after the transmit end device performs bit data position transformation in the bit square matrix) is restored to the same matrix row, so that the information is restored, and burst errors that may occur in an information transmission process are evenly dispersed and transformed into random errors, thereby reducing a bit error rate of information transmission.

Figure 10:
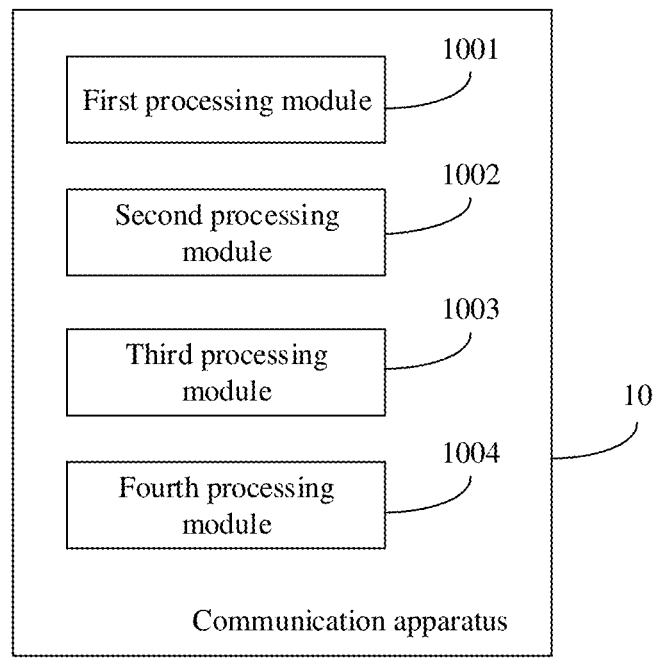
FIG. 10 is a schematic diagram of a structure of a communication apparatus according to an embodiment of this application.

An embodiment of this application provides a communication apparatus. The communication apparatus may be a transmit end device or a component that may be used in the transmit end device. The communication apparatus may include a module or a unit, to implement operations S201 to S205 in FIG. 2 or implement the communication method in FIG. 8. In a possible manner, the communication method may be implemented by a first processing module, a second processing module, a third processing module, and a fourth processing module. The first processing module, the second processing module, the third processing module, and the fourth processing module may be physically independent of each other, or may be integrated into a same module. The first processing module, the second processing module, the third processing module, and the fourth processing module may be respectively logical modules divided based on functions, or may be respectively corresponding hardware modules. When the first processing module, the second processing module, the third processing module, and the fourth processing module are logical modules. FIG. 10 is a schematic diagram of a structure of a communication apparatus according to an embodiment of this application. As shown in FIG. 10, the communication apparatus 100 includes a first processing module 1001, a second processing module 1002, a third processing module 1003, and a fourth processing module 1004.

The first processing module 1001 is configured to encode a to-be-transmitted first bit sequence, to obtain a first matrix. The first matrix includes a plurality of bit square matrices of a same size, and each bit square matrix includes a plurality of pieces of bit data.

The second processing module 1002 is configured to perform, based on a first mapping relationship, position transformation in a range of each bit square matrix on the bit data of each bit square matrix in the first matrix, to obtain a second matrix. The first mapping relationship indicates a position mapping relationship before and after position transformation of each piece of bit data in the bit square matrix range, and includes a row transformation mapping relationship. The row transformation mapping relationship is constrained by using a global offset constraint factor and at least two local offset constraint factors. The global offset constraint factor is used to constrain a position offset of row transformation of each piece of bit data in the bit square matrix. The local offset constraint factor is used to constrain position offsets of row transformation of bit data located in some bit rows in the bit square matrix.

The third processing module 1003 is configured to perform, on the second matrix, bit data position transformation among bit square matrices, to obtain a second bit sequence.

The fourth processing module 1004 is configured to modulate a to-be-sent first symbol sequence based on the second bit sequence.

In an optional manner, the row transformation mapping relationship is further constrained by using a start offset parameter, and the start offset parameter is used to constrain a start position at which position transformation is performed on the bit data in the bit square matrix based on a position offset.

In an optional manner, when quantities of rows and columns of the bit square matrix included in the first matrix are both $2^m$, there are m−1 local offset constraint factors, where m is an integer greater than 3.

The global offset constraint factor, the local offset constraint factors, and the start offset parameter constrain the row transformation mapping relationship by using the following formula:

$$r_0 = \{c_1 + g \times r_1 + \Sigma_{k=2}^{m}\{\beta_{k-2} \times \lfloor r_1/(2^{(k-1)}) \rfloor\} + \alpha\} \% (2^m).$$

Herein, $r_0$ is a row identifier corresponding to first bit data in the bit square matrix before position transformation in the bit square matrix range, and the first bit data is any bit data in the bit square matrix; $r_1$ is a row identifier corresponding to the first bit data after position transformation in the bit square matrix range; $c_1$ is a column identifier corresponding to the first bit data after position transformation in the bit square matrix range; g is the global offset constraint factor, β is the local offset constraint factor, α is the start offset parameter, and g, β, and α are all preset integers; and k is an index identifier of β, a value of g is determined based on $2^p$, and p is an integer greater than 1.

In an optional manner, when m=4, g∈{−8, −4, 4}, and \$2E {−7, −5, −3, −1, 1, 3, 5, 7}.

When g=−8, values of $\beta_0$ and $\beta_1$ are one of the following combinations: {$\beta_0$=−6, $\beta_1$=−8}, {$\beta_0$=−6, $\beta_1$=0}, {$\beta_0$=−4, $\beta_1$=−6}, {$\beta_0$=−4, $\beta_1$=−2}, {$\beta_0$=−4, $\beta_1$=2}, {$\beta_0$=−4, $\beta_1$=6}, {$\beta_0$=−2, $\beta_1$=−8}, {$\beta_0$=−2, $\beta_1$=0}, {$\beta_0$=2, $\beta_1$=−8}, {$\beta_0$=2, $\beta_1$=0}, {$\beta_0$=4, $\beta_1$=−6}, {$\beta_0$=4, $\beta_1$=−2}, {$\beta_0$=4, $\beta_1$=2}, {$\beta_0$=4, $\beta_1$=6}, {$\beta_0$=6, $\beta_1$=−8}, and {$\beta_0$=6, $\beta_1$=0}.

When g=−4 or g=4, the values of $\beta_0$ and $\beta_1$ are one of the following combinations: {$\beta_0$=−6, $\beta_1$=4}, {$\beta_0$=−2, $\beta_1$=−4}, {$\beta_0$=0, $\beta_1$=−6}, {$\beta_0$=0, $\beta_1$=−2}, {$\beta_0$=0, $\beta_1$=2}, {$\beta_0$=0, $\beta_1$=6}, {$\beta_0$=2, $\beta_1$=4}, and {$\beta_0$=6, $\beta_1$=−4}.

In an optional manner, the first mapping relationship further includes a column transformation mapping relationship, and the column transformation mapping relationship is constrained by using the following formula:

$$c_0 = \{c_1 + h \times r_1 + \Sigma_{w=2}^{m}\{\gamma_{w-2} \times \lfloor r_1/(2^{(w-1)}) \rfloor\} + \theta\} \% (2^m).$$

Herein, $c_0$ is a column identifier corresponding to the first bit data before position transformation in the bit square matrix range; $r_1$ is the row identifier corresponding to the first bit data after position transformation in the bit square matrix range; $c_1$ is the column identifier corresponding to the first bit data after position transformation in the bit square matrix range; and h, γ, and θ are all preset integers, and w is an index identifier of γ.

In an optional manner, when a value of m is 4, a value of g is −4, a value of $\beta_0$ is 0, a value of $\beta_1$ is −2, a value of $\beta_2$ is 3, a value of α is 0, a value of h is −2, a value of $\gamma_0$ is 0, a value of $\gamma_1$ is 7, a value of $\gamma_2$ is −7, and a value of θ is 0.

In an optional manner, the fourth processing module 1004 is configured to:
determine a to-be-modulated first bit sequence based on the third matrix;
determine bit data of every four adjacent bits in the first bit sequence as one first modulation mapping unit in a front-to-back order, where the bit data in each first modulation mapping unit is used to modulate a same modulation symbol; map bit data of first two bits in a first target modulation mapping unit to a component of a first modulation symbol in an X polarization direction, and map bit data of last two bits in the first target modulation mapping unit to a component of the first modulation symbol in a Y polarization direction, where the first target modulation mapping unit is any first modulation mapping unit; and
modulate the first modulation symbol based on the component of the first modulation symbol in the X polarization direction and the component of the first modulation symbol in the Y polarization direction.

In an optional manner, the fourth processing module 1004 is configured to:
determine a to-be-modulated second bit sequence based on the third matrix;
determine bit data of every eight adjacent bits in the second bit sequence as one second modulation mapping unit in a front-to-back order, where the bit data in each second modulation mapping unit is used to modulate two modulation symbols;
map bit data of first two bits in a second target modulation mapping unit to a component of a second modulation symbol in an X polarization direction, map bit data of a third bit and a fourth bit in the second target modulation mapping unit to a component of a third modulation symbol in the X polarization direction, map bit data of a fifth bit and a sixth bit in the second target modulation mapping unit to a component of the second modulation symbol in a Y polarization direction, and map bit data of a seventh bit and an eighth bit in the second target modulation mapping unit to a component of the third modulation symbol in the Y polarization direction, where the second target modulation mapping unit is any second modulation mapping unit;
modulate the second modulation symbol based on the component of the second modulation symbol in the X polarization direction and the component of the second modulation symbol in the Y polarization direction; and
modulate the third modulation symbol based on the component of the third modulation symbol in the X polarization direction and the component of the third modulation symbol in the Y polarization direction.

In an optional manner, the first mapping relationship is indicated by using a first mapping table. The first mapping table includes 256 table cells, and there is corresponding mapping position data in each table cell. A first table cell is a table cell in the first mapping table, and mapping position data in the first table cell is (s, t), where s and t are both integers greater than or equal to 0 and less than 16, and (s, t) indicates a position that is of bit data stored in the first table cell and that is before position transformation in the bit square matrix range.

The first mapping table includes:

| | | | | | | | |
|---|---|---|---|---|---|---|---|
| (0, 0) | (1, 1) | (2, 2) | (3, 3) | (4, 4) | (5, 5) | (6, 6) | (7, 7) |
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |

-continued

| | | | | | | | |
|---|---|---|---|---|---|---|---|
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |

| | | | | | | | |
|---|---|---|---|---|---|---|---|
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) |

Figure 11:
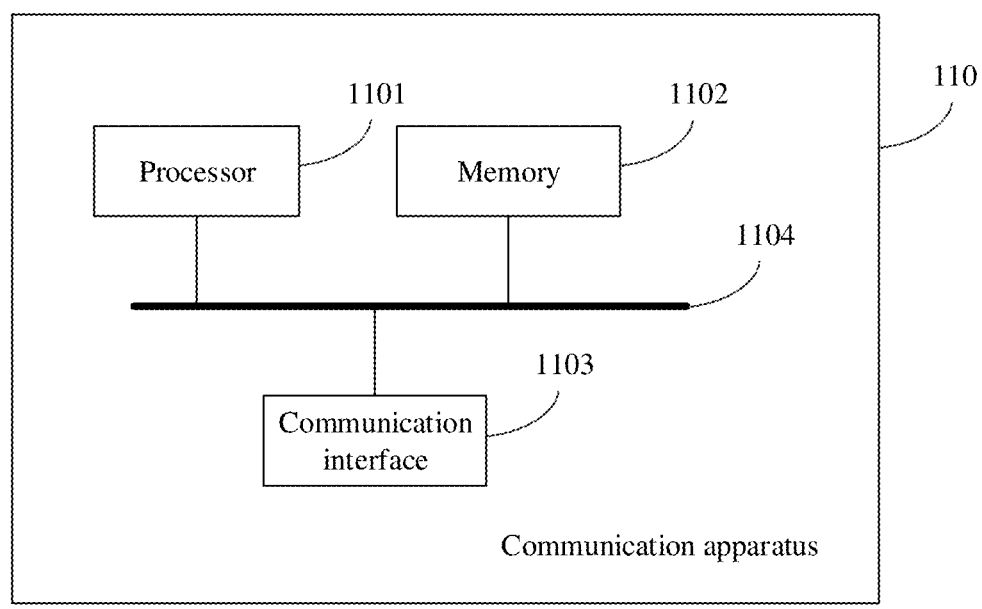
FIG. 11 is a schematic diagram of a structure of another communication apparatus according to an embodiment of this application.

FIG. 11 shows a possible structure of the communication apparatus.

FIG. 11 is a schematic diagram of a structure of another communication apparatus according to an embodiment of this application. As shown in FIG. 11, the communication apparatus 110 may include one or more processors 1101, a memory 1102, and a communication interface 1103. The components may be connected by using a bus 1104 or in another manner. FIG. 11 uses a bus connection as an example.

The processor 1101 may be a general purpose processor, for example, a central processing unit (CPU), or may be a digital signal processor (DSP), an application-specific integrated circuit (ASIC), or one or more integrated circuits configured to implement this embodiment of this application. The processor 1101 may process data received by using the communication interface 1103. The processor 1101 may further process a signal or data to be sent to the communication interface 1103.

The memory 1102 may be coupled to the processor 1101 by using the bus 1104 or an input/output port, or the memory 1102 may be integrated with the processor 1101. The memory 1102 is configured to store various software programs and/or a plurality of sets of instructions. Specifically, the memory 1102 may include a high-speed random access memory, and may further include a non-volatile memory, for example, one or more magnetic disk storage devices, a flash device, or another non-volatile solid-state storage device. The memory 1102 may further store a network communication program. The network communication program may be used to communicate with one or more additional devices, one or more terminals, and one or more network devices.

The communication interface 1103 may be configured to receive a signal or data that is input to the communication apparatus 110, or may be configured to output a signal or data that is obtained through processing by the processor 1101. There may be one or more communication interfaces 1103.

The processor 1101 may be configured to read and execute computer-readable instructions. Specifically, the processor 1101 may be configured to invoke a program stored in the memory 1102, for example, an implementation program in the transmit end device in the communication method provided in one or more embodiments of this application, and execute instructions included in the program, to implement a method in a subsequent embodiment.

The processor 1101 may be configured to:
encode a to-be-transmitted first bit sequence, to obtain a first matrix, where the first matrix includes a plurality of bit square matrices of a same size, and each bit square matrix includes a plurality of pieces of bit data;
perform, based on a first mapping relationship, position transformation in a range of each bit square matrix on the bit data of each bit square matrix in the first matrix, to obtain a second matrix, where the first mapping relationship indicates a position mapping relationship before and after position transformation of each piece of bit data in the bit square matrix range, and includes a row transformation mapping relationship; the row transformation mapping relationship is constrained by using a global offset constraint factor and at least two local offset constraint factors; the global offset constraint factor is used to constrain a position offset of row transformation of each piece of bit data in the bit square matrix; and the local offset constraint factor is used to constrain position offsets of row transformation of bit data located in some bit rows in the bit square matrix;
perform, on the second matrix, bit data position transformation among bit square matrices, to obtain a third matrix; and
modulate a to-be-sent first symbol sequence based on the third matrix.

It should be noted that the communication apparatus 110 shown in FIG. 11 is merely an implementation of this embodiment of this application. In actual application, the communication apparatus 110 may further include more or fewer components. This is not limited herein.

It may be understood that the communication apparatus in this embodiment of this application may implement operations S201 to S205 in the embodiment shown in FIG. 2, or implement the embodiment corresponding to FIG. 8. For specific implementations and corresponding beneficial effects of functional components included in the communication apparatus in FIG. 10, refer to specific descriptions of the embodiment in FIG. 1 or FIG. 8.

Figure 12:
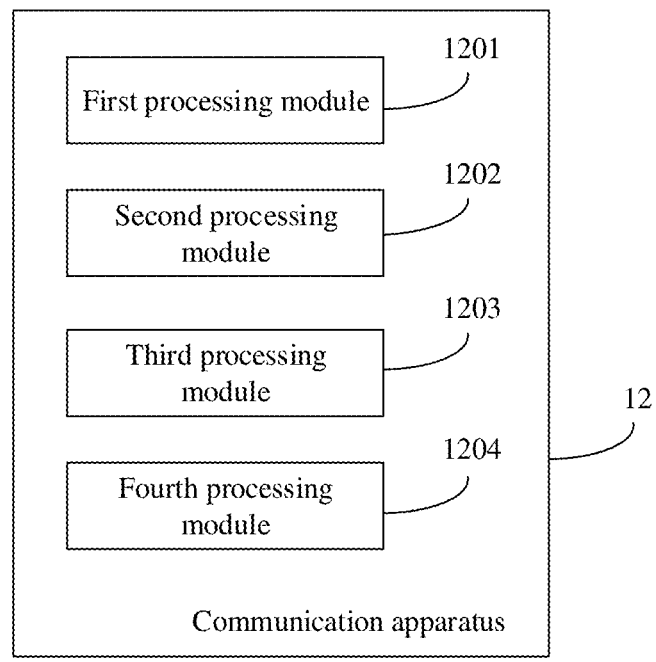
FIG. 12 is a schematic diagram of a structure of another communication apparatus according to an embodiment of this application.

An embodiment of this application provides a communication apparatus. The communication apparatus may be a receive end device or a component that may be used in the receive end device. The communication apparatus may include a module or a unit, to implement operations S206 to S209 in FIG. 2 or implement the communication method in FIG. 9. In a possible manner, the communication method may be implemented by a first processing module, a second processing module, a third processing module, and a fourth processing module. The first processing module, the second processing module, the third processing module, and the fourth processing module may be physically independent of each other, or may be integrated into a same module. The first processing module, the second processing module, the third processing module, and the fourth processing module may be respectively logical modules divided based on functions, or may be respectively corresponding hardware modules. When the first processing module, the second processing module, the third processing module, and the fourth processing module are logical modules. FIG. 12 is a schematic diagram of a structure of another communication apparatus according to an embodiment of this application. As shown in FIG. 12, the communication apparatus 120 includes a first processing module 1201, a second processing module 1202, a third processing module 1203, and a fourth processing module 1204.

The first processing module 1201 is configured to demodulate a received first symbol sequence, to obtain a first matrix. The first matrix includes a plurality of bit square matrices of a same size, and each bit square matrix includes a plurality of pieces of bit data.

The second processing module 1202 is configured to perform, on the first matrix, bit data position transformation among bit square matrices, to obtain a second matrix.

The third processing module 1203 is configured to perform, based on a first mapping relationship, position transformation in an orientation of each bit square matrix on bit data of each bit square matrix in the second matrix, to obtain a third matrix after the transformation. The first mapping relationship indicates a position mapping relationship before and after position transformation of each piece of bit data in the bit square matrix range, and includes a row transformation mapping relationship. The row transformation mapping relationship is constrained by using a global offset constraint factor and at least two local offset constraint factors. The global offset constraint factor is used to constrain a position offset of row transformation of each piece of bit data in the bit square matrix. The local offset constraint factor is used to constrain position offsets of row transformation of bit data located in some bit rows in the bit square matrix.

The fourth processing module 1204 is configured to perform decoding based on the third matrix, to obtain a first bit sequence.

In an optional manner, the row transformation mapping relationship is further constrained by using a start offset parameter, and the start offset parameter is used to constrain a start position at which position transformation is performed on the bit data in the bit square matrix based on a position offset.

In an optional manner, when quantities of rows and columns of the bit square matrix included in the first matrix are both $2^m$, there are m−1 local offset constraint factors, where m is an integer greater than 3.

The global offset constraint factor, the local offset constraint factors, and the start offset parameter constrain the row transformation mapping relationship by using the following formula:

$$r_0 = \{c_1 + g \times r_1 + \Sigma_{k=2}^m \{\beta_{k-2} \times \lfloor r_1/(2^{(k-1)}) \rfloor\} + \alpha\} \% (2^m),$$

Herein, $r_0$ is a row identifier corresponding to first bit data in the bit square matrix after position transformation in the bit square matrix range, and the first bit data is any bit data in the bit square matrix; $r_1$ is a row identifier corresponding to the first bit data before position transformation in the bit square matrix range; $c_1$ is a column identifier corresponding to the first bit data before position transformation in the bit square matrix range; g is the global offset constraint factor, $\beta$ is the local offset constraint factor, $\alpha$ is the start offset parameter, and g, $\beta$, and $\alpha$ are all preset integers; and k is an index identifier of $\beta$, a value of g is determined based on $2^p$, and p is an integer greater than 1.

In an optional manner, when m=4, g∈{−8, −4, 4}, and $\beta_2$∈{−7, −5, −3, −1, 1, 3, 5, 7}.

When g=−8, values of $\beta_0$ and $\beta_1$ are one of the following combinations: {$\beta_0$=−6, $\beta_1$=−8}, {$\beta_0$=−6, $\beta_1$=0}, {$\beta_0$=−4, $\beta_1$=−6}, {$\beta_0$=−4, $\beta_1$=−2}, {$\beta_0$=−4, $\beta_1$=2}, {$\beta_0$=−4, $\beta_1$=6}, {$\beta_0$=−2, $\beta_1$=−8}, {$\beta_0$=−2, $\beta_1$=0}, {$\beta_0$=2, $\beta_1$=−8}, {$\beta_0$=2, $\beta_1$=0}, {$\beta_0$=4, $\beta_1$=−6}, {$\beta_0$=4, $\beta_1$=−2}, {$\beta_0$=4, $\beta_1$=2}, {$\beta_0$=4, $\beta_1$=6}, {$\beta_0$=6, $\beta_1$=−8}, and {$\beta_0$=6, $\beta_1$=0}.

When g=−4 or g=4, the values of $\beta_0$ and $\beta_1$ are one of the following combinations: {$\beta_0$=−6, $\beta_1$=4}, {$\beta_0$=−2, $\beta_1$=−4}, {$\beta_0$=0, $\beta_1$=−6}, {$\beta_0$=0, $\beta_1$=−2}, {$\beta_0$=0, $\beta_1$=2}, {$\beta_0$=0, $\beta_1$=6}, {$\beta_0$=2, $\beta_1$=4}, and {$\beta_0$=6, $\beta_1$=−4}.

In an optional manner, the first mapping relationship further includes a column transformation mapping relationship, and the column transformation mapping relationship is constrained by using the following formula:

$$c_0 = \{c_1 + h \times r_1 + \Sigma_{w=2}^m \{\gamma_{w-2} \times \lfloor r_1/(2^{(w-1)}) \rfloor\} + \theta\} \% (2^m),$$

Herein, $c_0$ is a column identifier corresponding to the first bit data after position transformation in the bit square matrix range; $r_1$ is a row identifier corresponding to the first bit data before position transformation in the bit square matrix range; $c_1$ is a column identifier corresponding to the first bit data before position transformation in the bit square matrix range; and h, $\gamma$, and $\theta$ are all preset integers, and w is an index identifier of $\gamma$.

In an optional manner, when a value of m is 4, a value of g is −4, a value of $\beta_0$ is 0, a value of $\beta_1$ is −2, a value of $\beta_2$ is 3, a value of $\alpha$ is 0, a value of h is −2, a value of $\gamma_0$ is 0, a value of $\gamma_1$ is 7, a value of $\gamma_2$ is −7, and a value of 0 is 0.

In an optional manner, the first mapping relationship is indicated by using a first mapping table. The first mapping table includes 256 table cells, and there is corresponding mapping position data in each table cell. A first table cell is a table cell in the first mapping table, and mapping position data in the first table cell is (s, t), where s and t are both integers greater than or equal to 0 and less than 16, and (s, t) indicates a position that is of bit data stored in the first table cell and that is before position transformation in the bit square matrix range.

The first mapping table includes:

| (0, 0) | (1, 1) | (2, 2) | (3, 3) | (4, 4) | (5, 5) | (6, 6) | (7, 7) |
|---|---|---|---|---|---|---|---|
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |

-continued

| | | | | | | | |
|---|---|---|---|---|---|---|---|
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) |

In an optional manner, the first processing module 1201 is configured to:

demodulate a first modulation symbol, to obtain two bits of second bit data and two bits of third bit data that are corresponding to the first modulation symbol, where the second bit data is bit data corresponding to a component of the first modulation symbol in an X polarization direction, the third bit data is bit data corresponding to a component of the first modulation symbol in a Y polarization direction, and the first modulation symbol is any modulation symbol in the first symbol sequence; and arrange the two bits of second bit data adjacent to each other in a same column in the first matrix, and arrange the two bits of third bit data adjacent to each other below the second bit data.

In an optional manner, the first processing module 1201 is configured to:

demodulate a second modulation symbol, to obtain two bits of fourth bit data and two bits of fifth bit data that are corresponding to the second modulation symbol, where the fourth bit data is bit data corresponding to a component of the second modulation symbol in an X polarization direction, the fifth bit data is bit data corresponding to a component of the second modulation symbol in a Y polarization direction, and the second modulation symbol is any modulation symbol other than the last modulation symbol in the first symbol sequence;

demodulate a third modulation symbol, to obtain two bits of sixth bit data and two bits of seventh bit data that are corresponding to the third modulation symbol, where the sixth bit data is bit data corresponding to a component of the third modulation symbol in the X polarization direction, the seventh bit data is bit data corresponding to a component of the third modulation symbol in the Y polarization direction, and the third modulation symbol is a modulation symbol that is after and adjacent to the second modulation symbol in the first symbol sequence; and arrange the two bits of fourth bit data adjacent to each other in a same column in the first matrix, arrange the two bits of sixth bit data adjacent to each other below the fourth bit data, arrange the two bits of fifth bit data adjacent to each other below the sixth bit data, and arrange the two bits of seventh bit data adjacent to each other below the fifth bit data.

Figure 13:
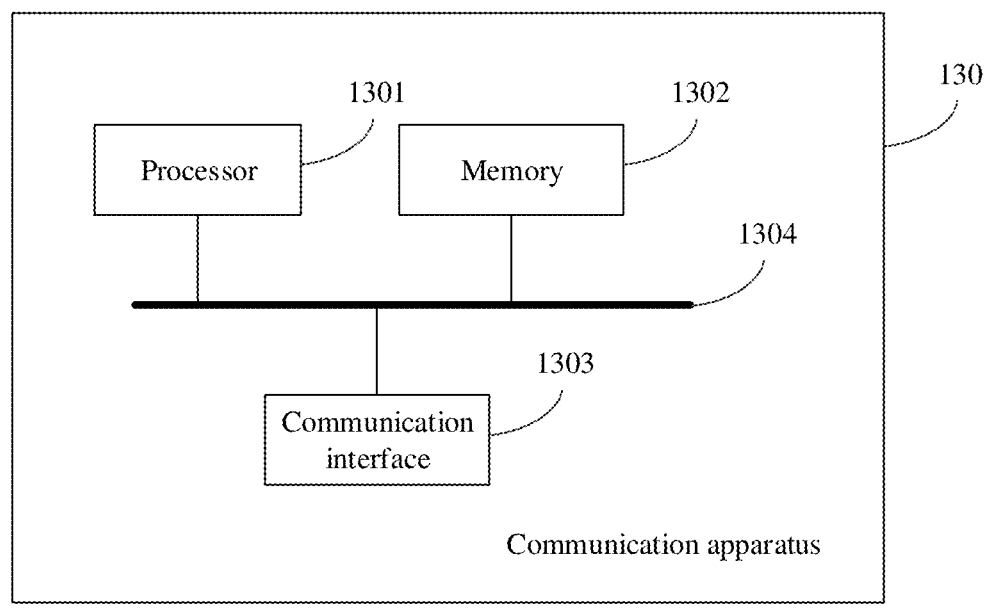
FIG. 13 is a schematic diagram of a structure of another communication apparatus according to an embodiment of this application.

FIG. 13 shows a possible structure of the communication apparatus.

FIG. 13 is a schematic diagram of a structure of another communication apparatus according to an embodiment of this application. As shown in FIG. 13, the communication apparatus 130 may include one or more processors 1301, a memory 1302, and a communication interface 1303. The components may be connected by using a bus 1304 or in another manner. FIG. 13 uses a bus connection as an example.

The processor 1301 may be a general purpose processor, for example, a central processing unit (CPU), or may be a digital signal processor (DSP), an application-specific integrated circuit (ASIC), or one or more integrated circuits configured to implement this embodiment of this application. The processor 1301 may process data received by using the communication interface 1303. The processor 1301 may further process a signal or data to be sent to the communication interface 1303.

The memory 1302 may be coupled to the processor 1301 by using the bus 1304 or an input/output port, or the memory 1302 may be integrated with the processor 1301. The memory 1302 is configured to store various software programs and/or a plurality of sets of instructions. Specifically, the memory 1302 may include a high-speed random access memory, and may further include a non-volatile memory, for example, one or more magnetic disk storage devices, a flash device, or another non-volatile solid-state storage device.

The memory 1302 may further store a network communication program. The network communication program may be used to communicate with one or more additional devices, one or more terminals, and one or more network devices.

The communication interface 1303 may be configured to receive a signal or data that is input to the communication apparatus 130, or may be configured to output a signal or data that is obtained through processing by the processor 1301. There may be one or more communication interfaces 1303.

The processor 1301 may be configured to read and execute computer-readable instructions. Specifically, the processor 1301 may be configured to invoke a program stored in the memory 1302, for example, an implementation program in the receive end device in the communication method provided in one or more embodiments of this application, and execute instructions included in the program, to implement a method in a subsequent embodiment.

The processor 1301 may be configured to:
demodulate a received first symbol sequence, to obtain a first matrix, where the first matrix includes a plurality of bit square matrices of a same size, and each bit square matrix includes a plurality of pieces of bit data;
perform, on the first matrix, bit data position transformation among bit square matrices, to obtain a second matrix;
perform, based on a first mapping relationship, position transformation in an orientation of each bit square matrix on bit data of each bit square matrix in the second matrix, to obtain a third matrix after the transformation, where the first mapping relationship indicates a position mapping relationship before and after position transformation of each piece of bit data in the bit square matrix range, and includes a row transformation mapping relationship; the row transformation mapping relationship is constrained by using a global offset constraint factor and at least two local offset constraint factors; the global offset constraint factor is used to constrain a position offset of row transformation of each piece of bit data in the bit square matrix; and the local offset constraint factor is used to constrain position offsets of row transformation of bit data located in some bit rows in the bit square matrix; and
perform decoding based on the third matrix, to obtain a first bit sequence.

It should be noted that the communication apparatus 130 shown in FIG. 13 is merely an implementation of this embodiment of this application. In actual application, the communication apparatus 130 may further include more or fewer components. This is not limited herein.

It may be understood that the communication apparatus in this embodiment of this application may implement operations S206 to S209 in the embodiment shown in FIG. 1, or implement the embodiment corresponding to FIG. 9. For specific implementations and corresponding beneficial effects of functional components included in the communication apparatus in FIG. 12, refer to specific descriptions of the embodiment in FIG. 1 or FIG. 9.

Figure 14:
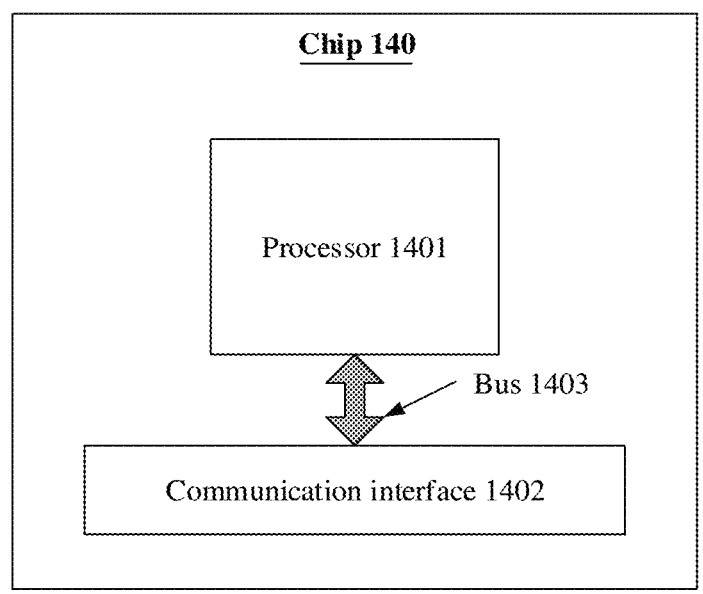
FIG. 14 is a schematic diagram of a structure of a communication chip according to an embodiment of this application.

FIG. 14 is a schematic diagram of a structure of a communication chip according to an embodiment of this application. As shown in FIG. 14, the communication chip 140 may include a processor 1401 and one or more communication interfaces 1402 coupled to the processor 1401.

The processor 1401 may be configured to read and execute computer-readable instructions. During specific implementation, the processor 1401 may mainly include a controller, an arithmetic unit, and a register. The controller is mainly responsible for decoding instructions and sending a control signal for an operation corresponding to the instructions. The arithmetic unit is mainly responsible for performing a fixed-point or floating-point arithmetic operation, a shift operation, a logic operation, and the like, and may also perform an address operation and address translation. The register is mainly responsible for saving a quantity of register operations, intermediate operation results, and the like that are temporarily stored during instruction execution. During specific implementation, a hardware architecture of the processor 1401 may be an application-specific integrated circuit (ASIC) architecture, a MIPS architecture, an ARM architecture, an NP architecture, or the like. The processor 1401 may be a single-core processor, or may be a multi-core processor.

The communication interface 1402 may be configured to input a to-be-processed signal or data to the processor 1401, and may output a processing result of the processor 1401. For example, the communication interface 1402 may be a general purpose input/output (GPIO) interface, and may be connected to a plurality of peripheral devices (such as an LCD display), a camera, and a radio frequency (RF) module). The communication interface 1402 is connected to the processor 1401 by using a bus 1403.

In this application, the processor 1401 may be configured to invoke, from a memory, an implementation program of the communication method provided in one or more embodiments of this application on a transmit end device side, and execute instructions included in the program; or may be configured to invoke, from a memory, an implementation program of the communication method provided in one or more embodiments of this application on a receive end device side, and execute instructions included in the program. The communication interface 1402 may be configured to output an execution result of the processor 1401. In this application, the communication interface 1402 may be configured to output a first symbol sequence obtained through modulation by the processor 1401, or output a first bit sequence obtained through decoding by the processor 1401. For the communication method provided in one or more embodiments of this application, refer to the embodiment shown in FIG. 1, FIG. 8, or FIG. 9. Details are not described herein.

It should be noted that functions respectively corresponding to the processor 1401 and the communication interface 1402 may be implemented by using a hardware design, or may be implemented by using a software design, or may be implemented by using a combination of software and hardware. This is not limited herein.

Another embodiment of this application further provides a communication system. The communication system includes a transmit end device and a receive end device. For example, the transmit end device may be the communication apparatus provided in FIG. 10 or FIG. 11, or include the communication apparatus provided in FIG. 10 or FIG. 11, and is configured to perform operations S201 to S205 in the communication method provided in FIG. 2, or perform the communication method provided in FIG. 8; and/or the receive end device may be the communication apparatus provided in FIG. 12 or FIG. 13, or include the communication apparatus provided in FIG. 12 or FIG. 13, and is configured to perform operations S206 to S209 in the communication method provided in FIG. 2, or perform the communication method provided in FIG. 9.

Another embodiment of this application further provides a readable storage medium. The readable storage medium stores computer execution instructions. When a device (which may be a single-chip microcomputer, a chip, or the like) or a processor invokes the computer execution instructions stored in the readable storage medium, operations performed by the transmit end device or the receive end device in the communication method provided in the embodiment shown in FIG. 2, FIG. 8, or FIG. 9 are implemented. The foregoing readable storage medium may include any medium that can store program code, such as a USB flash drive, a removable hard disk, a read-only memory, a random access memory, a magnetic disk, or an optical disc.

Another embodiment of this application further provides a computer program product. The computer program product includes computer execution instructions, and the computer execution instructions are stored in a computer-readable storage medium. At least one processor of a device may read the computer execution instructions from the computer-readable storage medium, to implement operations performed by the transmit end device or the receive end device in the communication method provided in the embodiment shown in FIG. 2, FIG. 8, or FIG. 9.

In the specification, claims, and accompanying drawings of this application, the terms "first", "second", "third", "fourth" and so on are intended to distinguish between different objects but do not indicate a particular order. In addition, terms "include", "have", and any other variant thereof are intended to cover non-exclusive inclusion. For example, a process, a method, a system, a product, or a device that includes a series of operations or units is not limited to the listed operations or units, but optionally further includes an unlisted operation or unit, or optionally further includes another inherent operation or unit of the process, the method, the product, or the device.

All or some of the foregoing embodiments may be implemented by using software, hardware, firmware, or any combination thereof. When software is used to implement the embodiments, all or a part of the embodiments may be implemented in a form of a computer program product. The computer program product includes one or more computer instructions. When the computer program instructions are loaded and executed on the computer, the procedures or functions according to embodiments of this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium (for example, a DVD), a semiconductor medium (for example, a solid-state disk (solid-state disk, SSD)), or the like.

In conclusion, the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A communication method, comprising:
    encoding a first bit sequence to obtain a first matrix that comprises a plurality of bit square matrices of a same size, wherein each bit square matrix comprises a plurality of pieces of bit data;
    performing, based on a first mapping relationship, position transformation in a range of each bit square matrix on the bit data of each bit square matrix in the first matrix, to obtain a second matrix, wherein the first mapping relationship indicates a position mapping relationship before and after position transformation of each piece of bit data in the bit square matrix range, the first mapping relationship comprises a row transformation mapping relationship that is constrained by using a global offset constraint factor and at least two local offset constraint factors, wherein the global offset constraint factor is used to constrain a position offset of row transformation of each piece of bit data in the bit square matrix, and the local offset constraint factor is used to constrain position offsets of row transformation of bit data located in some bit rows in the bit square matrix;
    performing bit data position transformation among bit square matrices on the second matrix to obtain a third matrix;
    modulating a first symbol sequence based on the third matrix; and
    transmitting a signal comprising the first symbol sequence modulated based on the third matrix.

2. The method according to claim 1, wherein the row transformation mapping relationship is further constrained by using a start offset parameter, and the start offset parameter is used to constrain a start position at which position transformation is performed on the bit data in the bit square matrix based on the position offset.

3. The method according to claim 2, wherein when a quantity of rows and a quantity of columns of bit square matrices comprised in the first matrix are both $2\hat{}m$, there are $m-1$ local offset constraint factors, wherein m is an integer greater than 3; and
    the global offset constraint factor, the local offset constraint factors, and the start offset parameter constrain the row transformation mapping relationship by using the following formula:

$$r_0 = \{c_1 + g \times r_1 + \Sigma_{k=2}{}^m \{\beta_{k-2} \times \lfloor r_1/(2\hat{}(k-1)) \rfloor\} + \alpha\} \% (2\hat{}m),$$

wherein $r_0$ is a row identifier corresponding to first bit data in the bit square matrix before position transformation in the bit square matrix range, and the first bit data is any bit data in the bit square matrix; $r_1$ is a row identifier corresponding to the first bit data after position transformation in the bit square matrix range; $c_1$ is a column identifier corresponding to the first bit data after position transformation in the bit square matrix range; g is the global offset constraint factor, $\beta$ is the local offset constraint factor, $\alpha$ is the start offset parameter, and g, $\beta$, and $\alpha$ are all preset integers; and k is an index identifier of $\beta$, a value of g is determined based on $2\hat{}p$, and p is an integer greater than 1.

4. The method according to claim 3, wherein when m=4, g∈{−8, −4, 4}, and $\beta_2$∈{−7, −5, −3, −1, 1, 3, 5, 7};

when g=−8, values of $\beta_0$ and $\beta_1$ are one of the following combinations: {$\beta_0$=−6, $\beta_1$=−8}, {$\beta_0$=6, $\beta_1$=0}, {$\beta_0$=4, $\beta_1$=−6}, {$\beta_0$=−4, $\beta_1$=−2}, {$\beta_0$=−4, $\beta_1$=2}, {$\beta_0$=−4, $\beta_1$=6}, {$\beta_0$=−2, $\beta_1$=−8}, {$\beta_0$=2, $\beta_1$=0}, {$\beta_0$=2, $\beta_1$=−8}, {$\beta_0$=2, $\beta_1$=0}, {$\beta_0$=4, $\beta_1$=6}, {$\beta_0$=4, $\beta_1$=−2}, {$\beta_0$=4, $\beta_1$=2}, {$\beta_0$=4, $\beta_1$=6}, {$\beta_0$=6, $\beta_1$=−8}, and {$\beta_0$=6, $\beta_1$=0}; and when g=−4 or g=4, the values of $\beta_0$ and $\beta_1$ are one of the following combinations: {$\beta_0$=−6, $\beta_1$=4}, {$\beta_0$=−2, $\beta_1$=4}, {$\beta_0$=0, $\beta_1$=−6}, {$\beta_0$=0, $\beta_1$=−2}, {$\beta_0$=0, $\beta_1$=2}, {$\beta_0$=0, $\beta_1$=6}, {$\beta_0$=2, $\beta_1$=4}, and {$\beta_0$=6, $\beta_1$=−4}.

5. The method according to claim 3, wherein the first mapping relationship further comprises a column transformation mapping relationship, and the column transformation mapping relationship is constrained by using the following formula:

$$c_0 = \{c_1 + h \times r_1 + \Sigma_{w=2}^{m}\{\gamma_{w-2} \times \lfloor r_1/(2^{(w-1)}) \rfloor\} + \theta\} \% (2^{\wedge}m), \text{ wherein}$$

$c_0$ is a column identifier corresponding to the first bit data before position transformation in the bit square matrix range; $r_1$ is the row identifier corresponding to the first bit data after position transformation in the bit square matrix range; $c_1$ is the column identifier corresponding to the first bit data after position transformation in the bit square matrix range; and h, $\gamma$, and $\theta$ are all preset integers, and w is an index identifier of $\gamma$.

6. The method according to claim 5, wherein a value of m is 4, a value of g is −4, a value of $\beta_0$ is 0, a value of $\beta_1$ is −2, a value of $\beta_2$ is 3, a value of $\alpha$ is 0, a value of h is −2, a value of $\gamma_0$ is 0, a value of $\gamma_1$ is 7, a value of $\gamma_2$ is −7, and a value of θ is 0.

7. The method according to claim 6, wherein the first mapping relationship is indicated by using a first mapping table, and the first mapping table comprises:

wherein the first mapping table comprises 256 table cells, and there is corresponding mapping position data in each table cell; a first table cell is a table cell in the first mapping table, and mapping position data in the first table cell is (s, t), wherein s and t are both integers greater than or equal to 0 and less than 16, and (s, t) indicates a position that is of bit data stored in the first table cell and that is before position transformation in the bit square matrix range.

8. The method according to claim 1, wherein the modulating the first symbol sequence based on the third matrix comprises:
determining the first bit sequence based on the third matrix;
determining bit data of every four adjacent bits in the first bit sequence as one first modulation mapping unit in a front-to-back order, and the bit data in each first modulation mapping unit is used to modulate a same modulation symbol;
mapping bit data of first two bits in a first target modulation mapping unit to a component of a first modulation symbol in an X polarization direction;
mapping bit data of last two bits in the first target modulation mapping unit to a component of the first modulation symbol in a Y polarization direction, wherein the first target modulation mapping unit is any first modulation mapping unit; and
modulating the first modulation symbol based on the component of the first modulation symbol in the X polarization direction and the component of the first modulation symbol in the Y polarization direction.

9. The method according to claim 1, wherein the modulating the first symbol sequence based on the third matrix comprises:

| | | | | | | | |
|---|---|---|---|---|---|---|---|
| (0, 0) | (1, 1) | (2, 2) | (3, 3) | (4, 4) | (5, 5) | (6, 6) | (7, 7) |
| (12, 14) | (13, 15) | (14, 0) | (15, 1) | (0, 2) | (1, 3) | (2, 4) | (3, 5) |
| (8, 12) | (9, 13) | (10, 14) | (11, 15) | (12, 0) | (13, 1) | (14, 2) | (15, 3) |
| (4, 10) | (5, 11) | (6, 12) | (7, 13) | (8, 14) | (9, 15) | (10, 0) | (11, 1) |
| (14, 15) | (15, 0) | (0, 1) | (1, 2) | (2, 3) | (3, 4) | (4, 5) | (5, 6) |
| (10, 13) | (11, 14) | (12, 15) | (13, 0) | (14, 1) | (15, 2) | (0, 3) | (1, 4) |
| (6, 11) | (7, 12) | (8, 13) | (9, 14) | (10, 15) | (11, 0) | (12, 1) | (13, 2) |
| (2, 9) | (3, 10) | (4, 11) | (5, 12) | (6, 13) | (7, 14) | (8, 15) | (9, 0) |
| (15, 7) | (0, 8) | (1, 9) | (2, 10) | (3, 11) | (4, 12) | (5, 13) | (6, 14) |
| (11, 5) | (12, 6) | (13, 7) | (14, 8) | (15, 9) | (0, 10) | (1, 11) | (2, 12) |
| (7, 3) | (8, 4) | (9, 5) | (10, 6) | (11, 7) | (12, 8) | (13, 9) | (14, 10) |
| (3, 1) | (4, 2) | (5, 3) | (6, 4) | (7, 5) | (8, 6) | (9, 7) | (10, 8) |
| (13, 6) | (14, 7) | (15, 8) | (0, 9) | (1, 10) | (2, 11) | (3, 12) | (4, 13) |
| (9, 4) | (10, 5) | (11, 6) | (12, 7) | (13, 8) | (14, 9) | (15, 10) | (0, 11) |
| (5, 2) | (6, 3) | (7, 4) | (8, 5) | (9, 6) | (10, 7) | (11, 8) | (12, 9) |
| (1, 0) | (2, 1) | (3, 2) | (4, 3) | (5, 4) | (6, 5) | (7, 6) | (8, 7) |
| (8, 8) | (9, 9) | (10, 10) | (11, 11) | (12, 12) | (13, 13) | (14, 14) | (15, 15) |
| (4, 6) | (5, 7) | (6, 8) | (7, 9) | (8, 10) | (9, 11) | (10, 12) | (11, 13) |
| (0, 4) | (1, 5) | (2, 6) | (3, 7) | (4, 8) | (5, 9) | (6, 10) | (7, 11) |
| (12, 2) | (13, 3) | (14, 4) | (15, 5) | (0, 6) | (1, 7) | (2, 8) | (3, 9) |
| (6, 7) | (7, 8) | (8, 9) | (9, 10) | (10, 11) | (11, 12) | (12, 13) | (13, 14) |
| (2, 5) | (3, 6) | (4, 7) | (5, 8) | (6, 9) | (7, 10) | (8, 11) | (9, 12) |
| (14, 3) | (15, 4) | (0, 5) | (1, 6) | (2, 7) | (3, 8) | (4, 9) | (5, 10) |
| (10, 1) | (11, 2) | (12, 3) | (13, 4) | (14, 5) | (15, 6) | (0, 7) | (1, 8) |
| (7, 15) | (8, 0) | (9, 1) | (10, 2) | (11, 3) | (12, 4) | (13, 5) | (14, 6) |
| (3, 13) | (4, 14) | (5, 15) | (6, 0) | (7, 1) | (8, 2) | (9, 3) | (10, 4) |
| (15, 11) | (0, 12) | (1, 13) | (2, 14) | (3, 15) | (4, 0) | (5, 1) | (6, 2) |
| (11, 9) | (12, 10) | (13, 11) | (14, 12) | (15, 13) | (0, 14) | (1, 15) | (2, 0) |
| (5, 14) | (6, 15) | (7, 0) | (8, 1) | (9, 2) | (10, 3) | (11, 4) | (12, 5) |
| (1, 12) | (2, 13) | (3, 14) | (4, 15) | (5, 0) | (6, 1) | (7, 2) | (8, 3) |
| (13, 10) | (14, 11) | (15, 12) | (0, 13) | (1, 14) | (2, 15) | (3, 0) | (4, 1) |
| (9, 8) | (10, 9) | (11, 10) | (12, 11) | (13, 12) | (14, 13) | (15, 14) | (0, 15) | determining a second bit sequence based on the third matrix;

determining bit data of every eight adjacent bits in the second bit sequence as one second modulation mapping unit in a front-to-back order, and the bit data in each second modulation mapping unit is used to modulate two modulation symbols;

mapping bit data of first two bits in a second target modulation mapping unit to a component of a second modulation symbol in an X polarization direction;

mapping bit data of a third bit and a fourth bit in the second target modulation mapping unit to a component of a third modulation symbol in the X polarization direction;

mapping bit data of a fifth bit and a sixth bit in the second target modulation mapping unit to a component of the second modulation symbol in a Y polarization direction;

mapping bit data of a seventh bit and an eighth bit in the second target modulation mapping unit to a component of the third modulation symbol in the Y polarization direction, wherein the second target modulation mapping unit is any second modulation mapping unit;

modulating the second modulation symbol based on the component of the second modulation symbol in the X polarization direction and the component of the second modulation symbol in the Y polarization direction; and modulating the third modulation symbol based on the component of the third modulation symbol in the X polarization direction and the component of the third modulation symbol in the Y polarization direction.

10. A communication method, comprising:

receiving a signal comprising a first symbol sequence;

demodulating the first symbol sequence to obtain a first matrix that comprises a plurality of bit square matrices of a same size, wherein each bit square matrix comprises a plurality of pieces of bit data;

performing bit data position transformation among bit square matrices on the first matrix to obtain a second matrix;

performing, based on a first mapping relationship, position transformation in a range of each bit square matrix on the bit data of each bit square matrix in the second matrix, to obtain a third matrix after the transformation, wherein the first mapping relationship indicates a position mapping relationship before and after position transformation of each piece of bit data in the bit square matrix range, the first mapping relationship comprises a row transformation mapping relationship that is constrained by using a global offset constraint factor and at least two local offset constraint factors, the global offset constraint factor is used to constrain a position offset of row transformation of each piece of bit data in the bit square matrix, and the local offset constraint factor is used to constrain position offsets of row transformation of bit data located in some bit rows in the bit square matrix; and performing decoding based on the third matrix to obtain a first bit sequence.

11. The method according to claim 10, wherein the row transformation mapping relationship is further constrained by using a start offset parameter, and the start offset parameter is used to constrain a start position at which position transformation is performed on the bit data in the bit square matrix based on the position offset.

12. The method according to claim 11, wherein when a quantity of rows and a quantity of columns of bit square matrices comprised in the first matrix are both $2^m$, there are $m-1$ local offset constraint factors, wherein m is an integer greater than 3;

the global offset constraint factor, the local offset constraint factors, and the start offset parameter constrain the row transformation mapping relationship by using the following formula:

$$r_0 = \{c_1 + g \times r_1 + \Sigma_{k=2}^{m}\{\beta_{k-2} \times \lfloor r_1/(2^{(k-1)}) \rfloor\} + \alpha\} \% (2^m),$$
wherein $r_0$ is a row identifier corresponding to first bit data in the bit square matrix after position transformation in the bit square matrix range, and the first bit data is any bit data in the bit square matrix; $r_1$ is a row identifier corresponding to the first bit data before position transformation in the bit square matrix range; $c_1$ is a column identifier corresponding to the first bit data before position transformation in the bit square matrix range; g is the global offset constraint factor, $\beta$ is the local offset constraint factor, $\alpha$ is the start offset parameter, and g, $\beta$, and $\alpha$ are all preset integers; and k is an index identifier of $\beta$, a value of g is determined based on $2^p$, and p is an integer greater than 1.

13. The method according to claim 12, wherein when m=4, g∈{−8, −4, 4}, and $\beta_2$∈{−7, −5, −3, −1, 1, 3, 5, 7}; when g=8, values of $\beta_0$ and $\beta_1$ are one of the following combinations: {$\beta_0$=−6, $\beta_1$=8}, {$\beta_0$=6, $\beta_1$=0}, {$\beta_0$=4, $\beta_1$=6}, {$\beta_0$=4, $\beta_1$=2}, {$\beta_0$=4, $\beta_1$=2}, {$\beta_0$=4, $\beta_1$=6}, {$\beta_0$=2, $\beta_1$=8}, {$\beta_0$=−2, $\beta_1$=0}, {$\beta_0$=2, $\beta_1$=8}, {$\beta_0$=2, $\beta_1$=0}, {$\beta_0$=4, $\beta_1$=6}, {$\beta_0$=4, $\beta_1$=2}, {$\beta_0$=4, $\beta_1$=2}, {$\beta_0$=4, $\beta_1$=6}, {$\beta_0$=6, $\beta_1$=8}, and {$\beta_0$=6, $\beta_1$=0}; and when g=−4 or g=4, the values of $\beta_0$ and $\beta_1$ are one of the following combinations: {$\beta_0$=−6, $\beta_1$=4}, {$\beta_0$=2, $\beta_1$=4}, {$\beta_0$=0, $\beta_1$=6}, {$\beta_0$=0, $\beta_1$=2}, {$\beta_0$=0, $\beta_1$=2}, {$\beta_0$=0, $\beta_1$=6}, {$\beta_0$=2, $\beta_1$=4}, and {$\beta_0$=6, $\beta_1$=−4}.

14. The method according to claim 12, wherein the first mapping relationship further comprises a column transformation mapping relationship, and the column transformation mapping relationship is constrained by using the following formula:

$$c_0 = \{c_1 + h \times r_1 + \Sigma_{w=2}^{m}\{\gamma_{w-2} \times \lfloor r_1/(2^{(w-1)}) \rfloor\} + \theta\} \% (2^m), \text{ wherein}$$

$c_0$ is a column identifier corresponding to the first bit data after position transformation in the bit square matrix range; $r_1$ is the row identifier corresponding to the first bit data before position transformation in the bit square matrix range; $c_1$ is the column identifier corresponding to the first bit data before position transformation in the bit square matrix range; and h, $\gamma$, and $\theta$ are all preset integers, and w is an index identifier of $\gamma$.

15. A communication apparatus, comprising a processor, a memory, and a communication interface, wherein the processor is configured to execute a program stored in the memory to perform a communication method, the method comprising:

encoding a first bit sequence to obtain a first matrix, wherein the first matrix comprises a plurality of bit square matrices of a same size, and each bit square matrix comprises a plurality of pieces of bit data;

performing, based on a first mapping relationship, position transformation in a range of each bit square matrix on the bit data of each bit square matrix in the first matrix, to obtain a second matrix, wherein the first mapping relationship indicates a position mapping relationship before and after position transformation of each piece of bit data in the bit square matrix range, the first mapping relationship comprises a row transformation mapping relationship that is constrained by using a global offset constraint factor and at least two local offset constraint factors, the global offset constraint factor is used to constrain a position offset of row transformation of each piece of bit data in the bit square matrix, and the local offset constraint factor is used to constrain position offsets of row transformation of bit data located in some bit rows in the bit square matrix;

performing bit data position transformation among bit square matrices on the second matrix to obtain a third matrix;

modulating a first symbol sequence based on the third matrix; and transmitting a signal comprising the first symbol sequence modulated based on the third matrix.

16. The communication apparatus according to claim 15, wherein the row transformation mapping relationship is further constrained by using a start offset parameter, and the start offset parameter is used to constrain a start position at which position transformation is performed on the bit data in the bit square matrix based on the position offset.

17. The communication apparatus according to claim 15, wherein when a quantity of rows and a quantity of columns of bit square matrices comprised in the first matrix are both $2^m$, there are m−1 local offset constraint factors, wherein m is an integer greater than 3; and the global offset constraint factor, the local offset constraint factors, and the start offset parameter constrain the row transformation mapping relationship by using the following formula:

$$r_0 = \{c_1 + g \times r_1 + \Sigma_{k=2}^{m}\{\beta_{k-2} \times \lfloor r_1/(2^{(k-1)}) \rfloor\} + \alpha\} \% (2^m),$$
wherein $r_0$ is a row identifier corresponding to first bit data in the bit square matrix before position transformation in the bit square matrix range, and the first bit data is any bit data in the bit square matrix; $r_1$ is a row identifier corresponding to the first bit data after position transformation in the bit square matrix range; $c_1$ is a column identifier corresponding to the first bit data after position transformation in the bit square matrix range; g is the global offset constraint factor, β is the local offset constraint factor, α is the start offset parameter, and g, β, and α are all preset integers; and k is an index identifier of β, a value of g is determined based on $2^p$, and p is an integer greater than 1.

18. A communication apparatus, comprising a processor, a memory, and a communication interface, wherein the processor is configured to execute a program stored in the memory to perform a communication method, the method comprising:

receiving a signal comprising a first symbol sequence;

demodulating the first symbol sequence to obtain a first matrix that comprises a plurality of bit square matrices of a same size, wherein each bit square matrix comprises a plurality of pieces of bit data;

performing bit data position transformation among bit square matrices on the first matrix to obtain a second matrix;

performing, based on a first mapping relationship, position transformation in a range of each bit square matrix on the bit data of each bit square matrix in the second matrix, to obtain a third matrix after the transformation, wherein the first mapping relationship indicates a position mapping relationship before and after position transformation of each piece of bit data in the bit square matrix range, the first mapping relationship comprises a row transformation mapping relationship that is constrained by using a global offset constraint factor and at least two local offset constraint factors, the global offset constraint factor is used to constrain a position offset of row transformation of each piece of bit data in the bit square matrix, and the local offset constraint factor is used to constrain position offsets of row transformation of bit data located in some bit rows in the bit square matrix; and performing decoding based on the third matrix to obtain a first bit sequence.

19. The communication apparatus according to claim 18, wherein the row transformation mapping relationship is further constrained by using a start offset parameter, and the start offset parameter is used to constrain a start position at which position transformation is performed on the bit data in the bit square matrix based on the position offset.

20. The communication apparatus according to claim 18, wherein when a quantity of rows and a quantity of columns of bit square matrices comprised in the first matrix are both $2^m$, there are m−1 local offset constraint factors, wherein m is an integer greater than 3;

the global offset constraint factor, the local offset constraint factors, and the start offset parameter constrain the row transformation mapping relationship by using the following formula:

$$r_0 = \{c_1 + g \times r_1 + \Sigma_{k=2}^{m}\{\beta_{k-2} \times \lfloor r_1/(2^{(k-1)}) \rfloor\} + \alpha\} \% (2^m),$$
wherein $r_0$ is a row identifier corresponding to first bit data in the bit square matrix after position transformation in the bit square matrix range, and the first bit data is any bit data in the bit square matrix; $r_1$ is a row identifier corresponding to the first bit data before position transformation in the bit square matrix range; $c_1$ is a column identifier corresponding to the first bit data before position transformation in the bit square matrix range; g is the global offset constraint factor, β is the local offset constraint factor, α is the start offset parameter, and g, β, and α are all preset integers; and k is an index identifier of β, a value of g is determined based on $2^p$, and p is an integer greater than 1.

* * * * *

UNITED STATES PATENT AND TRADEMARK OFFICE
CERTIFICATE OF CORRECTION

| | | |
|---|---|---|
| PATENT NO. | : 12,107,681 B2 | Page 1 of 2 |
| APPLICATION NO. | : 17/979998 | |
| DATED | : October 1, 2024 | |
| INVENTOR(S) | : Kechao Huang, Huixiao Ma and Wai Kong Raymond Leung | |

It is certified that error appears in the above-identified patent and that said Letters Patent is hereby corrected as shown below:

In the Claims

In Claim 4, Column 75, Line 2, delete "$\{\beta_0=6, \beta_1=0\}, \{\beta_0=4,$" and insert --$\beta_0=-6, \beta_1=0\}, \{\beta_0=-4,$--.

In Claim 4, Column 75, Line 4, delete "$\beta_1=6\}, \{\beta_0=-2, \beta_1=-8\}, \{\beta_0=2, \beta_1=0\}, \{\beta_0=2, \beta_1=-8\},$" and insert --$\beta_1=6\}, \{\beta_0=-2, \beta_1=-8\}, \{\beta_0=-2, \beta_1=0\}, \{\beta_0=2, \beta_1=-8\},$--.

In Claim 4, Column 75, Line 5, delete "$\{\beta_0=2, \beta_1=0\}, \{\beta_0=4, \beta_1=-6\}, \{\beta_0=4, \beta_1=-2\}, \{\beta_0=4,$" and insert --$\{\beta_0=2, \beta_1=0\}, \{\beta_0=4, \beta_1=6\}, \{\beta_0=4, \beta_1=-2\}, \{\beta_0=4,$--.

In Claim 4, Column 75, Line 10, delete "$\beta_1=4\}, \{\beta_0=0, \beta_1=-6\}, \{\beta_0=0, \beta_1=-2\}, \{\beta_0=0, \beta_1=2\},$" and insert --$\beta_1=-4\}, \{\beta_0=0, \beta_1=-6\}, \{\beta_0=0, \beta_1=-2\}, \{\beta_0=0, \beta_1=2\},$--.

In Claim 6, Column 75, Line 31, delete "a value of 0 is 0." and insert --a value of $\theta$ is 0.--.

In Claim 13, Column 78, Lines 24-35, delete "The method according to claim 12, wherein when m=4, g∈{-8, -4, 4}, and $\beta_2$∈(-7, -5, -3, -1, 1, 3, 5, 7};
    when g=8, values of $\beta_0$ and $\beta_1$ are one of the following combinations: $\{\beta_0=-6, \beta_1=8\}, \{\beta_0=6, \beta_1=0\}, \{\beta_0=4, \beta_1=6\}, \{\beta_0=4, \beta_1=2\}, \{\beta_0=4, \beta_1=2\}, \{\beta_0=4, \beta_1=6\}, \{\beta_0=2, \beta_1=8\}, \{\beta_0=-2, \beta_1=0\}, \{\beta_0=2, \beta_1=8\}, \{\beta_0=2, \beta_1=0\}, \{\beta_0=4, \beta_1=6\}, \{\beta_0=4, \beta_1=2\}, \{\beta_0=4, \beta_1=2\}, \{\beta_0=4, \beta_1=6\}, \{\beta_0=6, \beta_1=-8\},$ and $\{\beta_0=6, \beta_1=0\};$ and
    when g=-4 or g=4, the values of $\beta_0$ and $\beta_1$ are one of the following combinations: $\{\beta_0=-6, \beta_1=4\}, \{\beta_0=-2, \beta_1=4\}, \{\beta_0=0, \beta_1=6\}, \{\beta_0=0, \beta_1=2\}, \{\beta_0=0, \beta_1=2\}, \{\beta_0=0, \beta_1=6\}, \{\beta_0=2, \beta_1=4\},$ and $\{\beta_0=6, \beta_1=-4\}.$" and insert -- The method according to claim 12, wherein when m=4, g∈ {-8, -4, 4}, and $\beta_2$∈{-7, -5, -3, -1, 1, 3, 5, 7};
    when g=-8, values of $\beta_0$ and $\beta_1$ are one of the following combinations: $\{\beta_0=-6, \beta_1=-8\}, \{\beta_0=-6, \beta_1=0\}, \{\beta_0=-4, \beta_1=-6\}, \{\beta_0=-4, \beta_1=-2\}, \{\beta_0=-4, \beta_1=2\}, \{\beta_0=-4, \beta_1=6\}, \{\beta_0=-2, \beta_1=-8\}, \{\beta_0=-2, \beta_1=0\}, \{\beta_0=2, \beta_1=-8\}, \{\beta_0=2, \beta_1=0\}, \{\beta_0=4, \beta_1=-6\}, \{\beta_0=4, \beta_1=-2\}, \{\beta_0=4, \beta_1=2\}, \{\beta_0=4, \beta_1=6\}, \{\beta_0=6, \beta_1=-8\},$ and $\{\beta_0=6, \beta_1=0\};$ and Signed and Sealed this
Fourth Day of March, 2025

Coke Morgan Stewart
*Acting Director of the United States Patent and Trademark Office*

CERTIFICATE OF CORRECTION (continued)
U.S. Pat. No. 12,107,681 B2 when g=−4 or g=4, the values of $\beta_0$ and $B_1$ are one of the following combinations: $\{\beta_0=-6, \beta_1=4\}$, $\{\beta_0=-2, \beta_1=-4\}$, $\{\beta_0=0, \beta_1=-6\}$, $\{\beta_0=0, \beta_1=-2\}$, $\{\beta_0=0, \beta_1=2\}$, $\{\beta_0=0, \beta_1=6\}$, $\{\beta_0=2, \beta_1=4\}$, and $\{\beta_0=6, \beta_1=-4\}$.--.